(12) United States Patent
Ishibashi

(10) Patent No.: US 11,676,827 B2
(45) Date of Patent: Jun. 13, 2023

(54) SUBSTRATE CLEANING APPARATUS, SUBSTRATE CLEANING METHOD, SUBSTRATE PROCESSING APPARATUS, AND SUBSTRATE DRYING APPARATUS

(71) Applicant: EBARA CORPORATION, Tokyo (JP)

(72) Inventor: Tomoatsu Ishibashi, Tokyo (JP)

(73) Assignee: EBARA CORPORATION, Tokyo (JP)

(*) Notice: Subject to any disclaimer, the term of this patent is extended or adjusted under 35 U.S.C. 154(b) by 501 days.

(21) Appl. No.: 16/082,902

(22) PCT Filed: Feb. 28, 2017

(86) PCT No.: PCT/JP2017/007836
§ 371 (c)(1),
(2) Date: Sep. 6, 2018

(87) PCT Pub. No.: WO2017/154673
PCT Pub. Date: Sep. 14, 2017

(65) Prior Publication Data
US 2019/0088510 A1  Mar. 21, 2019

(30) Foreign Application Priority Data

Mar. 8, 2016 (JP) .............. JP2016-043969
Mar. 10, 2016 (JP) .............. JP2016-046811
(Continued)

(51) Int. Cl.
*H01L 21/00* (2006.01)
*H01L 21/67* (2006.01)
(Continued)

(52) U.S. Cl.
CPC .......... *H01L 21/67051* (2013.01); *B08B 3/02* (2013.01); *B08B 3/08* (2013.01);
(Continued)

(58) Field of Classification Search
None
See application file for complete search history.

(56) References Cited

U.S. PATENT DOCUMENTS 5,485,644 A * 1/1996 Shinbara ............... B08B 1/04
15/21.1
6,151,744 A  11/2000 Ohtani et al.
(Continued)

FOREIGN PATENT DOCUMENTS

CN  103707179 A  4/2014
CN  104941948 A  9/2015
(Continued)

OTHER PUBLICATIONS

Machine Translation of JP10-022242 by Suzuki et al., published Jan. 23, 1998.*
(Continued)

*Primary Examiner* — Mikhail Kornakov
*Assistant Examiner* — Ryan L Coleman
(74) *Attorney, Agent, or Firm* — BakerHostetler

(57) ABSTRACT

High-performance substrate cleaning apparatus, substrate cleaning method, substrate processing apparatus, and substrate drying apparatus are provided.
A substrate cleaning apparatus, including:
a substrate holding and rotating mechanism that holds and rotates a substrate;
a first cleaning mechanism that brings a cleaning tool into contact with the substrate to clean the substrate, cleans the substrate using two-fluid jet, or cleans the substrate using ozone water; and a second cleaning mechanism that cleans the substrate using an ultrasonic cleaning liquid is provided.

12 Claims, 63 Drawing Sheets

(30) Foreign Application Priority Data

Mar. 30, 2016 (JP) .............................. JP2016-069697
Apr. 22, 2016 (JP) .............................. JP2016-086291

(51) Int. Cl.
*H01L 21/02* (2006.01)
*B08B 3/02* (2006.01)
*B08B 3/08* (2006.01)
*B08B 7/02* (2006.01)

(52) U.S. Cl.
CPC ........ *B08B 7/028* (2013.01); *H01L 21/02057* (2013.01); *H01L 21/02074* (2013.01); *H01L 21/67028* (2013.01); *H01L 21/67219* (2013.01)

(56) References Cited

U.S. PATENT DOCUMENTS

| | | | |
|---|---|---|---|
| 2001/0054431 A1 | 12/2001 | Masui et al. | |
| 2003/0168078 A1* | 9/2003 | Deguchi | H01L 21/02052 |
| | | | 134/1.3 |
| 2004/0137828 A1* | 7/2004 | Takahashi | C03C 15/02 |
| | | | 430/4 |
| 2006/0130872 A1 | 6/2006 | Izumi et al. | |
| 2007/0137672 A1 | 6/2007 | Sasaki et al. | |
| 2008/0251107 A1 | 10/2008 | Osada et al. | |
| 2009/0047785 A1* | 2/2009 | Takada | H01L 21/02074 |
| | | | 438/692 |
| 2012/0103371 A1 | 5/2012 | Yun et al. | |
| 2012/0222707 A1 | 9/2012 | Sato et al. | |
| 2012/0260952 A1* | 10/2012 | Nonaka | H01L 21/67051 |
| | | | 134/30 |
| 2014/0182628 A1 | 7/2014 | Ishibashi | |
| 2014/0190530 A1* | 7/2014 | Maeda | H01L 21/67051 |
| | | | 134/104.1 |
| 2015/0020851 A1 | 1/2015 | Sakurai et al. | |
| 2015/0144164 A1 | 5/2015 | Ishibashi | |
| 2015/0273537 A1* | 10/2015 | Miya | B08B 3/12 |
| | | | 134/30 |

FOREIGN PATENT DOCUMENTS

| | | |
|---|---|---|
| JP | S56-060677 A | 5/1981 |
| JP | H03-047578 A | 2/1991 |
| JP | H07-086222 A | 3/1995 |
| JP | H08-117711 A | 5/1996 |
| JP | H08-148459 A | 6/1996 |
| JP | 10-022242 * | 1/1998 |
| JP | H10-004072 A | 1/1998 |
| JP | H10-064868 A | 3/1998 |
| JP | H10-163159 A | 6/1998 |
| JP | 11121421 * | 4/1999 |
| JP | 2000-252248 A | 9/2000 |
| JP | 2001-096243 A | 4/2001 |
| JP | 2001-276763 A | 10/2001 |
| JP | 2002-009035 A | 1/2002 |
| JP | 2002-280348 A | 9/2002 |
| JP | 2003-340330 A | 12/2003 |
| JP | 2007-173277 A | 7/2007 |
| JP | 2008-118109 A | 5/2008 |
| JP | 2012-209513 A | 10/2012 |
| JP | 2013-206983 A | 10/2013 |
| JP | 2013-542607 A | 11/2013 |
| JP | 2014-117628 A | 6/2014 |
| JP | 2014-130882 A | 7/2014 |
| JP | 2014-204427 A | 10/2014 |
| JP | 2014-205107 A | 10/2014 |
| JP | 2015-065355 A | 4/2015 |
| JP | 2015-065379 A | 4/2015 |
| JP | 2015-099852 A | 5/2015 |
| JP | 2015-103647 A | 6/2015 |
| KR | 100709546 * | 4/2007 |
| TW | 200623247 A | 7/2006 |
| TW | I281206 B | 5/2007 |
| TW | 201539560 A | 10/2015 |

OTHER PUBLICATIONS

Translation of KR100709546 by Sasaki et al., published Apr. 20, 2007.*
Translation of JP11121421 by Morinishi et al., published Apr. 30, 1999.*
Japan Patent Application No. 2016-069697; Reasons for Refusal; dated Nov. 5, 2019; 8 pages.
Japan Patent Application No. 2016-086291; Reasons for Refusal; dated Nov. 5, 2019; 8 pages.
Taiwan Patent Application No. 106106987; Office Action; dated Jul. 21, 2020; 21 pages.
Japan Patent Application No. 2016-043969; Notice of Reasons for Refusal; dated Jun. 9, 2020; 10 pages.
Japan Patent Application No. 2016-086291; Notice of Reasons for Refusal; dated May 26, 2020; 8 pages.
Japan Patent Application No. 2016-069697; Notice of Reasons for Refusal; dated May 12, 2020; 8 pages.

* cited by examiner

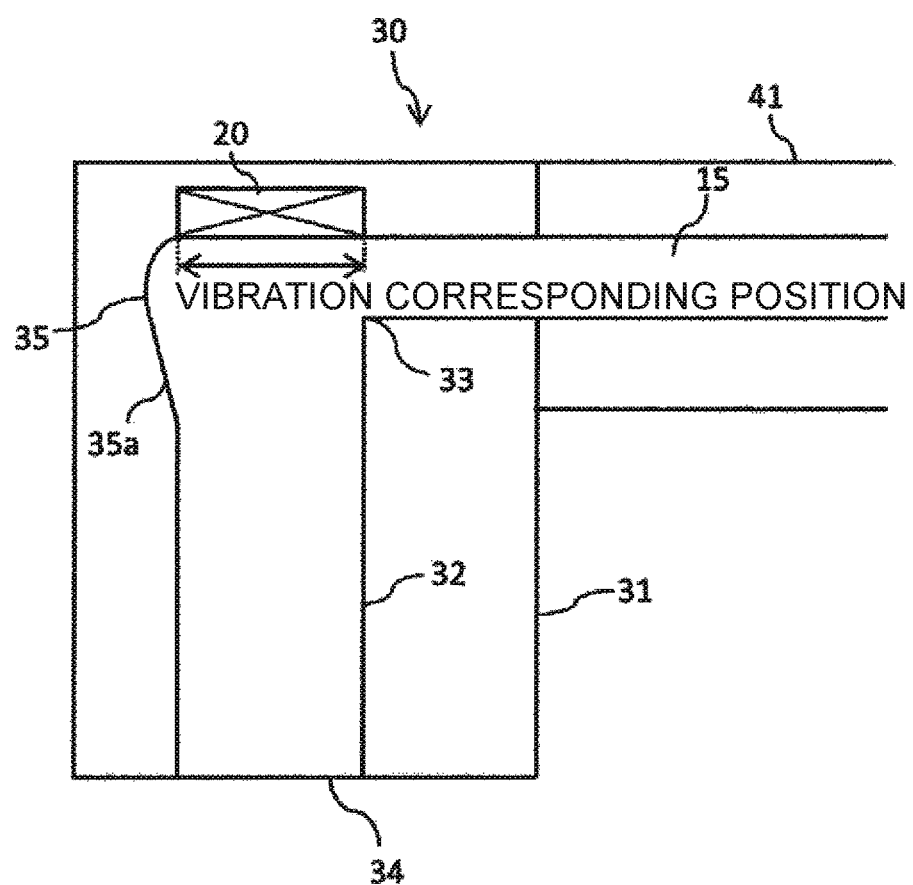

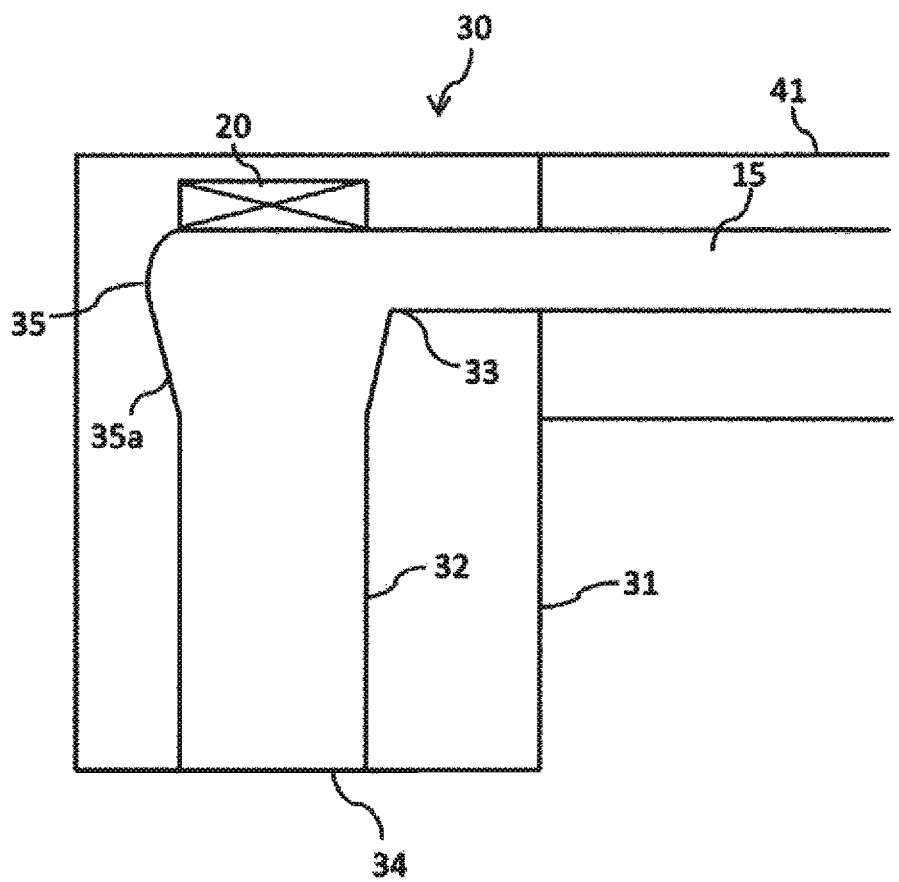

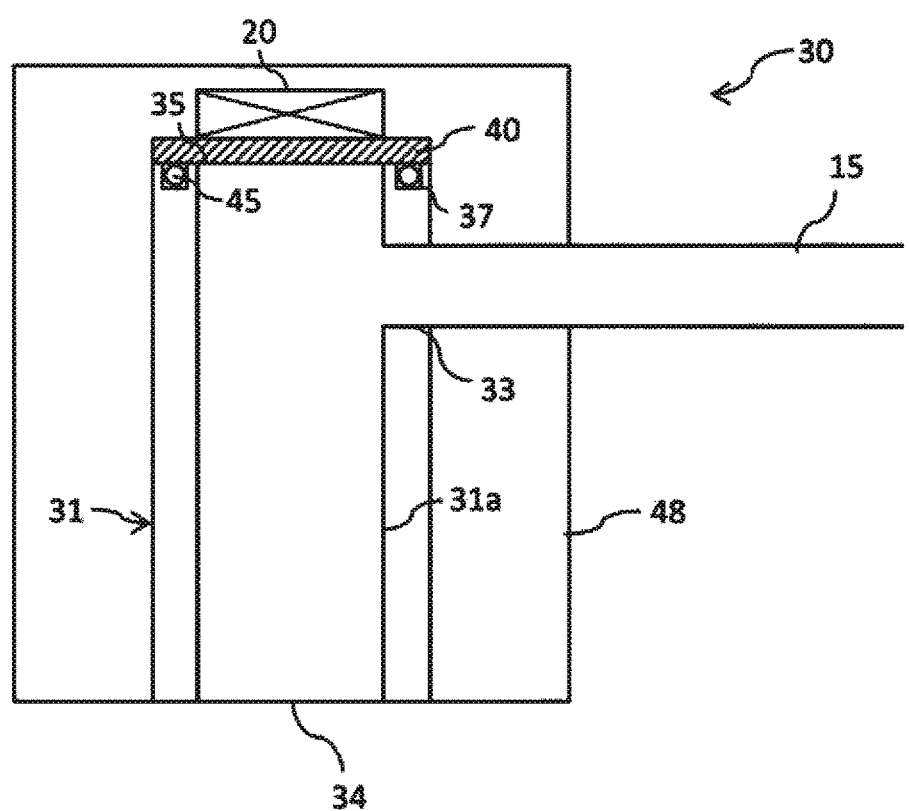

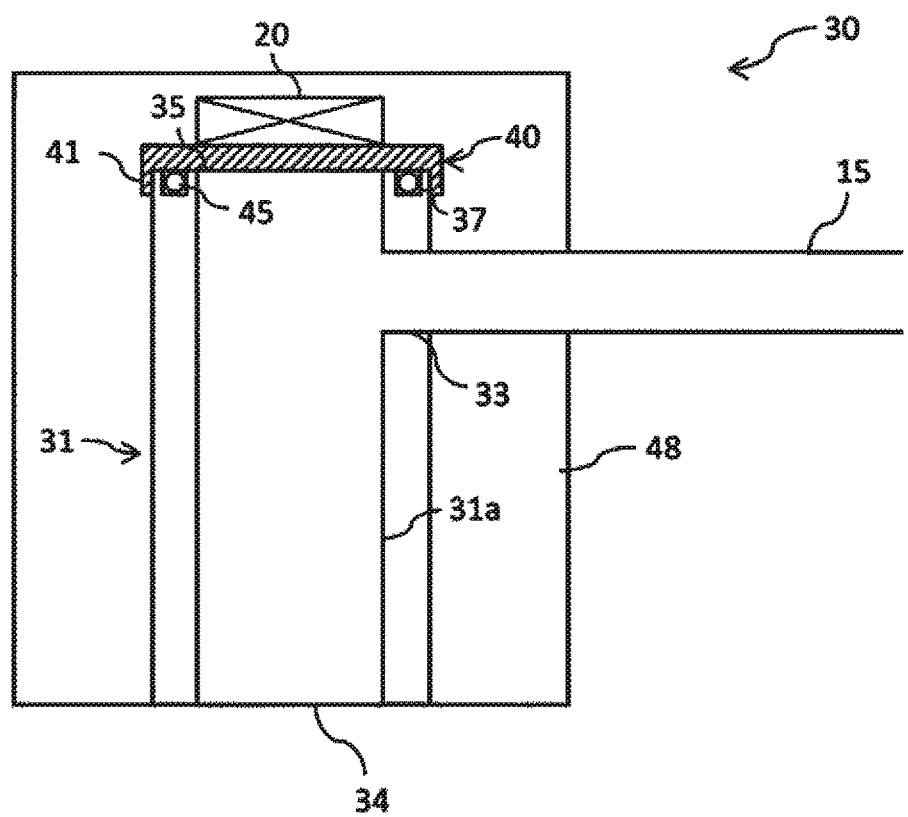

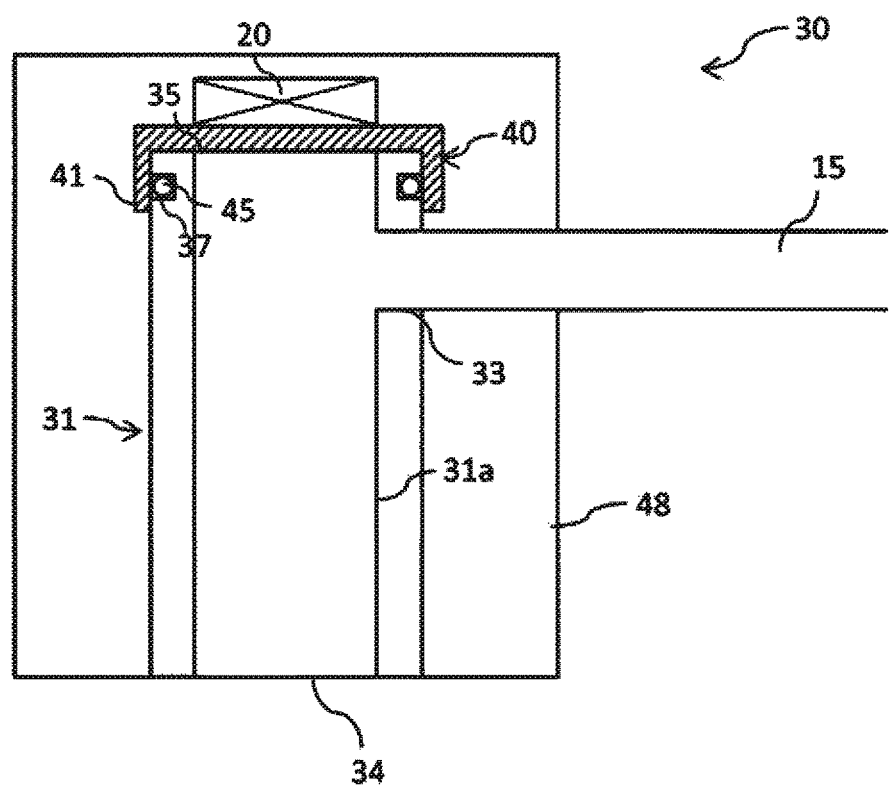

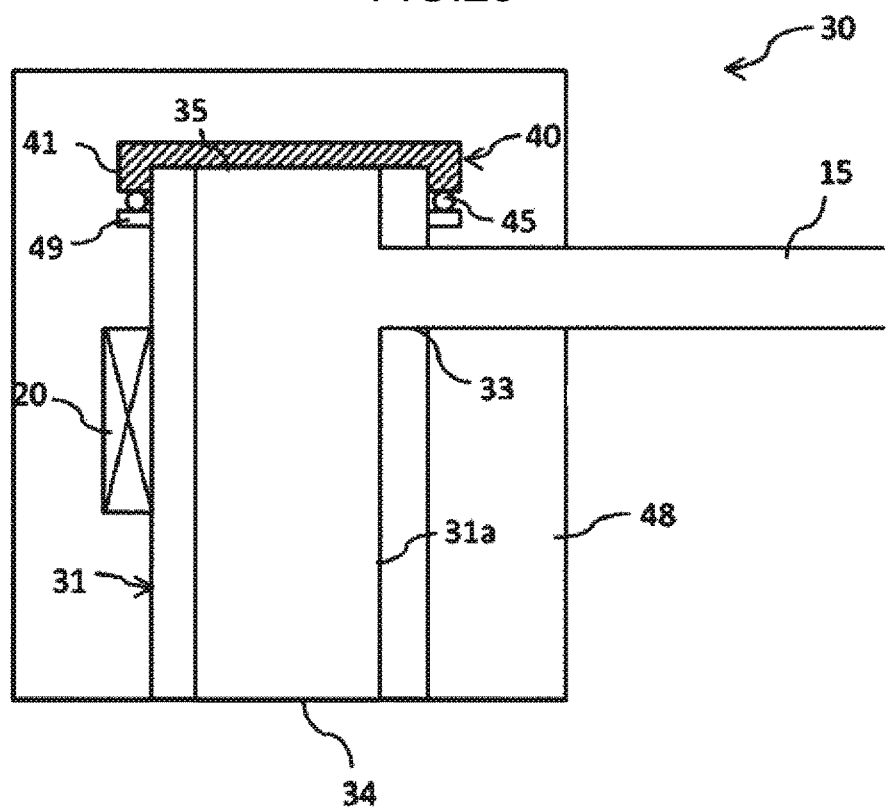

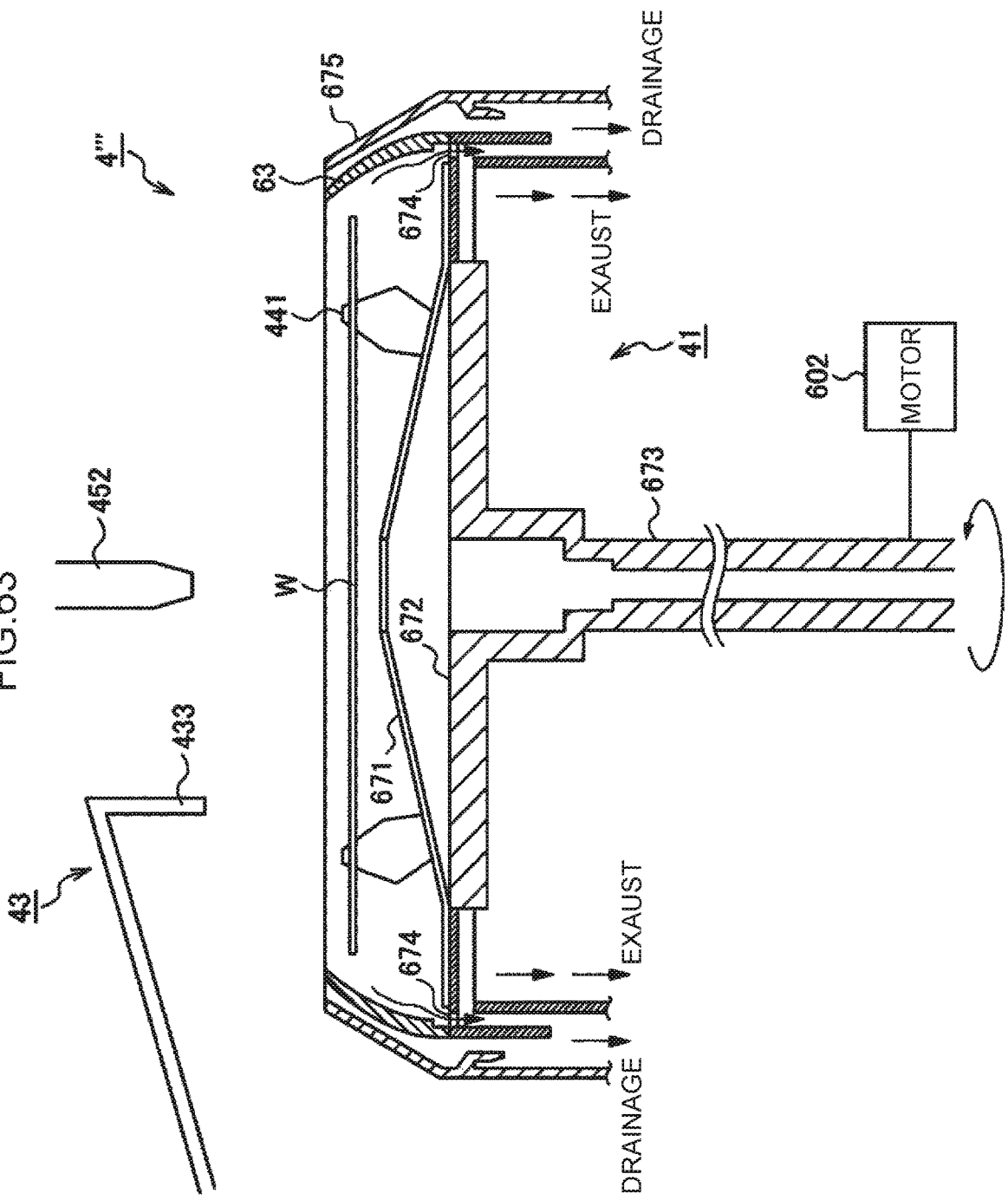

US 11,676,827 B2

SUBSTRATE CLEANING APPARATUS, SUBSTRATE CLEANING METHOD, SUBSTRATE PROCESSING APPARATUS, AND SUBSTRATE DRYING APPARATUS

TECHNICAL FIELD

The present disclosure relates to a substrate cleaning apparatus, a substrate cleaning method, a substrate processing apparatus, and a substrate drying apparatus.

BACKGROUND ART

A general chemical mechanical polishing (CMP) apparatus polishes, cleans, and dries a substrate such as a semiconductor wafer. That is, the CMP apparatus has a substrate polishing apparatus, a substrate cleaning apparatus, and a substrate drying apparatus.

As the substrate cleaning apparatus, for example, an apparatus that performs contact cleaning by using a pen type cleaning tool or a roll type cleaning tool (Patent Literature 1), an apparatus that performs non-contact cleaning by using two-fluid jet (Patent Literature 2), an apparatus that performs cleaning by using ozone water (Patent Literature 3), and the like have been known. As the substrate drying apparatus, for example, an apparatus that performs IPA drying (Patent Literature 4) and the like have been known.

In addition, as one of the cleaning methods for cleaning a surface of a substrate such as a semiconductor wafer in a non-contact manner, ultrasonic cleaning using cavitation that cleans a surface of a substrate by spraying ultrasonically-treated pure water onto the surface of the substrate has been known (see Patent Literature 5).

CITATION LIST

Patent Literature

Patent Literature 1: JP 2015-65379 A
Patent Literature 2: JP 2015-103647 A
Patent Literature 3: JP 2014-117628 A
Patent Literature 4: JP 2014-204427 A
Patent Literature 5: JP 2014-130882 A

SUMMARY OF INVENTION

Technical Problem

An object of the present disclosure is to provide a higher-performance substrate cleaning apparatus, substrate cleaning method, substrate processing apparatus and substrate drying apparatus.

Solution to Problem

According to one aspect, a substrate cleaning apparatus, including: a substrate holding and rotating mechanism that holds and rotates a substrate; a first cleaning mechanism that brings a cleaning tool into contact with the substrate to clean the substrate, cleans the substrate using two-fluid jet, or cleans the substrate using ozone water; and a second cleaning mechanism that cleans the substrate using an ultrasonic cleaning liquid is provided.

Advantageous Effects of Invention

The high-performance substrate cleaning apparatus, substrate cleaning method, substrate processing apparatus, and substrate drying apparatus are provided.

BRIEF DESCRIPTION OF DRAWINGS

FIG. 4 is a side cross-sectional view showing aspect 1 of a feeder used in the first embodiment.

FIG. 5 is a side cross-sectional view showing aspect 2 of the feeder used in the first embodiment.

FIG. 25 is a side cross-sectional view showing aspect 4 of the feeder used in the third embodiment.

FIG. 26 is a side cross-sectional view showing aspect 5 of the feeder used in the third embodiment.

FIG. 27 is a side cross-sectional view showing aspect 6 of the feeder used in the third embodiment.

FIG. 28 is a side cross-sectional view showing aspect 7 of the feeder used in the third embodiment.

FIG. 63 is a side view of a substrate cleaning apparatus 4''' according to a fourteenth embodiment.

DESCRIPTION OF EMBODIMENTS

First Embodiment

In the case of using ultrasonic cleaning, it is impossible to deny the possibility that a vibrator is damaged by vibrating the vibrator in a state (a so-called no-water burning state) in which no cleaning liquid is present.

First and second embodiments have been made in view of these points, and are to provide a substrate cleaning apparatus that does not vibrate the vibrator in the state (a so-called no-water burning state) in which no cleaning liquid is present.

<<Configuration>>

Hereinafter, a first embodiment of a substrate processing apparatus having a substrate cleaning apparatus according to an embodiment of the present invention will be described with reference to the drawings.

Figure 1:
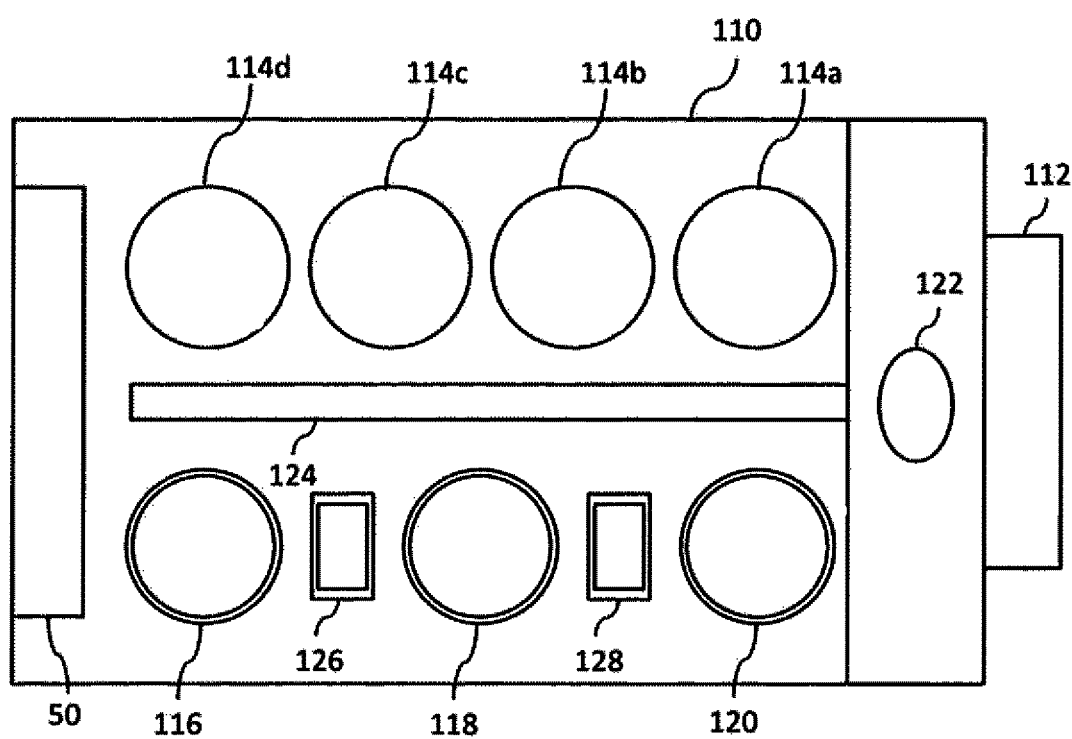
FIG. 1 is an upper plan view showing the overall configuration of a substrate processing apparatus including a substrate cleaning apparatus according to a first embodiment.

As shown in FIG. 1, the substrate processing apparatus has a substantially rectangular housing 110 and a load port 112 on which a substrate cassette for stocking a plurality of substrates W is mounted. The load port 112 is disposed adjacent to the housing 110. The load port 112 may be mounted with an open cassette, a standard mechanical interface (SMIF) pod, or a front opening unified pod (FOUP). The SMIF pod and the FOUP are airtight containers that can have a substrate cassette stored therein, and be covered with partition walls to maintain an environment independent of an external space. Examples of a substrate W may include a semiconductor wafer and the like.

A plurality (four in this aspect shown in FIG. 1) of polishing units 114a to 114d, a first cleaning unit 116 and a second cleaning unit 118 that clean the polished substrate W, and a drying unit 120 that dries the cleaned substrate W are housed inside the housing 110. The polishing units 114a to 114d are arranged along a longitudinal direction of the substrate processing apparatus, and the cleaning units 116 and 118 and the drying unit 120 are also arranged along the longitudinal direction of the substrate processing apparatus. According to the substrate processing apparatus of the present embodiment, in a manufacturing process of a magnetic film in a semiconductor wafer having a diameter of 300 mm or 450 mm, a flat panel, image sensors such as a complementary metal oxide semiconductor (CMOS) or a charge coupled device (CCD), and a magneto resistive random access memory (MRAM), various substrates W can be polished.

A first conveyance robot 122 is disposed in a region surrounded by the load port 112, the polishing unit 114a located on a side of the load port 112, and the drying unit 120. In addition, a conveying unit 124 is arranged in parallel with the polishing units 114a to 114d, the cleaning units 116 and 118, and the drying unit 120. The first conveyance robot 122 receives the substrate W before polishing from the load port 112 and conveys the substrate W to the conveying unit 124, or receives the dried substrate W, which is taken out from the drying unit 120, from the conveying unit 124.

A second conveyance robot 126 that conveys the substrate W between the first cleaning unit 116 and the second cleaning unit 118 is disposed between the first cleaning unit 116 and the second cleaning unit 118, and a third conveyance robot 128 that conveys the substrate W between the second cleaning unit 118 and the drying unit 120 is disposed between the second cleaning unit 118 and the drying unit 120. In addition, a controller 50 that controls a movement of each device of the substrate processing apparatus is disposed inside the housing 110. The present embodiment is described based on an aspect in which the controller 50 is disposed in the housing 110, but is not limited thereto, and the controller 50 may be disposed outside the housing 110.

Figure 9:
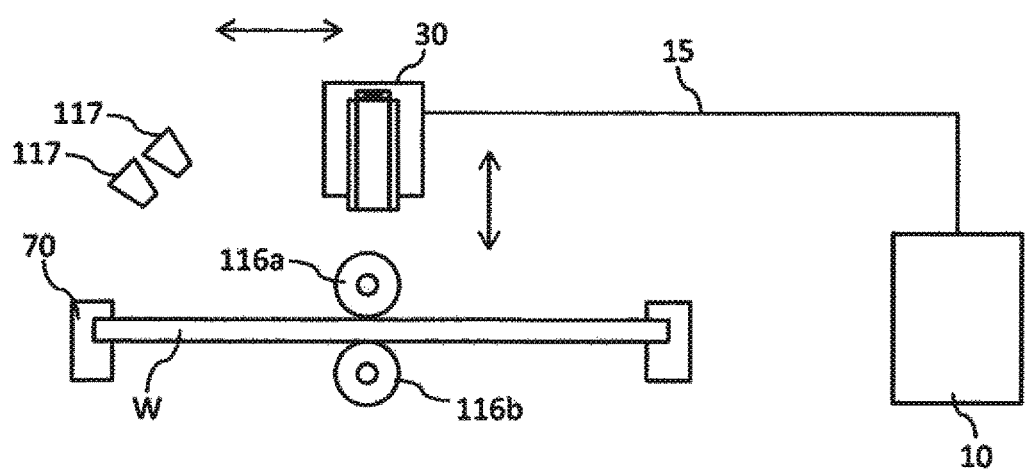
FIG. 9 is a side cross-sectional view of the substrate cleaning apparatus showing an aspect in which the feeder used in the first embodiment is used together with a roll cleaning member and a nozzle supplying a cleaning liquid.

As the first cleaning unit 116, a roll cleaning apparatus which brings roll cleaning members 116a and 116b linearly extending substantially over the whole length of a diameter of the substrate W into contact with the substrate W under the presence of the cleaning liquid to perform scrubbing cleaning on a surface of the substrate W while the roll cleaning members 116a and 116b rotating on a central axis parallel to the substrate W may be used (see FIG. 9). In addition, as the second cleaning unit 118, a pencil cleaning apparatus that brings a lower end contact surface of a columnar pencil cleaning member 118a extending in a vertical direction into contact with the substrate W under the presence of the cleaning liquid and moves the pencil cleaning member 118a in one direction while rotating the pencil cleaning member 118a to perform the scrubbing cleaning on the surface of the substrate W may be used (see FIG. 10). In addition, as the drying unit 120, a spin drying unit that dries the substrate W by jetting IPA vapor from a spray nozzle moving toward a horizontally rotating substrate W, and dries the substrate W by a centrifugal force generated by rotating the substrate W at a high speed may be used.

Figure 10:
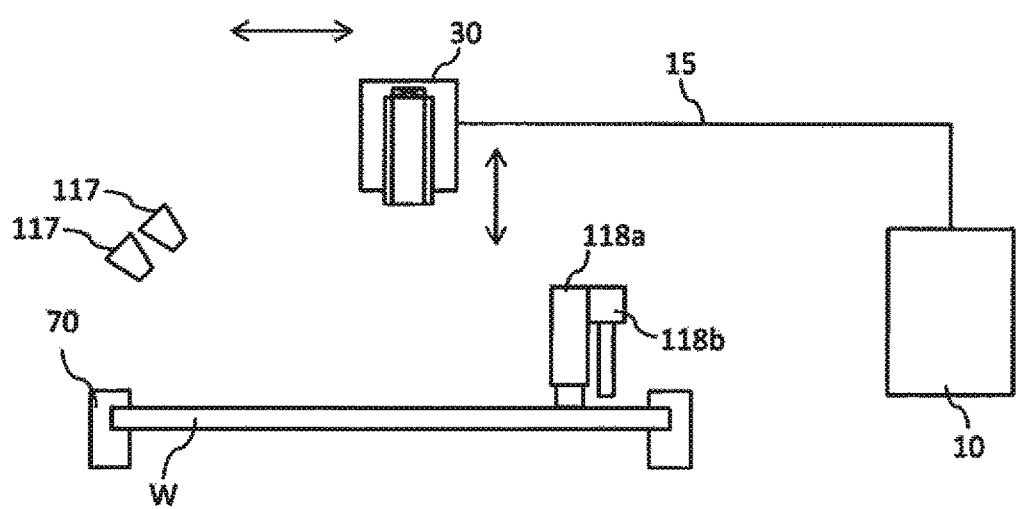
FIG. 10 is a side cross-sectional view of the substrate cleaning apparatus showing an aspect in which the feeder used in the first embodiment is used together with a pencil cleaning member, a two-fluid jet cleaner, and the nozzle supplying the cleaning liquid.

It is to be noted that instead of using the roll cleaning apparatus as the first cleaning unit 116, the pencil cleaning apparatus similar to the second cleaning unit 118 may be used, or a two-fluid jet cleaning apparatus that cleans the surface of the substrate W by two-fluid jet may be used. In addition, it should be noted that instead of using the pencil cleaning apparatus as the second cleaning unit 118, the roll cleaning apparatus similar to the first cleaning unit 116 may be used, or the two-fluid jet cleaning apparatus that cleans the surface of the substrate W by the two-fluid jet may be used. The substrate cleaning apparatus according to the embodiment of the present invention can be applied to both the first cleaning unit 116 and the second cleaning unit 118, and can be used together with the roll cleaning apparatus, the pencil cleaning apparatus, and/or the two-fluid jet cleaning apparatus. As an example, as shown in FIG. 9, a feeder 30 (described later) according to the present embodiment may also be used together with the roll cleaning members 116a and 116b that clean a first surface (upper surface in FIG. 9) and a second surface (lower surface in FIG. 9) of the substrate W and a nozzle 117 that supplies the cleaning liquid. As another example, as shown in FIG. 10, the feeder 30 according to the present embodiment may be used together with the pencil cleaning member 118a that cleans the first surface (upper surface in FIG. 10) of the substrate W, a two-fluid jet cleaner 118b, and the nozzle 117 that supplies the cleaning liquid.

The cleaning liquid of the present embodiment contains rinse liquids such as pure water (DIW) and chemical liquids such as ammonia hydrogen peroxide (SC1), hydrochloric acid hydrogen peroxide (SC2), sulfuric acid hydrogen peroxide (SPM), sulfuric acid water, and hydrofluoric acid. Unless otherwise specified in the present embodiment, the cleaning liquid means either the rinse liquid or the chemical liquid.

Figure 2:
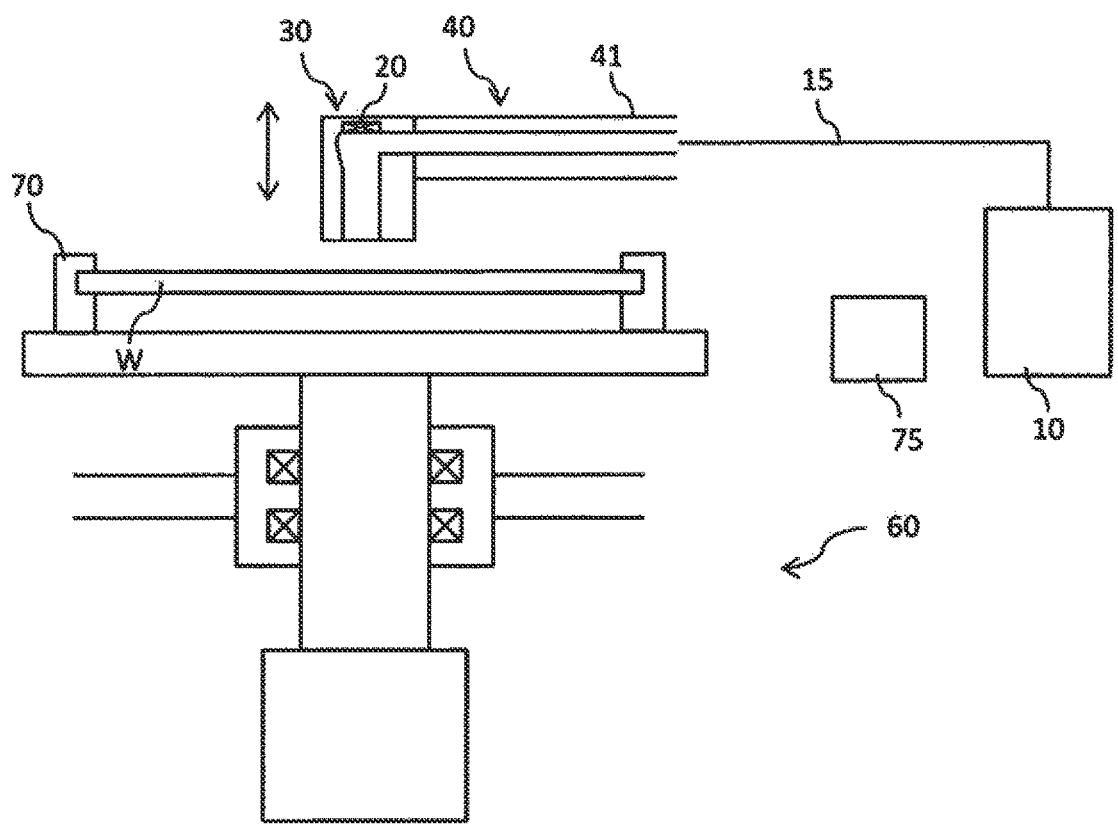
FIG. 2 is a side cross-sectional view of the substrate cleaning apparatus in a case in which a swinging module is adopted in the first embodiment.
Figure 3:
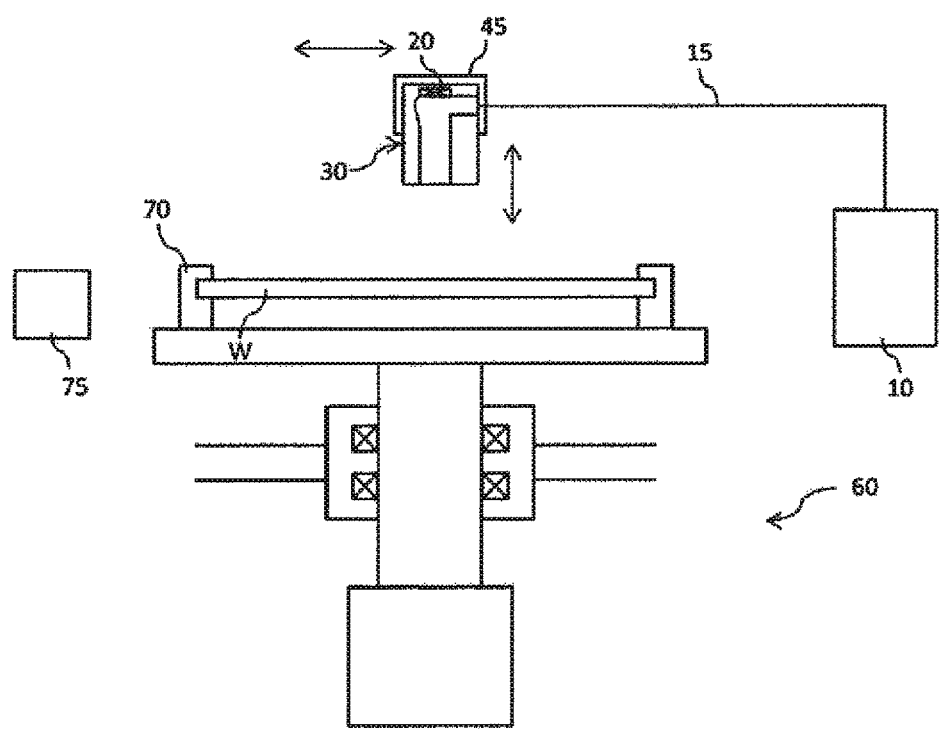
FIG. 3 is a side cross-sectional view of the substrate cleaning apparatus in a case in which a feeder holder is adopted in the first embodiment.

As shown in FIGS. 2 and 3, the substrate cleaning apparatus according to the embodiment of the present invention includes a substrate support 70 such as a chuck that supports (holds) the substrate W and a rotator 60 that rotates the substrate W supported by the substrate support 70. The substrate support 70 and the rotator 60 constitute a substrate rotating mechanism. In this aspect shown in FIGS. 2 and 3, only two substrate supports 70 are shown, but when viewed from above, in the present embodiment, four substrate supports 70 are disposed equally (at an angle of 90° centered on a rotation center). It should be noted that the number of the substrate supports 70 is enough to be able to stably support the substrate W, and may be three, for example. It is to be noted that as the substrate support 70 that supports the substrate W, a spindle or the like can also be used. In the case of using such a spindle, the substrate W is supported while being rotated, and the spindle also serves as the rotator. FIGS. 2 and 3 show an example in which the substrate W is supported in a horizontal direction, but the present invention is not limited to this example. For example, the substrate support 70 may be configured to support the substrate W in a longitudinal direction (vertical direction) or an oblique direction. A rotation direction or a rotation speed of the substrate W is controlled by the controller 50. The rotation speed of the substrate W may be constant or variable.

As shown in FIGS. 2 and 3, the feeder 30 is connected to a supplier 10 via a supply pipe 15.

As shown in FIG. 2, the feeder 30 may be held by a swinging module 40. The swinging module 40 includes a first extension 41 that extends in a direction orthogonal to a normal line to the substrate W and a second extension 42 that is connected to a base end portion side of the first extension 41 and extends in a normal direction of the substrate W (see FIG. 6). The feeder 30 may be connected to a tip portion of the first extension 41. In the present embodiment, the "extending in the normal direction of the substrate W" may be enough to extend, including the "component in the normal direction of the substrate W", and may be inclined from the "normal direction of the substrate W". In addition, the swinging module 40 may be movable along the normal direction (vertical direction in FIG. 2) of the substrate W by, for example, an actuator (not shown).

As shown in FIG. 3, a feeder holder 45 that movably holds the feeder 30 by, for example, sliding in a surface (left and right in FIG. 3 and front and rear directions of a page space) orthogonal to the normal direction of the substrate W may be provided. The supply pipe 15 may have plasticity and may be configured to follow the movement of the feeder 30 when the feeder 30 moves. The feeder holder 45 may be configured to be moveable along the normal direction (vertical direction in FIG. 3) of the substrate W by, for example, the actuator (not shown).

To prevent the cleaning liquid or the ultrasonic cleaning liquid from being scattered, a rotating cup (not shown) that is provided on an outside of the substrate support 70, covers a periphery of the substrate W, and rotates in synchronization with the substrate W may be provided.

As shown in FIGS. 2 and 3, the substrate cleaning apparatus has the supplier 10 that supplies the cleaning liquid, the feeder 30 that supplies the cleaning liquid supplied from the supplier 10 to the substrate W, and a vibrator 20 that is provided in the feeder 30 and applies the ultrasonic vibration to the cleaning liquid supplied from the supplier 10.

As shown in FIGS. 4 and 5, the feeder 30 includes a main body module 31, an outlet 34 that discharges the cleaning liquid to the substrate W, a guide module 32 that guides the cleaning liquid to the outlet 34, and an inlet 33 that introduces the cleaning liquid supplied from the supplier 10 into the guide module 32. The guide module 32 is formed by an inner wall of the main body module 31. In the present embodiment, the guide module 32 has an expander 35 into which the cleaning liquid is introduced after passing through a vibration corresponding position corresponding to the vibrator 20. The "vibration corresponding position" in the present embodiment is a position facing the vibrator 20 and, as described with reference to FIG. 4, is a region positioned under the vibrator 20. The "expander 35" in the present embodiment is a portion expanded further outwardly than the other portion of the guide module 32, and means, for example, a portion having a cross-sectional area larger than that of the guide module 32 at the outlet 34 or in the vicinity thereof.

As shown in FIGS. 4 and 5, the expander 35 expanded toward outwardly may be provided on a surface on an opposite side facing the inlet 33. In addition, as shown in FIG. 5, the expander 35 may also be expanded even on a surface including the inlet 33, and the entire peripheral surface including the surface on the opposite side facing the inlet 33 and a surface including the inlet 33 may be expanded outwardly. Further, as shown in FIG. 4, the surface including the inlet 33 is not expanded and the surface on the inlet 33 side may not be expanded. It is to be noted that the "surface on the inlet 33 side" means a surface located closer to the inlet 33 than the center of the guide module 32 in a plan view (when viewed from above in FIG. 4).

The above-described controller 50 may be configured to supply the cleaning liquid from the supplier 10 prior to supplying the cleaning liquid to the substrate W. In addition, instead of or using this aspect, the controller 50 may control a direction changer 55 (described below) to allow the outlet 34 to be toward a direction opposite to the substrate W prior to supplying the cleaning liquid to the substrate W (see FIG. 6(d)). It is to be noted that "the direction opposite to the substrate W" may include a component toward the opposite side to the substrate W, and when describing with reference to FIG. 6(d), may include the component on the upper side in FIG. 6(d).

The present embodiment is described using an aspect in which only one feeder 30 is mainly used, but is not limited thereto, and a plurality of feeders 30 may be provided.

Figure 19A:
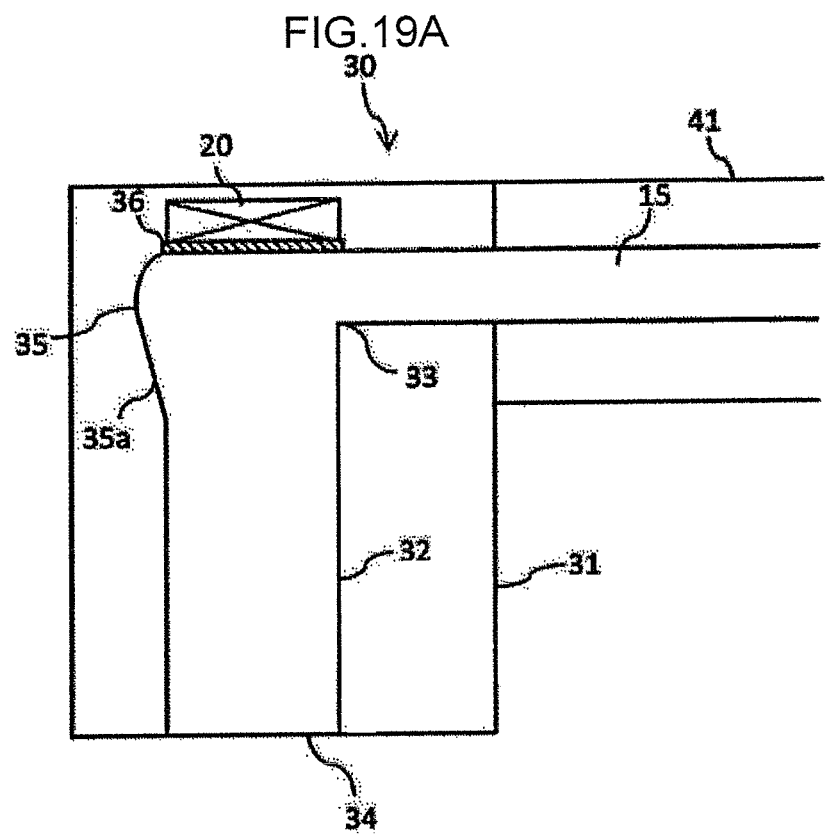
FIG. 19(a) is a side cross-sectional view showing an aspect in which a closing module used in the first embodiment is used.

The ultrasonic vibration generated by the vibrator 20 is applied to the cleaning liquid via the guide module 32 or the closing module 36 (see FIG. 19(a)) or directly applied to the cleaning liquid. In this aspect shown in FIGS. 4 and 5, the vibrator 20 is provided in contact with the guide module 32, and the ultrasonic vibration generated by the vibrator 20 is applied to the cleaning liquid via the guide module 32. On the other hand, in this aspect shown in FIG. 19(a), the vibrator 20 is provided in contact with the closing module 36, and the ultrasonic vibration generated by the vibrator 20 is applied to the cleaning liquid via the closing module 36.

As the material of the guide module 32, for example, quartz, stainless steel, sapphire, PTFE, PEEK, a carbon-containing resin, or the like can be used. In particular, the quartz and the sapphire are materials that make attenuation of the ultrasonic vibration difficult. Therefore, it is possible to prevent the ultrasonic vibration applied to the cleaning liquid from being attenuated by using such quartz or sapphire. Also, the closing module 36 may be formed from a material including Ta, quartz, PTFE, PEEK, carbon-containing resin (C-PTFE, C-PEEK, or the like) or sapphire, and, more specifically, the closing module 36 may be formed from Ta, quartz, PTFE, PEEK, carbon-containing resin (C-PTFE, C-PEEK or the like) or sapphire.

In particular, in the case in which the guide module 32 is made of a resin material and a flow rate of the cleaning liquid flowing in the guide module 32 is increased, charging may occur due to the contact between the cleaning liquid and the guide module 32. If a tip of the guide module 32 in which such charging has occurred is brought close to the substrate W, the surface of the substrate W may be charged through a space due to the influence of the charging on the guide module 32. Therefore, it is preferable to adopt the carbon-containing resins (conductive resin materials) such as C-PTFE and C-PEEK as resin materials of the guide module 32 and connect the guide module 32 to a ground via the swinging module 40 or the like. The reason of adopting such an aspect is that it is possible to remove electricity charged due to the contact between the cleaning liquid and the guide module 32, make it difficult for the charging to be generated near the tip of the guide module 32, and eventually reliably avoid the charging of the substrate W.

In the case in which the closing module 36 is used, the position facing the closing module 36 in the guide module 32 is open, and the opening is completely covered with the closing module 36. A seal member such as an O-ring may be provided between the closing module 36 and an outer surface (main body module 31) of a wall surface constituting the guide module 32. As an example, the seal member such as the O-ring larger than the opening may be provided, and the seal member may be sandwiched between the closing module 36 and the outer surface (main body module 31) of the wall surface constituting the guide module 32.

Figure 6A:
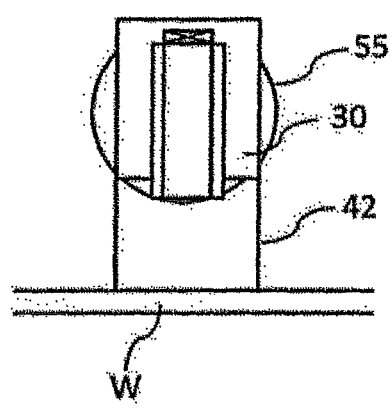
FIGS. 6(a) to 6(d) are front cross-sectional views in a case in which a direction changer is adopted in the first embodiment.
Figure 6B:
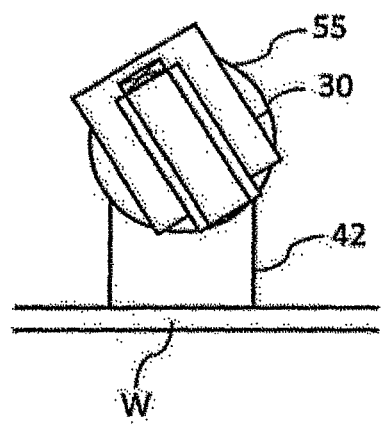
Figure 6C:
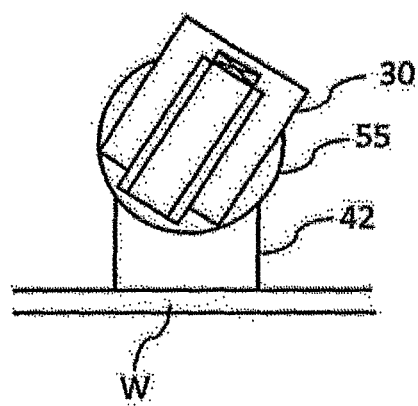
Figure 6D:
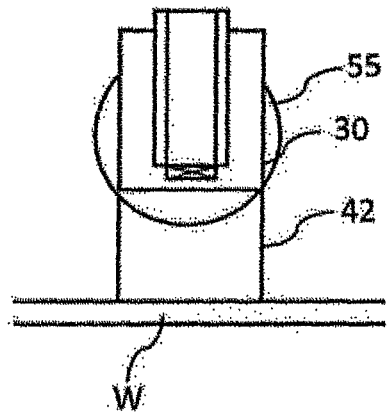
Figure 6E:
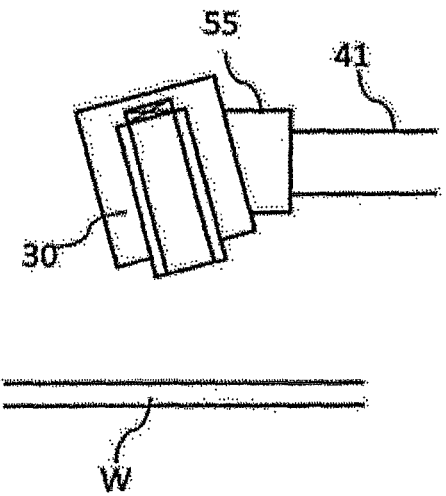
FIGS. 6(e) and 6(f) are side cross-sectional views in the case in which the direction changer is adopted in the first embodiment.
Figure 6F:
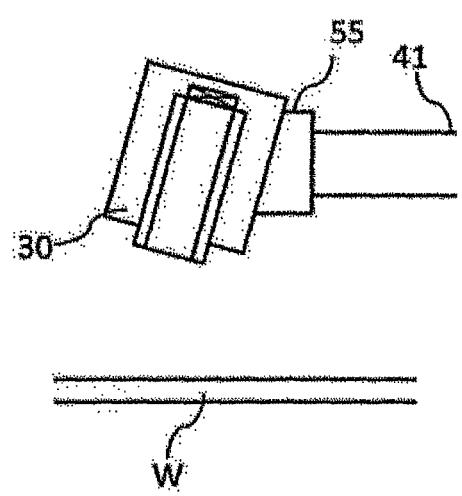

As shown in FIGS. 6(a) to 6(f), the direction changer 55 capable of changing the angle of the outlet 34 may be provided. By this direction changer 55, the feeder 30 may be inclined with respect to the substrate W so that the angle of the outlet 34 with respect to the substrate W may be freely changed or the outlet 34 can be directed toward the opposite side to the substrate W (see FIGS. 6(b) to 6(d)). In addition, as shown in FIGS. 6(e) and 6(f), the outlet 34 may be directed toward the central side of the substrate W, or the outlet 34 may directed toward the peripheral side of the substrate W.

For example, when it is desired to store the cleaning liquid on the substrate W, the feeder 30 may be inclined with respect to the substrate W at an angle at which the cleaning liquid is supplied toward the opposite side to the rotation direction of the substrate W. On the other hand, for example, when it is desired to supply the cleaning liquid to the substrate W without adding a resistance, the feeder 30 may be inclined with respect to the substrate W at an angle at which the cleaning liquid is supplied along the rotation direction of the substrate W. It is to be noted that the angle of the feeder 30 with respect to the substrate W may be changed manually or may be changed automatically in response to receiving a signal from the controller 50. In the case in which the angle is automatically changed in response to receiving the signal from the controller 50, the angle held by the feeder 30 may be sequentially changed according to a recipe.

Figure 7:
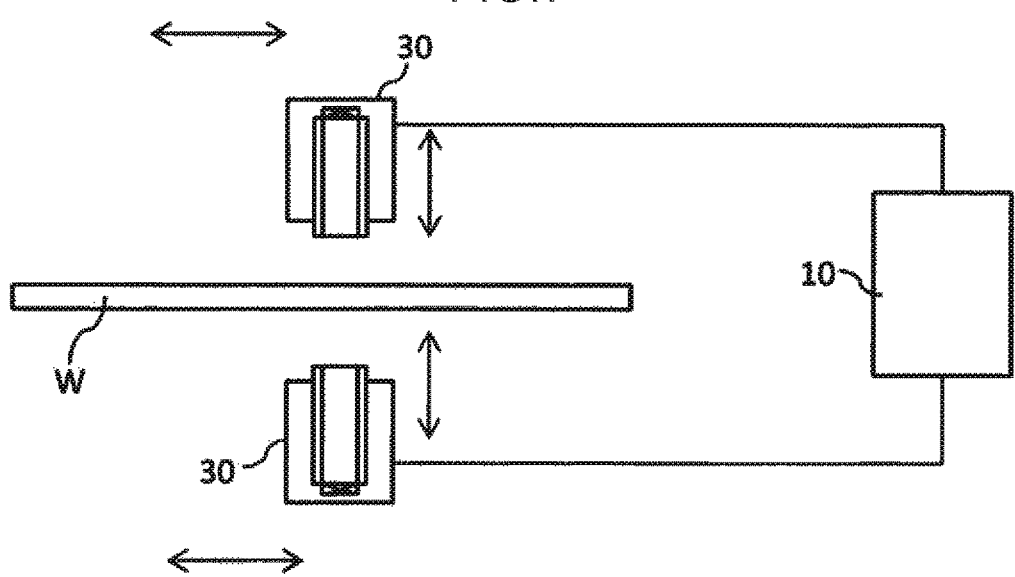
FIG. 7 is a side cross-sectional view of the substrate cleaning apparatus showing an aspect in which the two feeders used in the first embodiment are provided.

As shown in FIG. 7, two or more feeders 30 may be provided, and may be provided to supply the cleaning liquid to both the front and rear surfaces of the substrate W. In the case in which two or more feeders 30 are used, the swinging module 40 may be adopted as shown in FIG. 2, or the feeder holder 45 is adopted as shown in FIG. 3. The same goes for other aspects, and in any of FIGS. 4 to 6 and 8 to 10, the swinging module 40 may be adopted as shown in FIG. 2, or the feeder holder 45 may be adopted as shown in FIG. 3. Although FIGS. 4 to 6 show an aspect using the swinging module 40, this is merely an example, and the feeder holder 45 as shown in FIG. 3 may be used.

The controller 50 may control a moving speed of the feeder 30 to be slower when the feeder 30 cleans a peripheral side region of the substrate W than when the feeder 30 cleans a central side region of the substrate W. The "central side region" in the present embodiment is used in comparison with the "peripheral side region" and means a region located on the center side of the substrate W as compared with the "peripheral side region".

Further, the controller 50 may start to vibrate the vibrator 20 after a lapse of a first period of time since the supply of the cleaning liquid from the supplier 10. In addition, the controller 50 may start to supply the cleaning liquid from the outlet 34 to the substrate W after a lapse of a second period of time longer than the first period of time after the cleaning liquid is supplied from the supplier 10. At this time, the cleaning liquid may be continuously supplied after the lapse of the first period of time since the supply of the cleaning liquid from the supplier 10, the feeder 30 may start to move after a lapse of a third period of time longer than the first period of time and shorter than the second period of time, and the cleaning liquid may be supplied to the peripheral portion of the substrate W after the lapse of the second period of time since the supply of the cleaning liquid from the supplier 10. Thereafter, in this aspect, the cleaning liquid continues to be supplied from the peripheral portion toward the central portion of the substrate W. Unlike this aspect, the supply of the cleaning liquid from the supplier 10 stops while the outlet 34 moves from the peripheral portion to the upper side of the central portion of the substrate W, and the cleaning liquid is discharged again from the outlet 34 after the outlet 34 is positioned above the central portion of the substrate W (after the lapse of the second period of time), and the cleaning liquid may be supplied to the central portion of the substrate W. While the substrate W is being cleaned, the second extension 22 may move from the central portion toward the peripheral portion of the substrate W, or conversely, the second extension 22 may move from the peripheral portion toward the central portion of the substrate W, and such movement may be repeatedly performed.

When the cleaning liquid is supplied to the substrate W, the ultrasonic vibration is not necessarily always applied to the cleaning liquid. In the case in which the ultrasonic vibration is not applied to the cleaning liquid as in a process for forming a film of the cleaning liquid on the upper surface of the substrate W or the like, the cleaning liquid may be discharged from the outlet 34 prior to being supplied to the substrate W without performing the ultrasonic vibration.

As shown in FIGS. 2 and 3, the substrate cleaning apparatus may further include a discharge liquid collector 75 that collects the cleaning liquid discharged from the outlet 34 at a standby position. The discharge liquid collector 75 is connected to a drainage collector (not shown), and the collected cleaning liquid may be drained.

As shown by double-headed arrows in the vertical direction in FIGS. 2 and 3, when the cleaning liquid is supplied to the substrate W, the feeder 30 may be positioned at a proximity position, and when the cleaning liquid is not supplied to the substrate W, the feeder 30 may be positioned at a separation position. It is to be noted that the "separation position" means a position far from the substrate W in the normal direction of the substrate Was compared with the "proximity position", and conversely, the "proximity position" means a position near the substrate W in the normal direction of the substrate Was compared with the "separation position". The feeder 30 is connected to the actuator (not shown) and may be positioned at the proximity position and the separation position by the actuator.

It should be noted that the substrate support 70 can move in the vertical direction so that the substrate W may take the "separation position" and the "proximity position" with respect to the feeder 30, and both of the feeder 30 and the substrate support 70 can move in the vertical direction and both of the substrate W and the feeder 30 may be positioned appropriately so that the substrate W may take the "separation position" and the "proximity position".

In particular, in the case in which the guide module 32 is made of a material such as quartz which is difficult to attenuate the ultrasonic vibration, when the aspect in which the feeder 30 is positioned at the proximity position prior to supplying the cleaning liquid to the substrate W is adopted, the guide module 32 made of a material which makes the attenuation of the ultrasonic vibration difficult guides the cleaning liquid to a position close to the substrate W when the cleaning liquid is supplied to the substrate W, thereby supplying the cleaning liquid to the substrate W.

In addition, when the process of supplying the cleaning liquid to the substrate W ends, the feeder 30 may be positioned at the separation position. By positioning the feeder 30 at the separation position as described above, it is possible to prevent the cleaning liquid and other liquids from adhering to the feeder 30, the first extension 41, or the supply pipe 15 in an unexpected form.

In addition, when the process of supplying the cleaning liquid to the substrate W ends, the feeder 30 may be positioned at the standby position. The feeder 30 may be positioned at the separation position in the standby position. The standby position means, for example, a position at which the feeder 30 is not positioned in the normal direction of the substrate W, and in this aspect in which the substrate W is disposed so as to extend along the horizontal direction, means that the feeder 30 is not positioned in the vertical direction of the substrate W. An example of the standby position may include a position at which the cleaning liquid can be discharged to the discharge liquid collector 75 described above.

Prior to supplying the cleaning liquid to the substrate W, in the case of supplying the cleaning liquid from the supplier 10 and discharging the cleaning liquid from the outlet 34 at the standby position toward, for example, the discharge liquid collector 75, the cleaning liquid is positioned at the proximity position. By positioning in the proximity position, it is possible to prevent the discharged cleaning liquid from being scattered inadvertently.

The feeder 30 may be positioned at the separation position (upper position) in the standby position, positioned in the proximity position (lower position) in the standby position, and then may move above the substrate W. By positioning the feeder 30 at the separation position in the standby position, it is possible to more reliably prevent the cleaning liquid and other liquids from adhering to the feeder 30 in an unexpected form. In addition, by moving the feeder 30 after being positioned at the proximity position (lower position) in the standby position, when the feeder 30 moves above the substrate W, the cleaning liquid can be supplied at the position near the substrate W and the substrate W can be efficiently cleaned.

In addition, the feeder 30 is positioned at the separation position (upper position) in the standby position, and in that state, moves above the substrate W, and after the outlet 34 is positioned at the center of the substrate W, the feeder 30 may be positioned at the proximity position (lower position). According to this aspect, it can be expected that the cleaning liquid, other liquids and the like in the previous process can be prevented from adhering to the feeder 30 when the feeder 30 moves above the substrate W.

<<Action and Effect>>

Next, actions and effects according to the present embodiment having the above-described configuration will be described based on those not yet explained.

According to the present embodiment, the feeder 30 has the expander 35 into which the cleaning liquid is introduced after passing through the vibration corresponding position corresponding to the vibrator 20. As a result, the cleaning liquid supplied from the supplier 10 can efficiently pass through the vibration corresponding position. Therefore, it is possible to efficiently prevent in advance the occurrence of the state in which the vibrator 20 vibrates in the state (a so-called no-water burning state) in which no cleaning liquid is present.

As shown in FIGS. 4 and 5, in the case of adopting the aspect in which the expander 35 is expanded outwardly on the surface on the opposite side facing the inlet 33, the cleaning liquid introduced from the inlet 33 can smoothly pass through the vibration corresponding position. Therefore, it is possible to efficiently prevent in advance the occurrence of the state in which the vibrator 20 vibrates in the state in which no cleaning liquid is present. In addition, by adopting this aspect, it is possible to efficiently form a convection of the cleaning liquid introduced from the inlet 33 in the expander 35. As a result, it is possible to more efficiently eliminate the state in which no cleaning liquid is present.

As shown in FIG. 4, in the case of adopting the aspect in which the surface on the inlet 33 side is not expanded, it is possible to introduce the cleaning liquid into the guide module 32 while suppressing the diffusion of the cleaning liquid introduced from the inlet 33. As a result, the cleaning liquid introduced from the inlet 33 can smoothly pass through the vibration corresponding position. As a result, it is possible to efficiently prevent the occurrence of the state in which the vibrator 20 vibrates in the state in which no cleaning liquid is present.

As shown in FIGS. 4 and 5, the expander 35 may have a tapered shape 35*a* toward the outlet 34. By adopting such a tapered shape 35*a*, the cleaning liquid introduced from the inlet 33 into the expander 35 is efficiently convected in the expander 35 and then can be directed to the outlet 34. As a result, it is possible to more efficiently eliminate the space in which no cleaning liquid is present.

Prior to supplying the cleaning liquid to the substrate W, in the case of adopting the aspect in which the cleaning liquid is supplied from the supplier 10 and the cleaning liquid is discharged from, for example, the outlet 34 at the standby position, a cleaning liquid having a low cleaning effect due to the introduction of oxygen or the like is discharged, and a cleaning liquid having a strong cleaning effect due to the introduction of nitrogen or the like is applied with the ultrasonic vibration to be able to be used to clean the substrate W. In addition, it is possible to clean the substrate W with a cleaning liquid having a strong cleaning effect by being sufficiently applied with ultrasonic waves, instead of a cleaning liquid which is not sufficiently applied with ultrasonic waves and is not high in a cleaning effect. In addition, in the case of cleaning the substrate W with the cleaning liquid which is not sufficiently applied with ultrasonic waves due to the introduction of oxygen or the like, there is a possibility that defects may occur. However, by adopting this aspect, the occurrence of defects can be prevented in advance. In addition, the substrate W can be cleaned with the cleaning liquid having uniform detergency from the cleaning start time of the substrate W, and the substrate W can be stably cleaned.

In the case of adopting the aspect in which the moving speed of the feeder 30 is slower when the outlet 34 cleans the peripheral side region of the substrate W as compared with when the outlet 34 cleans the central side region of the substrate W, it is possible to supply more cleaning liquid to the outer peripheral side of the substrate W than the inner peripheral side. Since an area to be cleaned with the cleaning liquid on the outer peripheral side of the substrate W is larger than an area to be cleaned with the cleaning liquid on the inner peripheral side of the substrate W, by adopting such an aspect, it is possible to make the amount of cleaning liquid supplied per unit area of the substrate W substantially uniform.

When a distance from the center of the substrate W to be rotated is set to be r, a length of an arc at the distance r is set to be $2\pi r$. Therefore, the moving speed of the feeder 30 may be calculated based on this $2\pi r$, and the feeder 30 may move based on the moving speed. Unlike such an aspect, simply, the moving speed of the feeder 30 may be slow continuously or intermittently while the feeder 30 moves from the central portion toward the peripheral portion of the substrate W, whereas the moving speed of the feeder 30 may be fast continuously or intermittently while the feeder 30 moves from the peripheral portion toward the central portion of the substrate W. According to such an aspect, it is advantageous in that the control is not complicated.

In the case of adopting the aspect in which the vibration of the vibrator 20 starts after the lapse of the first period of time since the supply of the cleaning liquid from the supplier 10, since the cleaning liquid is introduced and then the vibrator 20 vibrates, it is possible to more reliably prevent the vibrator 20 from being damaged by vibrating the vibrator 20 in the state (a so-called no-water burning state) in which no cleaning liquid is present.

As an example, the first period of time is, for example, about 0.1 seconds to 1 second. In the first period of time, it may be enough to prevent the state in which the cleaning liquid does not exist in the portion facing the vibrator 20, so it is not necessary to take a long time to do so.

When the cleaning liquid in the guide module 32 is discharged to the discharge liquid collector 75 or the like, it may not necessary to vibrate the vibrator 20. However, it is advantageous in that the inside of the guide module 32 is cleaned with the cleaning liquid applied with the ultrasonic vibration in advance by vibrating the vibrator 20 in advance when discharging the cleaning liquid in the guide module 32 to the discharge liquid collector 75 or the like. In addition, by applying the ultrasonic vibration in advance, it is possible to apply the ultrasonic vibration to the cleaning liquid in the guide module 32 (sufficient energy can be stored) in advance, and when the substrate W is cleaned, it is possible to supply a cleaning liquid having sufficiently high detergency from the beginning.

In addition, in the case of adopting the aspect in which the cleaning liquid starts to be supplied from the outlet 34 to the substrate W after the lapse of the second period of time longer than the first period of time since the supply of the cleaning liquid from the supplier 10, it is possible to more reliably clean the substrate W with the cleaning liquid having the strong cleaning effect. It should be noted that the second period of time is, for example, time taken to discharge almost all of the cleaning liquid in the guide module 32. The second period of time may be calculated from a volume in the guide module 32 and the supply speed at which the cleaning liquid is supplied or may be experimentally derived. The second period of time is, for example, about 1 second to 5 seconds.

In the case of adopting the aspect in which the discharge liquid collector 75 that collects the cleaning liquid discharged from the outlet 34 at the standby position is provided, it is possible to reliably collect the discharged cleaning liquid not used for cleaning. As a result, the possibility that the cleaning liquid discharged from the outlet 34 splatters to become a mist and thus adversely affects the substrate W can be reduced in advance.

In addition, in this aspect in which the substrate cleaning apparatus of the present embodiment is built in a two-fluid jet cleaning apparatus that cleans the surface of the substrate W by a two-fluid mixture of liquid and gas (see FIG. 10), for example, prior to performing the two-fluid jet cleaning process, the substrate W may be cleaned by the feeder 30 of the present embodiment. According to the aspect, it is advantageous in that the two-fluid jet cleaning can be performed by floating particles adhering to the substrate W due to the cavitation effect of the cleaning liquid supplied with the ultrasonic waves. The cavitation effect is the cleaning effect using impact waves generated by bursting of air bubbles generated in the cleaning liquid by ultrasonic waves.

Modification

The vibrator 20 may be configured to apply the ultrasonic vibration to the cleaning liquid by vibrating at a first frequency and a second frequency lower than the first frequency. In addition, the vibrator 20 may be configured to apply the ultrasonic vibration to the cleaning liquid at more than three frequencies.

According to the present modification, it is possible to apply the ultrasonic vibration to the cleaning liquid at different frequencies. As a result, the detergency of the cleaning liquid can be changed depending on the applications.

Figure 8:
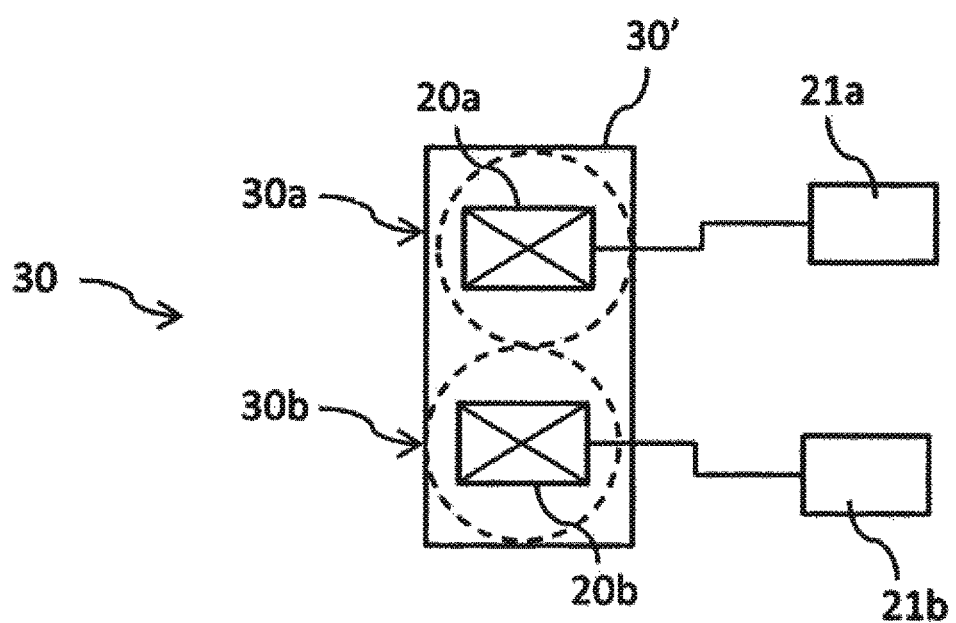
FIG. 8 is an upper plan view of the feeder showing an aspect in which two swinging modules used in the first embodiment are provided.

One vibrator 20 may vibrate at different frequencies, but as shown in FIG. 8, the vibrator 20 may include a first vibrator 20a vibrating at the first frequency and a second vibrator 20b vibrating at the second frequency lower than the first frequency. According to the aspect, it is advantageous in that it can provide the ultrasonic vibration at different frequencies with a simple configuration.

As shown in FIG. 8, the first vibrator 20a may be electrically connected to a first transmitter 21a that transmits a signal to the first vibrator 20a. Similarly, the second vibrator 20b may be electrically connected to a second transmitter 21b that transmits a signal to the second vibrator 20b.

In an aspect shown in FIG. 8, the feeder 30 has a first feeder 30a and a second feeder 30b that are held by a casing 30'. The first feeder 30a has the first vibrator 20a that is connected to the first transmitter 21a and the second feeder 30b has the second vibrator 20b that is connected to the second transmitter 21b. In this aspect shown in FIG. 8, the casing 30' moves and thus the first feeder 30a and the second feeder 30b move, but the first feeder 30a and the second feeder 30b may move separately. Since the ultrasonic vibration is attenuated when the cleaning liquid collides with the substrate W, even if the cleaning liquid is simultaneously used at different frequencies, the effect obtained by providing different frequencies is not much changed. As a result, the cleaning liquid can be simultaneously used at different frequencies.

In this embodiment, the first frequency may be 900 kHz or more and 5 MHz or less, and the second frequency may be less than 900 kHz. When the vibrator vibrates at a frequency of 900 kHz or more, a vibration width is small, so a relatively small amount of impurities can be removed, and the effect of the cavitation can be reduced, so a load applied to the substrate W can be reduced. On the other hand, when the vibrator vibrates at a frequency of less than 900 kHz, the vibration width is large, so a relatively large amount of impurities can be removed. As the difference between the first frequency and the second frequency is small, the difference in effects is also reduced. For this reason, as an example, the difference between the first frequency and the second frequency may be about 500 kHz, for example, 950 kHz may be used as the first frequency and 430 kHz may be used as the second frequency. In addition, the present embodiment is not limited thereto, and for example, 950 kHz may be used as the first frequency and 750 kHz as the second frequency.

In the case of adopting such an aspect, when the substrate cleaning apparatus of this embodiment is used together with the pencil cleaning apparatus (see FIG. 10), (1) the ultrasonic vibration may be applied to the cleaning liquid at the second frequency to clean the substrate W, (2) then, the substrate W may be cleaned using the pencil cleaning member 118*a*, (3) and then, the ultrasonic vibration may be applied to the cleaning liquid at the first frequency to clean the substrate W. According to the aspect, first of all, a large amount of impurities are removed with the cleaning liquid applied with the ultrasonic vibration at the second frequency, and then the cleaning is performed with the pencil cleaning member 118*a*, and finally, a small amount of impurities can be removed with the cleaning liquid applied with the ultrasonic vibration at the first frequency. For this reason, the load applied to the pencil cleaning member 118*a* can be reduced as compared with the prior art, and the lifespan of the pencil cleaning member 118*a* can be extended.

In addition, as another aspect, (1) the substrate W may be cleaned using the pencil cleaning member 118*a*, (1) then, the substrate W may be cleaned by applying the ultrasonic vibration to the cleaning liquid at the second frequency, (3) and then, the substrate W may be cleaned by applying the ultrasonic vibration to the cleaning liquid at the first frequency. Even in such an aspect, for the same reason as described above, the load applied to the pencil cleaning member 118*a* can be reduced as compared with the prior art, and the lifespan of the pencil cleaning member 118*a* can be extended.

Second Embodiment

Next, a second embodiment will be described with reference to FIGS. 11 to 18 and 19(*b*).

Figure 13:
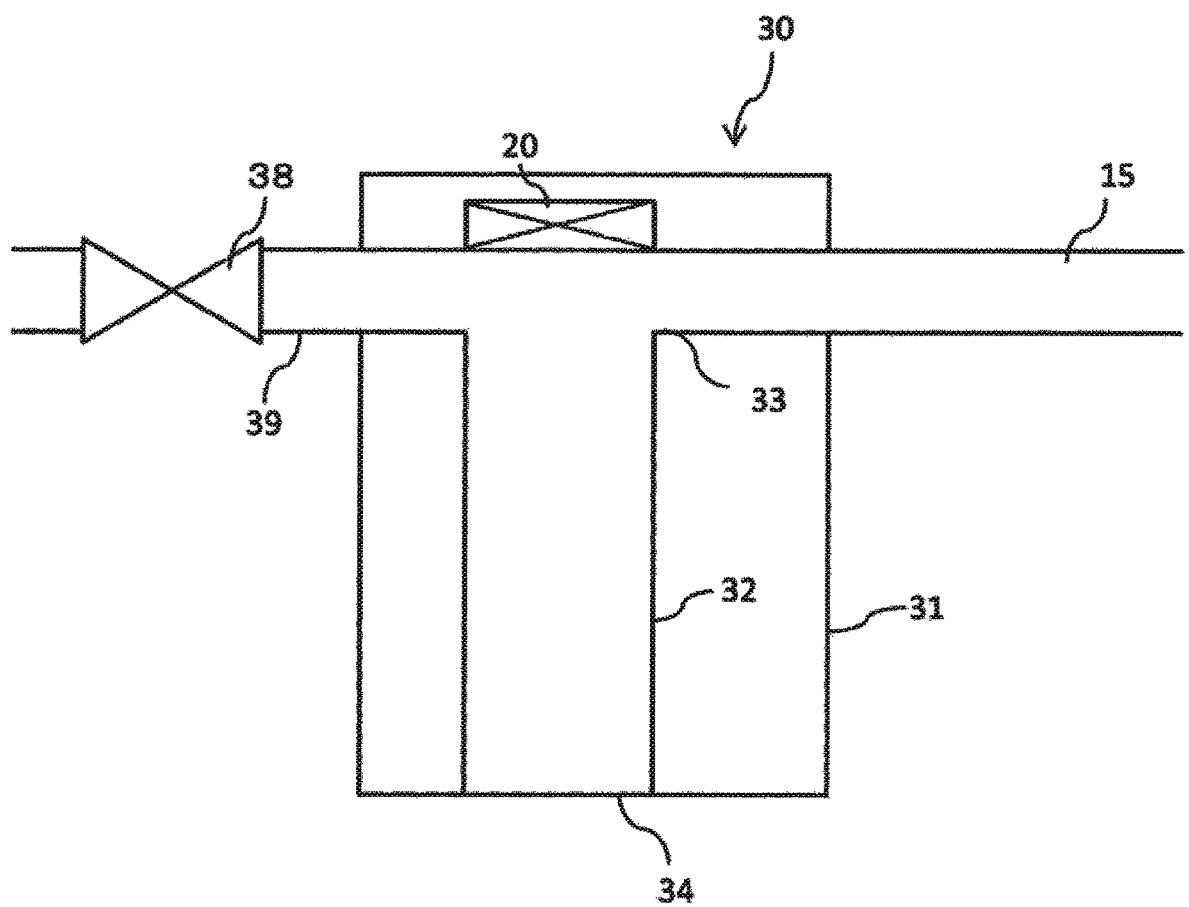
FIG. 13 is a side cross-sectional view showing aspect 3 of the feeder used in the second embodiment.

In the second embodiment, there is provided a guide pipe 39 into which a cleaning liquid is introduced after passing through a vibration corresponding position corresponding to a vibrator 20. As shown in FIG. 13, the guide pipe 39 may be provided with an opening/closing module 38 such as a valve. The opening/closing module 38 may be open and closed in response to a command from a controller 50. As an example, prior to supplying the cleaning liquid to a substrate W, the opening/closing module 38 may be in an open state before the cleaning liquid is supplied from the supplier 10, and the opening/closing module 38 may be in a closed state after a predetermined time (for example, 1 second to several seconds) elapses.

The cleaning liquid passing through the guide pipe 39 may be collected by a discharge liquid collector 75 (see FIGS. 2 and 3).

In the case of adopting a swinging module 40, at least a part of the guide pipe 39 may extend within a first extension 41 (see FIGS. 15 to 18).

In the second embodiment, other configurations are substantially the same as those of the first embodiment. Therefore, according to the present embodiment, it is possible to obtain the same effect as the first embodiment.

Even when the guide pipe 39 is adopted as in the present embodiment, similar to the first embodiment, the cleaning liquid supplied from the supplier 10 can efficiently pass through the vibration corresponding position. Therefore, it is possible to efficiently prevent in advance the occurrence of the state in which the vibrator 20 vibrates in the state (a so-called no-water burning state) in which no cleaning liquid is present.

In the case of adopting the discharge liquid collector 75 that collects the cleaning liquid passing through the guide pipe 39, it is advantageous in that the cleaning liquid not used to clean the substrate W can be reliably collected.

As shown in FIGS. 15 to 18, when adopting an aspect in which at least a part of the guide pipe 39 extends within the first extension 41, it is advantageous in that it is possible to efficiently use a space inside the first extension 41 and guide the cleaning liquid not used to clean the substrate W to a base side of the first extension 41.

Figure 11:
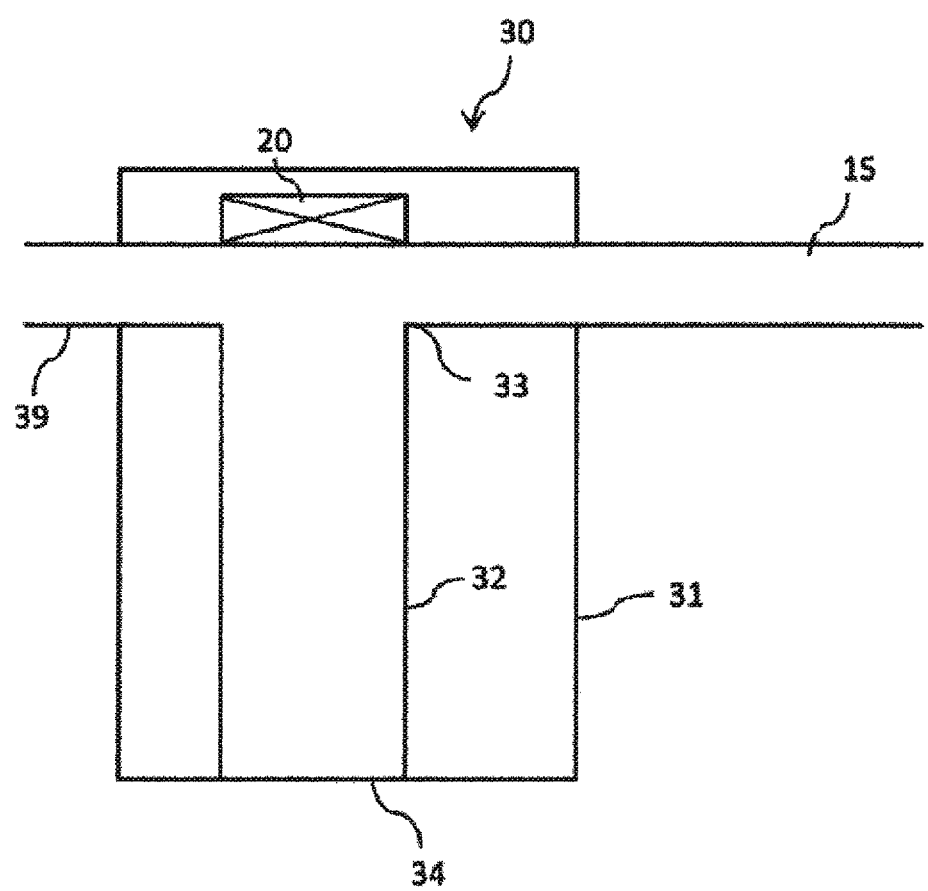
FIG. 11 is a side cross-sectional view showing aspect 1 of a feeder used in a second embodiment.
Figure 12:
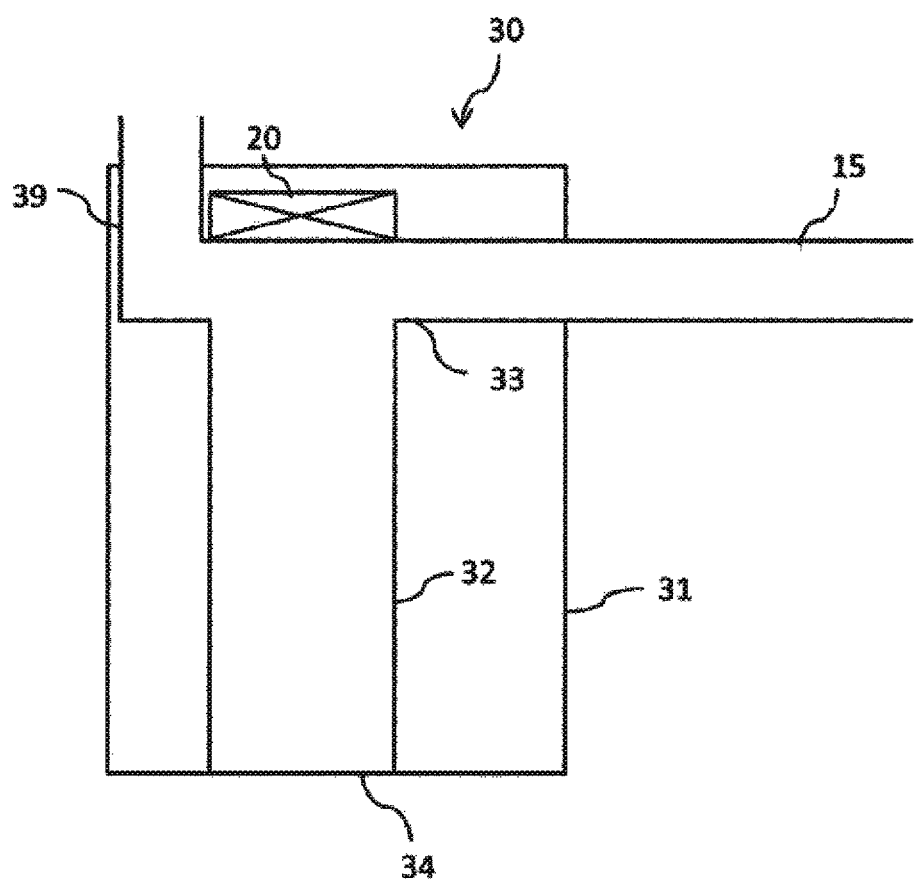
FIG. 12 is a side cross-sectional view showing aspect 2 of the feeder used in the second embodiment.

As shown in FIGS. 11 to 13, the guide pipe 39 may be provided at a position opposite to an inlet 33. That is, the guide pipe 39 may be provided at a position facing the inlet 33. In the case of adopting the aspect, the cleaning liquid introduced from the inlet 33 into a guide module 32 can be smoothly guided to the guide pipe 39.

In addition, as shown in FIGS. 11 to 13, upper ends of the supply pipe 15 and the guide pipe 39 may be provided so as to coincide with an upper end of the guide module 32. By adopting such an aspect, it is possible to smoothly introduce the cleaning liquid introduced from the supply pipe 15 into the guide pipe 39 at the vibration corresponding position corresponding to the vibrator 20. Therefore, it is possible to more efficiently prevent the occurrence of the state in which the vibrator 20 vibrates in the state (a so-called no-water burning state) in which no cleaning liquid is present.

As shown in FIGS. 11 and 13, the guide pipe 39 may extend in parallel with a direction in which the supply pipe 15 extends, but may be bent as shown in FIG. 12. In FIG. 12, the guide pipe 39 is bent toward the opposite side (upper side in FIG. 12) to the substrate W. The present embodiment is not limited thereto, and the guide pipe 39 may be bent toward the substrate W side or the guide pipe 39 may be bent in a direction parallel to a surface direction of the substrate W. In the case of adopting the aspect in which the guide pipe 39 is bent upward, outside air such as air in a clean room moves upward along the guide pipe 39, so that it is advantageous in that the outside air such as air is difficult to be accumulated at the vibration corresponding position corresponding to the vibrator 20.

Figure 14:
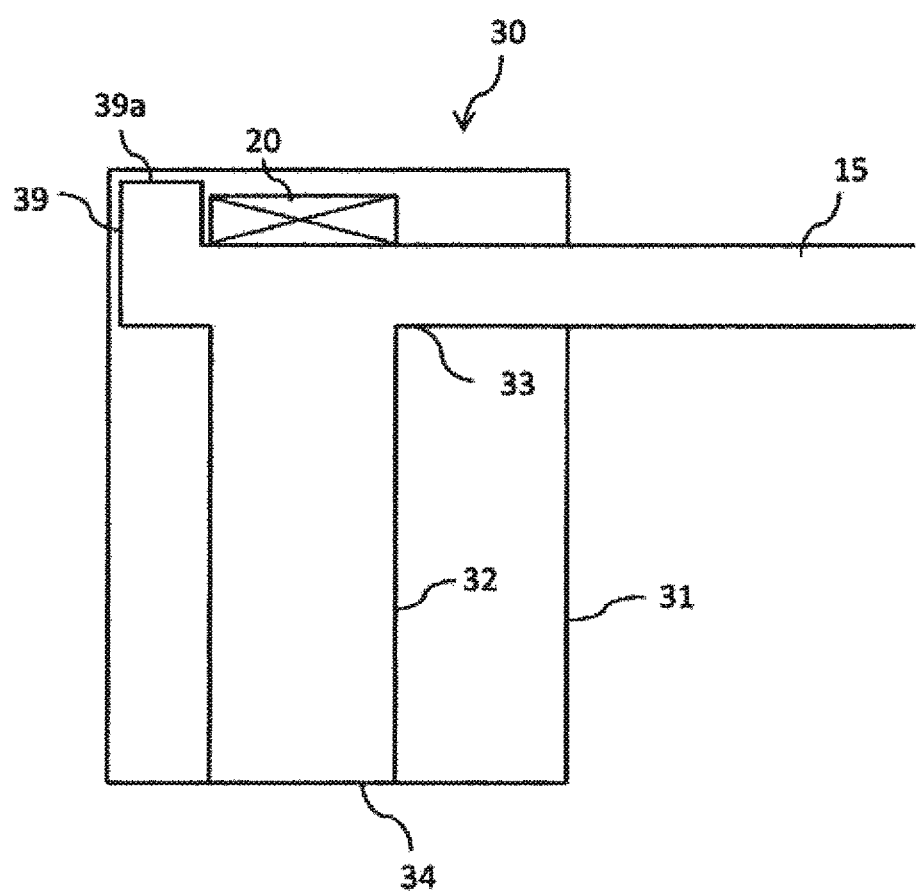
FIG. 14 is a side cross-sectional view showing aspect 4 of the feeder used in the second embodiment.

In addition, as shown in FIG. 14, the guide pipe 39 may have a termination portion 39*a* so that the cleaning liquid introduced into the guide pipe 39 may not be discharged to the outside. In the case of adopting the aspect in which the guide pipe 39 is bent upward in this aspect in which the guide pipe 39 has the termination portion 39*a*, it can be expected that outside air such as air is accumulated in the termination portion 39*a* and it is advantageous in that the outside air such as air is accumulated at the vibration corresponding position corresponding to the vibrator 20.

Figure 15:
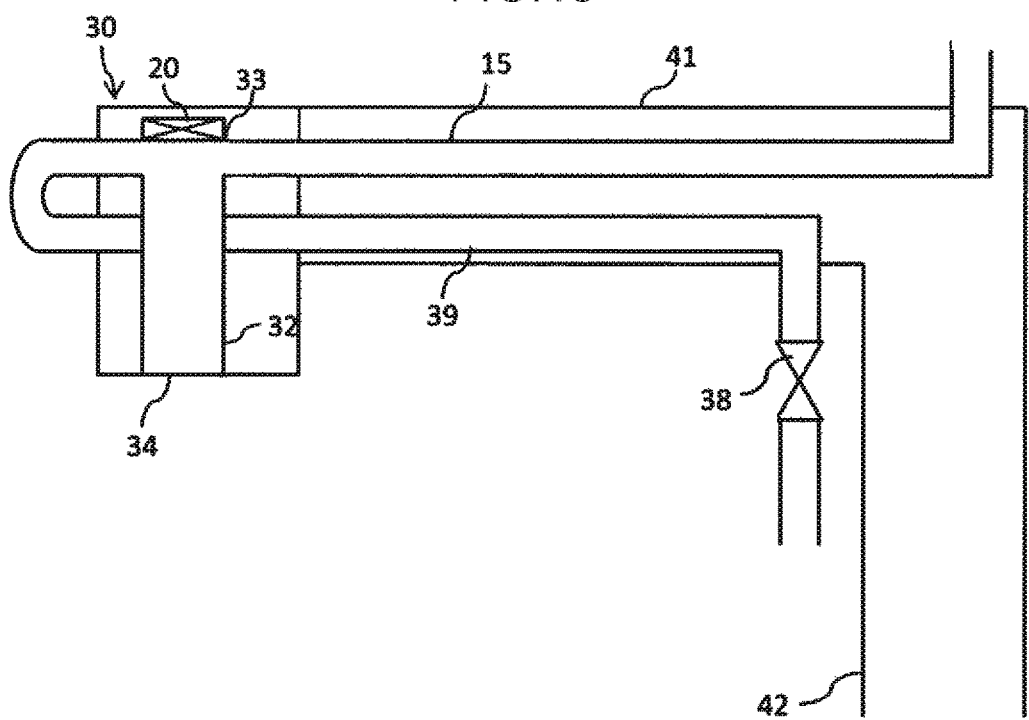
FIG. 15 is a side cross-sectional view showing aspect 5 of the feeder used in the second embodiment.

As shown in FIGS. 13 and 15, in the case of adopting the aspect in which the opening/closing module 38 such as a valve is provided, by setting the opening/closing module 38 to be in the closed state when the cleaning liquid is supplied to the substrate W, it is advantageous in that all of the cleaning liquid or almost all of the cleaning liquid supplied from the supplier 10 can be supplied to the substrate W. In addition, prior to supplying the cleaning liquid to the substrate W, by setting the opening/closing module 38 to be in the closed state, the cleaning liquid introduced into the guide pipe 39 can flow smoothly, and even if there is outside air such as air at the vibration corresponding position, it is advantageous in that the cleaning liquid can flow smoothly.

Figure 16:
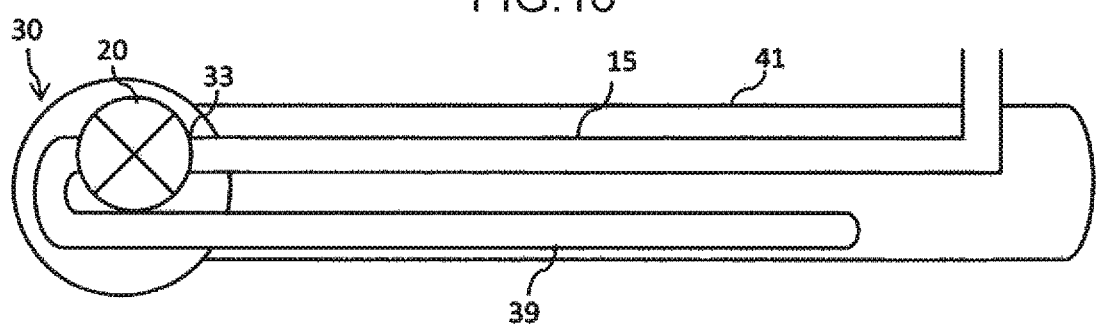
FIG. 16 is an upper plan view showing arrangement aspect 1 of a supply pipe and a guide pipe used in the second embodiment.
Figure 17:
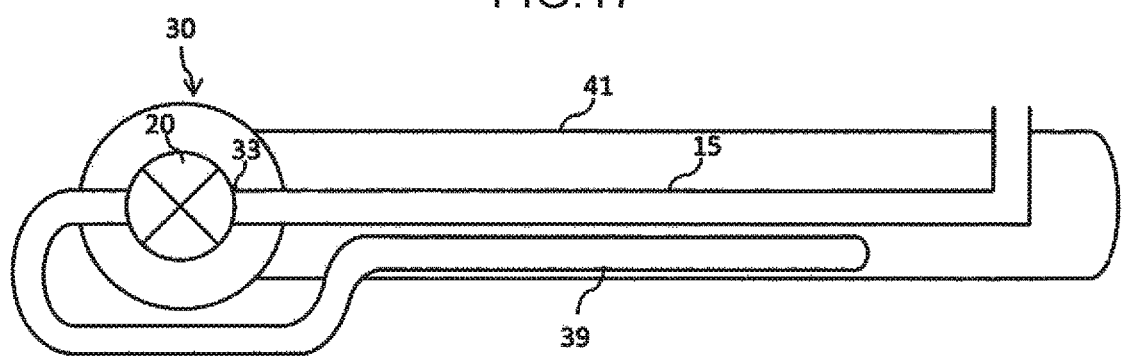
FIG. 17 is an upper plan view showing arrangement aspect 2 of the supply pipe and the guide pipe used in the second embodiment.
Figure 18:
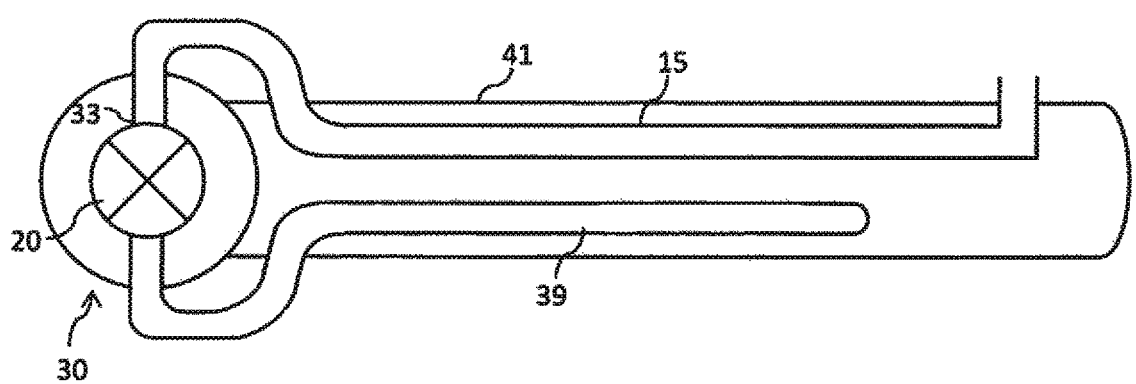
FIG. 18 is an upper plan view showing arrangement aspect 3 of the supply pipe and the guide pipe used in the second embodiment.

The arrangement of the supply pipe 15 and the guide pipe 39 can be freely changed, and as shown in FIG. 16, the guide pipe 39 may be buried in the feeder 10, as shown in FIGS. 15 and 17, apart of the guide pipe 39 may be exposed to the outside of the feeder 10, or as shown in FIG. 18, a part of the supply pipe 15 and the guide pipe 39 may be exposed to the outside.

Figure 19B:
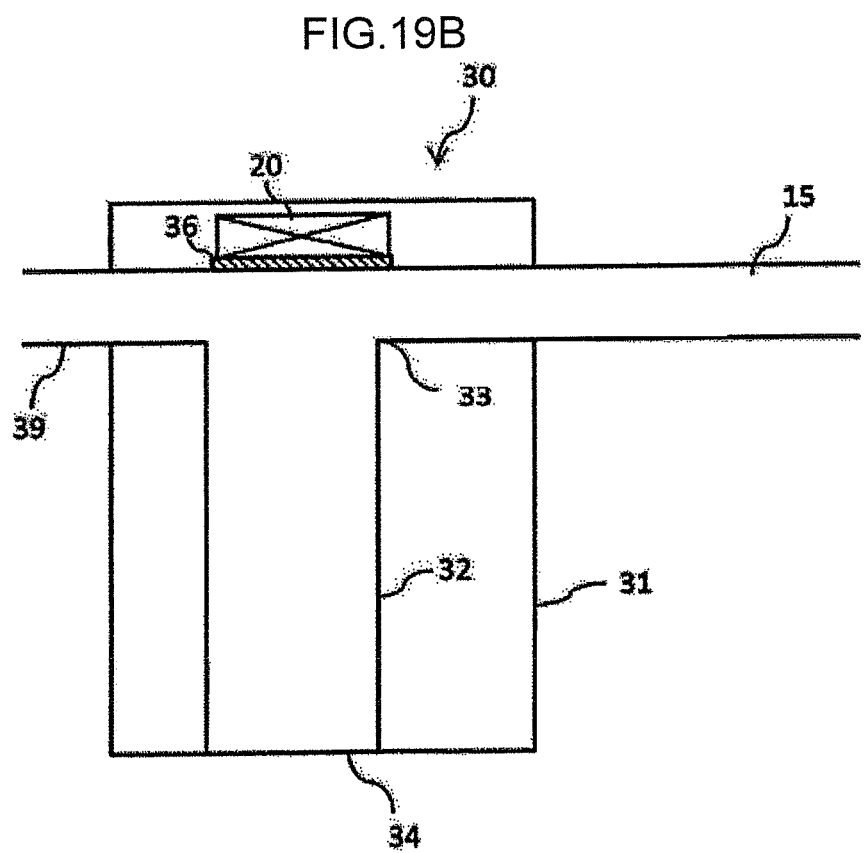
FIG. 19(b) is a side cross-sectional view showing an aspect in which a closing module used in the second embodiment is used.

As shown in FIG. 19(*b*), the closing module 36 may be used. In the case in which the closing module 36 is used, similar to those described in the first embodiment, the position facing the closing module 36 in the guide module 32 is open, and the opening is completely covered with the closing module 36.

The description of each of the above-described embodiments and the disclosure of the modifications and drawings are merely an example for explaining the invention described in the claims, and the inventions described in the claims are not limited by the description of the above-described embodiments or the disclosure of the drawings.

The aspect in which the entire surface of the substrate W is cleaned is described above, but the present embodiment is not limited thereto, and may be used for, for example, the bevel cleaning apparatus that cleans the bevel portion of the substrate W, the spin drying (SRD) apparatus mounted on the plating apparatus, and the like.

REFERENCE SIGNS LIST

10 Supplier
20 Vibrator
20a First vibrator
20b Second vibrator
30 Feeder
32 Guide module
33 Inlet
34 Outlet
35 Expander
39 Guide pipe
41 First extension
50 Controller
55 Direction changer
75 Discharge liquid collector
W Substrate Means for Solving Problems of First and Second Embodiments A substrate cleaning apparatus according to a first aspect includes
a supplier that supplies a cleaning liquid,
a feeder that supplies the cleaning liquid supplied from the supplier to a substrate, and
a vibrator that is provided in the feeder and applies an ultrasonic vibration to the cleaning liquid supplied from the supplier,
wherein the feeder includes an expander into which the cleaning liquid is introduced after passing through a vibration corresponding position corresponding to the vibrator.
In the substrate cleaning apparatus according to the first aspect,
the feeder may include an outlet that discharges the cleaning liquid to the substrate, a guide module that guides the cleaning liquid to the outlet, an inlet that introduces the cleaning liquid supplied from the supplier into the guide module, and
the expander may be at least expanded on a surface on an opposite side facing the inlet.
In the substrate cleaning apparatus according to the first aspect,
the feeder may include an outlet that discharges the cleaning liquid to the substrate, a guide module that guides the cleaning liquid to the outlet, and an inlet that introduces the cleaning liquid supplied from the supplier into the guide module, and
a surface on the inlet side may not be expanded.

A substrate cleaning apparatus according to a second aspect includes
a supplier that supplies a cleaning liquid,
a feeder that supplies the cleaning liquid supplied from the supplier to a substrate,
a vibrator that is provided in the feeder and applies an ultrasonic vibration to the cleaning liquid supplied from the supplier, and
a guide pipe into which the cleaning liquid is introduced after passing through a vibration corresponding position corresponding to the vibrator.
The substrate cleaning apparatus according to the second aspect may further include
a discharge liquid collector that collects the cleaning liquid passing through the guide pipe.
The substrate cleaning apparatus according to the second embodiment may further include
a first extension that supports the feeder and can swing about a base side,
wherein at least a part of the guide pipe may extend within the first extension.
The substrate cleaning apparatus may further include a controller that supplies the cleaning liquid from the supplier prior to supplying the cleaning liquid to the substrate.
In the substrate cleaning apparatus,
the controller may start to vibrate the vibrator after a lapse of a first period of time since the supply of the cleaning liquid from the supplier.
In the substrate cleaning apparatus,
the feeder may further include an outlet that discharges the cleaning liquid and a direction changer that directs the outlet in a direction of an opposite side of the substrate.
In the substrate cleaning apparatus,
the feeder may include an outlet that discharges the cleaning liquid to the substrate, a guide module that guides the cleaning liquid to the outlet, and an inlet that introduces the cleaning liquid supplied from the supplier into the guide module, and
the guide module may be made of a conductive resin material and connected to a ground.

Effects of First and Second Embodiments

The feeder of the present embodiment is provided with the expander or the guide pipe into which the cleaning liquid is introduced after passing through the vibration corresponding position corresponding to the vibrator. As a result, the cleaning liquid supplied from the supplier can efficiently pass through the vibration corresponding position. Therefore, it is possible to efficiently prevent in advance the occurrence of the state in which the vibrator vibrates in the state (a so-called no-water burning state) in which no cleaning liquid is present.

Third Embodiment

When ultrasonic cleaning is used, vibration is generated by ultrasonic waves, which may cause problems that are not expected in the prior art. As the example, a member contacting a cleaning liquid vibrates, and therefore fine dust or the like may occur.

Third and fourth embodiments have been made in view of these points, and it is an object of the third and fourth embodiments to provide a substrate cleaning apparatus and a substrate processing apparatus capable of preventing fine dust from occurring when a cleaning liquid to which an ultrasonic vibration is applied to a substrate such as a semiconductor wafer or the like.

In the third and fourth embodiments, new reference numerals are given to drawings, apart from the reference numerals of the preceding drawings.

<<Configuration>>

Hereinafter, a third embodiment of a substrate processing apparatus having a substrate cleaning apparatus according to an embodiment of the present invention will be described with reference to the drawings. Here, FIGS. 20 to 33 are views for explaining the embodiment of the present invention.

Figure 20:
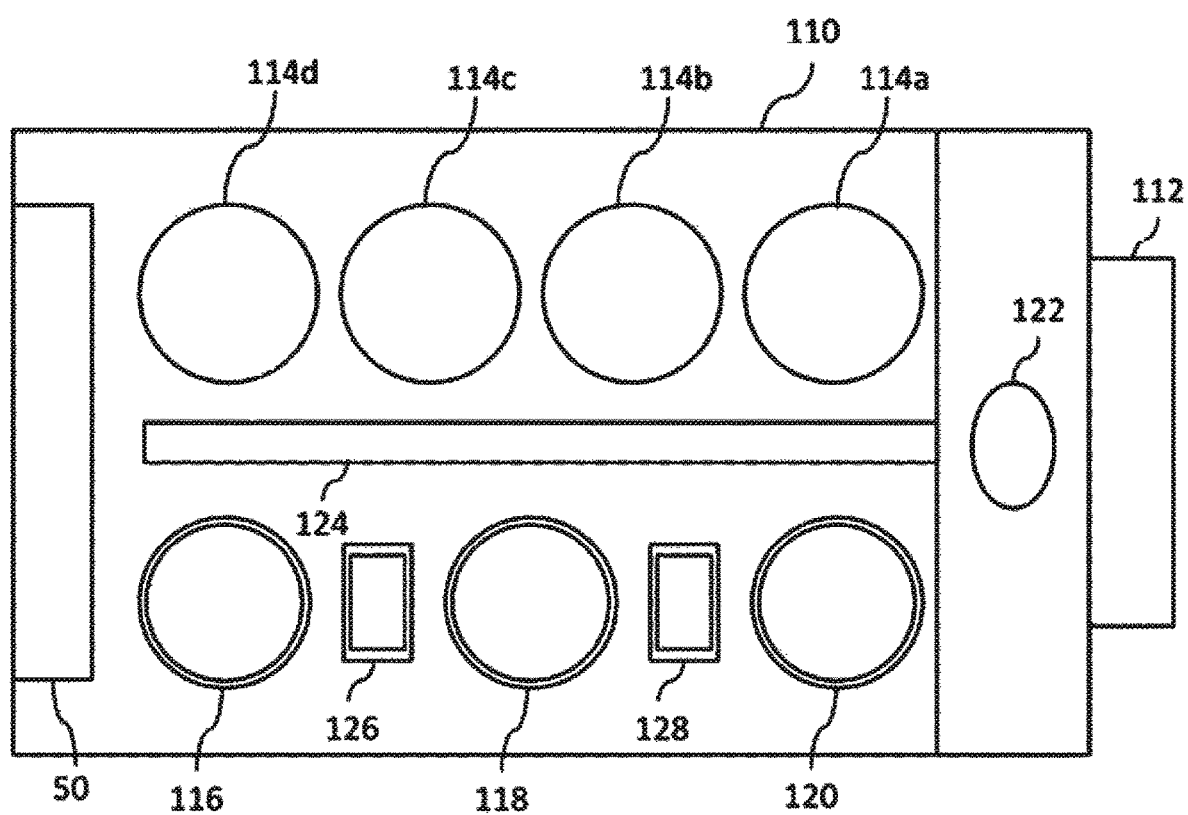
FIG. 20 is an upper plan view showing the overall configuration of a substrate processing apparatus including a substrate cleaning apparatus according to a third embodiment.

As shown in FIG. 20, the substrate processing apparatus has a substantially rectangular housing 110 and a load port 112 on which a substrate cassette for stocking a plurality of substrates W is mounted. The load port 112 is disposed adjacent to the housing 110. The load port 112 may be mounted with an open cassette, a standard mechanical interface (SMIF) pod, or a front opening unified pod (FOUP). The SMIF pod and the FOUP are airtight containers that can have a substrate cassette received therein, and be covered with partition walls to maintain an environment independent of an external space. Examples of a substrate W may include a semiconductor wafer and the like.

A plurality (four in this aspect shown in FIG. 20) of polishing units 114a to 114d, a first cleaning unit 116 and a second cleaning unit 118 that clean the polished substrate W, and a drying unit 120 that dries the cleaned substrate W are housed inside the housing 110. The polishing units 114a to 114d are arranged along a longitudinal direction of the substrate processing apparatus, and the cleaning units 116 and 118 and the drying unit 120 are also arranged along the longitudinal direction of the substrate processing apparatus. According to the substrate processing apparatus of the present embodiment, in a manufacturing process of a magnetic film in a semiconductor wafer having a diameter of 300 mm or 450 mm, a flat panel, image sensors such as a complementary metal oxide semiconductor (CMOS) or a charge coupled device (CCD), and a magneto resistive random access memory (MRAM), various substrates can be polished.

A first conveyance robot 122 is disposed in a region surrounded by the load port 112, the polishing unit 114a positioned on a side of the load port 112, and the drying unit 120. In addition, the conveying unit 124 is arranged in parallel with the polishing units 114a to 114d, the cleaning units 116 and 118, and the drying unit 120. The first conveyance robot 122 receives the substrate W before polishing from the load port 112 and conveys the substrate W to the conveying unit 124, or receives the dried substrate W, which is taken out from the drying unit 120, from the conveying unit 124.

A second conveyance robot 126 that conveys the substrate W between the first cleaning unit 116 and the second cleaning unit 118 is disposed between the first cleaning unit 116 and the second cleaning unit 118, and a third conveyance robot 128 that conveys the substrate W between the second cleaning unit 118 and the drying unit 120 is disposed between the second cleaning unit 118 and the drying unit 120.

In addition, a controller 50 that controls a movement of each device of the substrate processing apparatus is disposed inside the housing 110. The present embodiment is described based on an aspect in which the controller 50 is disposed in the housing 110, but is not limited thereto, and the controller 50 may be disposed outside the housing 110.

Figure 32:
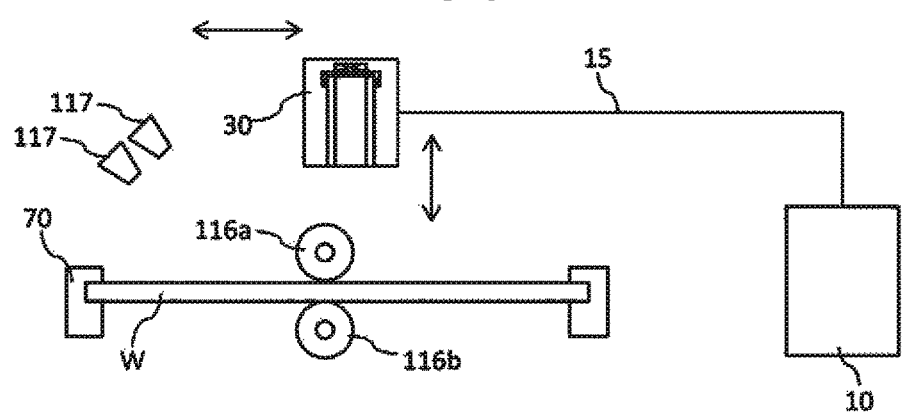
FIG. 32 is a side cross-sectional view of the substrate cleaning apparatus showing an aspect in which the feeder used in the third embodiment is used together with a roll cleaning member and a nozzle supplying a cleaning liquid.

As the first cleaning unit 116, a roll cleaning apparatus which brings roll cleaning members 116a and 116b linearly extending substantially over the whole length of a diameter of the substrate W into contact with the substrate W under the presence of the cleaning liquid to perform scrubbing cleaning on a surface of the substrate W while the roll cleaning members 116a and 116b rotating on a central axis parallel to the substrate W may be used (see FIG. 32). In addition, as the second cleaning unit 118, a pencil cleaning apparatus that brings a lower end contact surface of a columnar pencil cleaning member 118a extending in a vertical direction into contact with the substrate W under the presence of the cleaning liquid and moves the pencil cleaning member 118a in one direction while rotating the pencil cleaning member 118a to perform the scrubbing cleaning on the surface of the substrate W may be used (see FIG. 33). In addition, as the drying unit 120, a spin drying unit that dries the substrate W by jetting IPA vapor from a spray nozzle moving toward a horizontally rotating substrate W, and dries the substrate W by a centrifugal force generated by rotating the substrate W at a high speed may be used.

Figure 33:
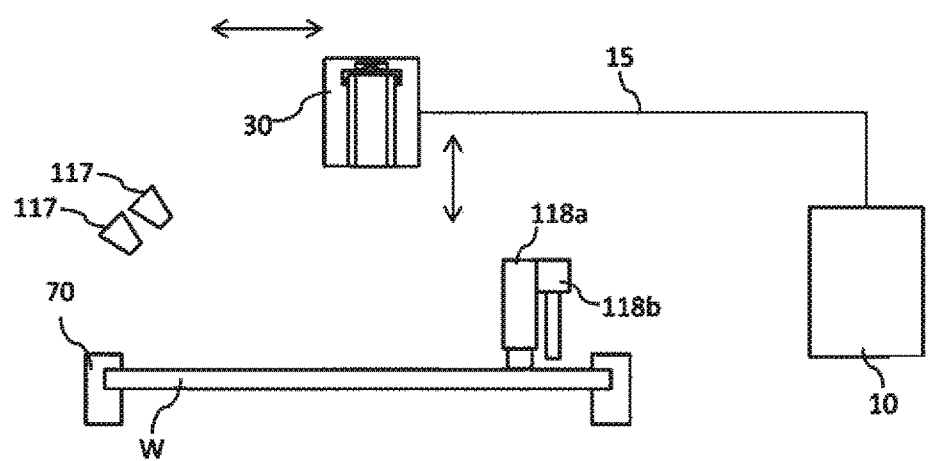
FIG. 33 is a side cross-sectional view of the substrate cleaning apparatus showing an aspect in which the feeder used in the third embodiment is used together with a pencil cleaning member, a two-fluid jet cleaner, and the nozzle supplying the cleaning liquid.

It is to be noted that instead of using the roll cleaning apparatus as the first cleaning unit 116, the pencil cleaning apparatus similar to the second cleaning unit 118 may be used, or a two-fluid jet cleaning apparatus that cleans the surface of the substrate W by two-fluid jet may be used. In addition, it should be noted that instead of using the pencil cleaning apparatus as the second cleaning unit 118, the roll cleaning apparatus similar to the first cleaning unit 116 may be used, or the two-fluid jet cleaning apparatus that cleans the surface of the substrate W by the two-fluid jet may be used. The substrate cleaning apparatus according to the embodiment of the present invention can be applied to both the first cleaning unit 116 and the second cleaning unit 118, and can be used together with the roll cleaning apparatus, the pencil cleaning apparatus, and/or the two-fluid jet cleaning apparatus. As an example, as shown in FIG. 32, a feeder 30 (described later) according to the present embodiment may also be used together with the roll cleaning members 116a and 116b that clean a first surface (upper surface in FIG. 32) and a second surface (lower surface in FIG. 32) of the substrate W and a nozzle 117 that supplies the cleaning liquid. As another example, as shown in FIG. 33, the feeder 30 according to the present embodiment may be used together with the pencil cleaning member 118a that cleans the first surface (upper surface in FIG. 33) of the substrate W, a two-fluid jet cleaner 118b, and the nozzle 117 that supplies the cleaning liquid.

The cleaning liquid of the present embodiment contains rinse liquids such as pure water (DIW) and chemical liquids such as ammonia hydrogen peroxide (SC1), hydrochloric acid hydrogen peroxide (SC2), sulfuric acid hydrogen peroxide (SPM), sulfuric acid water, and hydrofluoric acid. Unless otherwise specified in the present embodiment, the cleaning liquid means either the rinse liquid or the chemical liquid.

Figure 21:
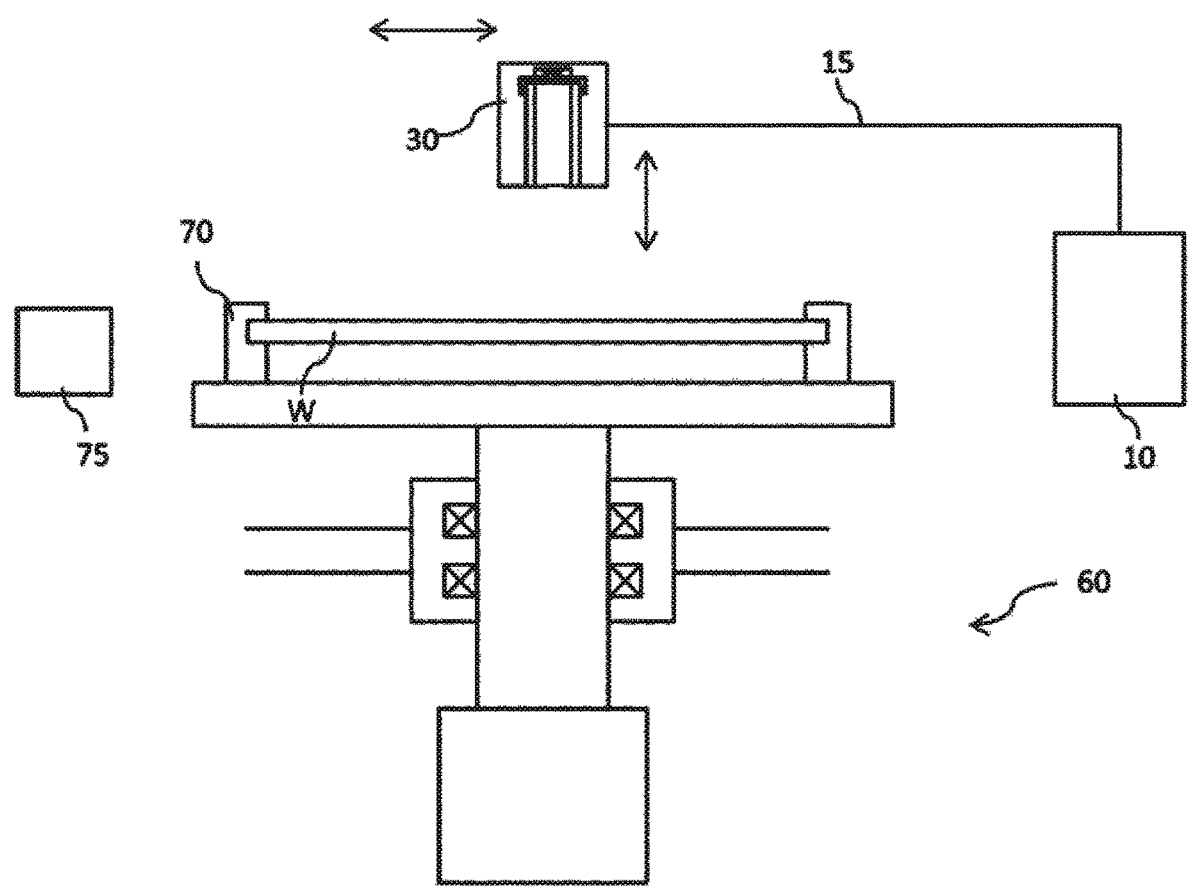
FIG. 21 is a side cross-sectional view of the substrate cleaning apparatus according to the third embodiment.

As shown in FIG. 21, the substrate cleaning apparatus according to the embodiment of the present invention includes a substrate support 70 such as a chuck that supports (holds) the substrate W and a rotator 60 that rotates the substrate W supported by the substrate support 70. The substrate support 70 and the rotator 60 constitute a substrate rotating mechanism. In this aspect shown in FIG. 21, only two substrate supports 70 are shown, but when viewed from above, in the present embodiment, four substrate supports 70 are disposed equally (at an angle of 90° centered on a rotation center). It should be noted that the number of the substrate supports is enough to be able to stably support the substrate W, and may be three, for example. It is to be noted that as the substrate support 70 that supports the substrate W, a spindle or the like can also be used. In the case of using such a spindle, the substrate W is supported while being rotated, and the spindle also serves as the rotator. FIG. 21 shows an example, in which the substrate W is supported in a horizontal direction, but the present invention is not limited to this example, and for example, the substrate support 70 may be configured to support the substrate W in a longitudinal direction (vertical direction). A rotation direction or a rotation speed of the substrate W is controlled by the controller 50. The rotation speed of the substrate W may be constant or variable.

To prevent the cleaning liquid or the ultrasonic cleaning liquid from scattering, a rotating cup (not shown) that is provided on an outside of the substrate support 70, covers a periphery of the substrate W, and rotates in synchronization with the substrate W may be provided.

As shown in FIG. 21, the substrate cleaning apparatus has the supplier 10 that supplies a cleaning liquid. As shown in FIGS. 22 to 28, the substrate cleaning apparatus includes the vibrator 20 that applies the ultrasonic vibration to the cleaning liquid supplied from the supplier 10 and the feeder 30 that supplies the cleaning liquid supplied from the supplier 10 from an outlet 34 to the substrate W.

The feeder 30 shown in FIGS. 22 to 28 has a main body module 48, an inlet 33 into which the cleaning liquid supplied from the supplier 10 is introduced, and a first guide module 31 that guides the cleaning liquid introduced from the inlet 33 to the outlet 34 via a first guide path 31a and has an opening module 35 (positioned at an upper end in FIGS. 22 to 28) different from the inlet 33 and the outlet 34, a seal module 45 formed of an O-ring or the like that is provided at an outside of a periphery of at least a part of the first guide path 31a via the first guide module 31, and a closing module 40 that covers the opening module 35 and comes into contact with the seal module 45.

As shown in FIG. 21, the feeder 30 is connected to the supplier 10 via the supply pipe 15 (specifically, the opening module of the feeder 30 and the supply pipe 15 are connected to each other, but a detailed configuration of these connection portions is omitted in FIG. 21). The supply pipe 15 may have plasticity and may be configured to follow the movement of the feeder 30 when the feeder 30 moves as described below. The closing module 40 may be formed from a material including Ta, quartz, polytetrafluoroethylene (PFA) or sapphire, and more specifically, the closing module 40 is formed from Ta, quartz, PFA or sapphire.

Figure 30:
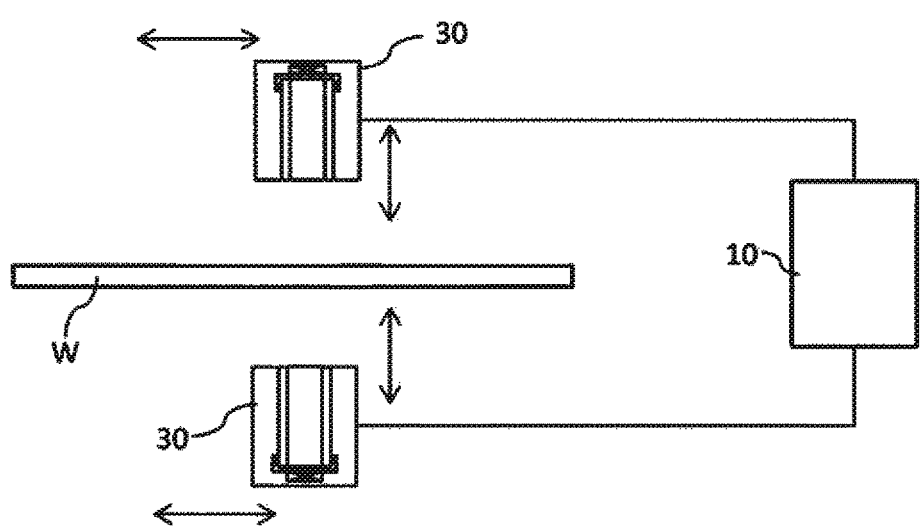
FIG. 30 is a side cross-sectional view of the substrate cleaning apparatus showing an aspect in which the two feeders used in the third embodiment are provided.
Figure 31:
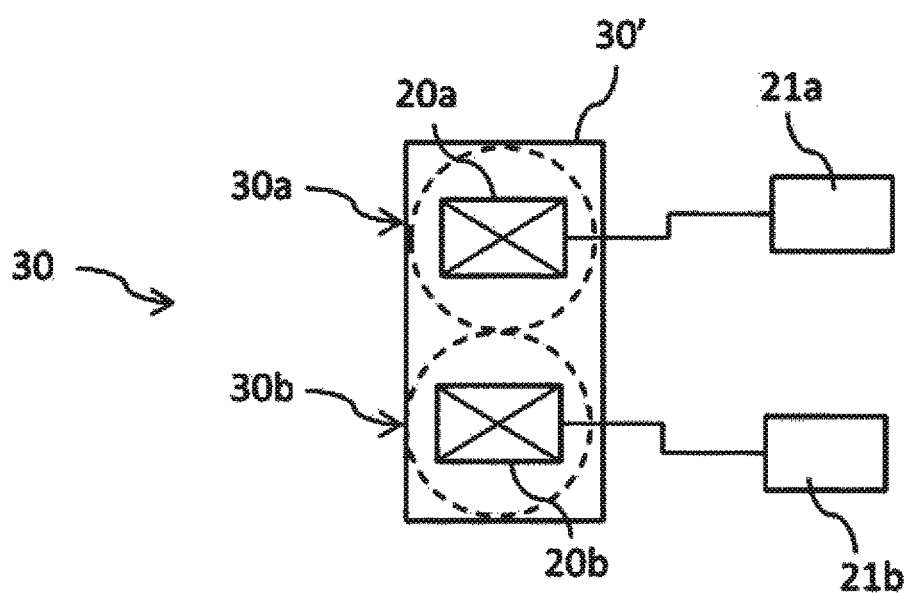
FIG. 31 is an upper plan view of the feeder showing an aspect in which two swinging modules used in the third embodiment are provided.

The present embodiment is described using an aspect in which only one feeder 30 is mainly used, but is not limited thereto, and a plurality of feeders 30 may be provided (see FIGS. 30 and 31).

The ultrasonic vibration generated by the vibrator 20 is applied to the cleaning liquid via the closing module 40 and/or the first guide module 31. In this aspect shown in FIGS. 22 to 27, the vibrator 20 is provided in contact with the closing module 40, and the ultrasonic vibration generated by the vibrator 20 is applied to the cleaning liquid via the closing module 40. The present embodiment is not limited to such an aspect, and as shown in FIG. 28, the vibrator 20 is provided in contact with the first guide module 31, and the ultrasonic vibration generated by the vibrator 20 may be applied to the cleaning liquid via the first guide module 31. From the viewpoint of efficiently transmitting the ultrasonic vibration by the cleaning liquid, it is advantageous in that the vibrator 20 is disposed adjacent to the closing module 40, and in particular, it is advantageous in that the vibrator 20 is provided adjacent to the closing module 40 and the closing module 40 is made of quartz or sapphire.

Figure 22:
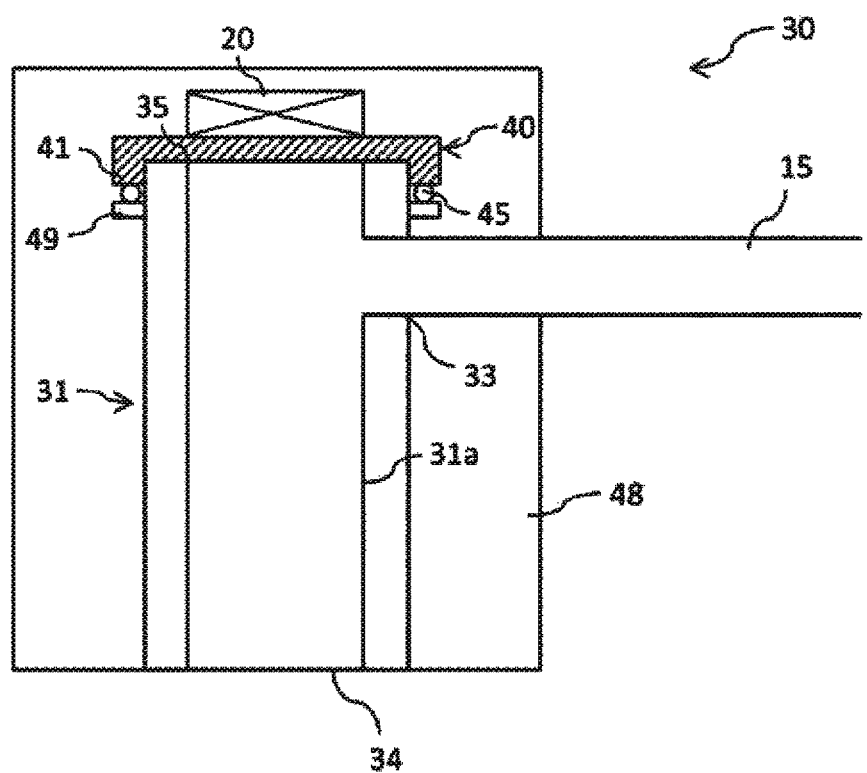
FIG. 22 is a side cross-sectional view showing aspect 1 of a feeder used in the third embodiment.

As shown in FIG. 22, the closing module 40 may have a first protrusion 41 that protrudes toward the substrate W side (lower side in FIG. 22) at the outside of the periphery of the first guide module 31. The seal module 45 may be sandwiched between an end portion of the first protrusion 41 and the main body module 48. More specifically, as shown in FIG. 22, the main body module 48 has a clamping member 49, and the seal module 45 is sandwiched between the end portion of the first protrusion 41 and the clamping member 49.

Figure 23:
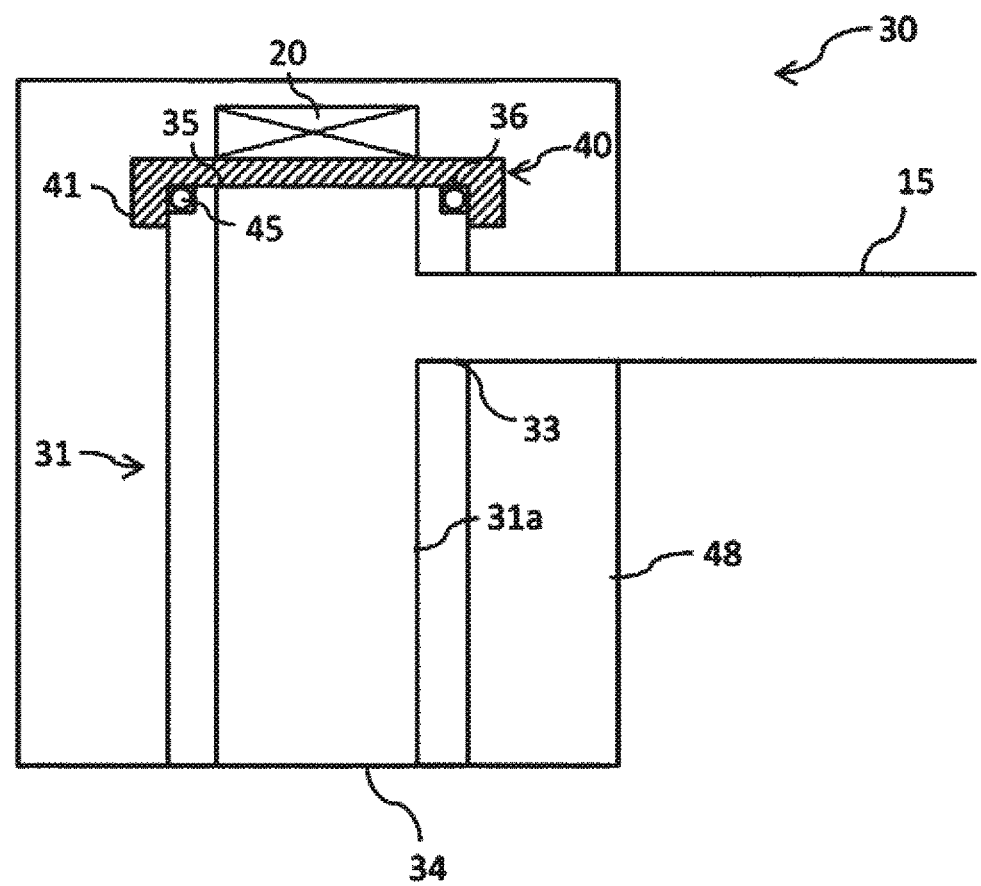
FIG. 23 is a side cross-sectional view showing aspect 2 of the feeder used in the third embodiment.
Figure 24:
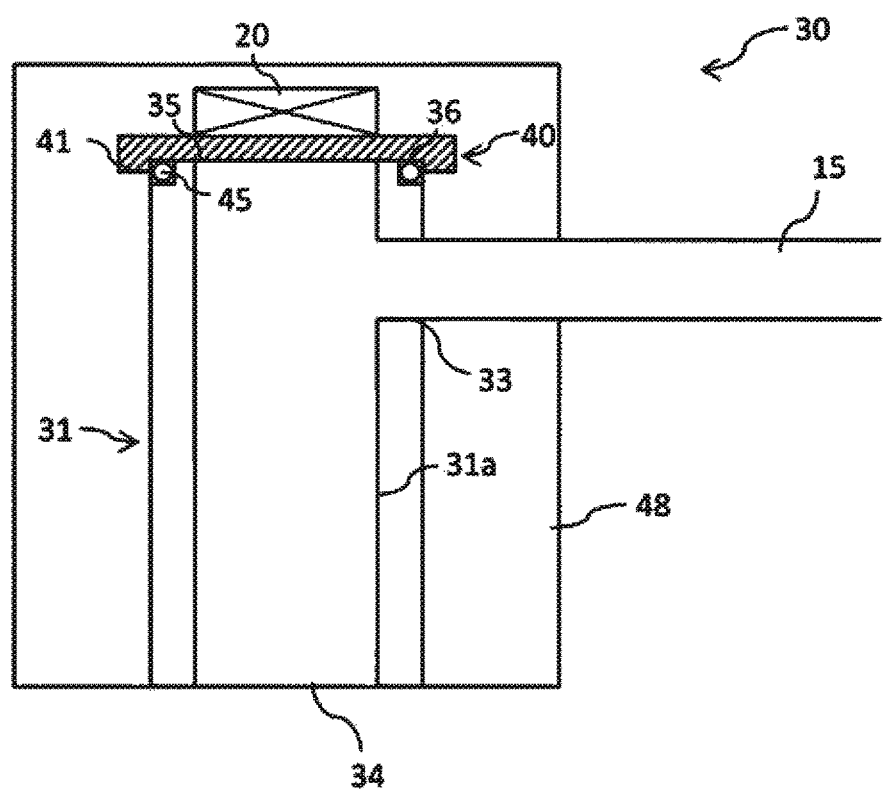
FIG. 24 is a side cross-sectional view showing aspect 3 of the feeder used in the third embodiment.

In addition, as shown in FIGS. 23 and 24, the first guide module 31 may have a cutout 36 at the end portion of the opposite side (the lower side in FIG. 22) to the substrate W. In this case, the seal module 45 is positioned in the cutout 36, and the seal module 45 may be provided at the outside of the peripheral edge of at least a part of the first guide path 31a via the first guide module 31. In this aspect, as shown in FIG. 23, the closing module 40 may cover the entire cutout 36, and as shown in FIG. 24, the closing module 40 may cover a part of the cutout 36.

As shown in FIGS. 25 and 26, the first guide module 31 may have a recess 37 at the end portion of the opposite side to the substrate W. In this case, the seal module 45 is positioned in the recess 37, and the seal module 45 may be provided at the outside of the periphery of at least a part of the first guide path 31a via the first guide module 31. In this aspect, as shown in FIG. 25, the closing module 40 is provided on an end face (upper end surface in FIG. 25) of the first guide module 31, and may not have the first protrusion 41 that protrudes outwardly from the periphery of the first guide module 31, and as shown in FIG. 26, the closing module 40 may have the first protrusion 41 that protrudes outwardly from the periphery of the first guide module 31.

As shown in FIG. 27, the first guide module 31 may have the recess 37 on a side surface on the opposite side to the substrate W. In this case, the seal module 45 is positioned in the recess 37, and the seal module 45 may be provided at the outside of the periphery of at least a part of the first guide path 31a via the first guide module 31. In this aspect, the closing module 40 has the first protrusion 41 that protrudes from the outside of the periphery of the first guide module 31 toward the substrate W, and the seal module 45 may be positioned at an inside of the periphery of the first protrusion 41. Here, the "side surface on the opposite side" means the opposite side (upper side in FIG. 27) to the substrate W rather than the inlet 33, and in the aspect in which the inlet 33 is not provided on the side surface, means the opposite side (upper side in FIG. 27) of the substrate W rather than a center of a longitudinal direction of the first guide module 31.

As the material of the first guide module 31, for example, quartz, stainless steel, sapphire, PFA, or the like can be used. In particular, the quartz and the sapphire are materials that make the attenuation of the ultrasonic vibration difficult. Therefore, it is possible to prevent the ultrasonic vibration applied to the cleaning liquid from being attenuated by using such quartz or sapphire.

Figures 29A, 29B, 29C:
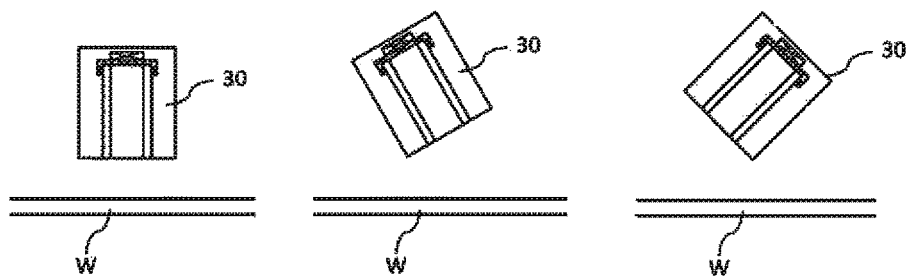
FIG. 29 is a view showing an aspect in which the feeder used in the third embodiment is inclined with respect to the substrate.

As shown in FIGS. 29(*a*) to 29(*c*), the feeder 30 can be inclined with respect to the substrate W, and the angle of the outlet 34 with respect to the substrate W may be freely changed. For example, when it is desired to store the cleaning liquid on the substrate W, the feeder 30 may be inclined with respect to the substrate W at an angle at which the cleaning liquid is supplied toward the opposite side to the rotation direction of the substrate W. On the other hand, for example, when it is desired to supply the cleaning liquid to the substrate W without adding a resistance, the feeder 30 may be inclined with respect to the substrate W at an angle at which the cleaning liquid is supplied along the rotation direction of the substrate W. It is to be noted that the angle of the feeder 30 with respect to the substrate W may be changed manually or may be changed automatically in response to receiving a signal from the controller 50. In the case in which the angle is automatically changed in response to receiving the signal from the controller 50, the angle held by the feeder 30 may be sequentially changed according to a recipe.

As shown in FIG. 30, two or more feeders 30 may be provided, and may be provided to supply the cleaning liquid to both the front and rear surfaces of the substrate W.

The controller 50 shown in FIG. 20 controls a moving speed of the feeder 30 to be slower when the feeder 30 cleans a peripheral side region of the substrate W than when the feeder 30 cleans a central side region of the substrate W. The "central side region" in the present embodiment is used in comparison with the "peripheral side region" and means a region located on the center side of the substrate W compared with the "peripheral side region".

Further, the controller 50 may start to vibrate the vibrator 20 after the lapse of the first period of time since the supply of the cleaning liquid from the supplier 10. In addition, the controller 50 may start to supply the cleaning liquid from the outlet 34 to the substrate W after a lapse of a second period of time longer than the first period of time after the cleaning liquid is supplied from the supplier 10. At this time, the cleaning liquid may be continuously supplied after the lapse of the first period of time since the supply of the cleaning liquid from the supplier 10, the feeder 30 may start to move after a lapse of a third period of time longer than the first period of time and shorter than the second period of time, and the cleaning liquid may be supplied to the peripheral portion of the substrate W after the lapse of the second period of time since the supply of the cleaning liquid from the supplier 10. Thereafter, in this aspect, the cleaning liquid continues to be supplied from the peripheral portion toward the central portion of the substrate W. Unlike this aspect, the supply of the cleaning liquid from the supplier 10 stops while the outlet 34 moves from the peripheral portion to the upper side of the central portion of the substrate W, and the cleaning liquid is discharged again from the outlet 34 after the outlet 34 is positioned above the central portion of the substrate W (after the lapse of the second period of time), and the cleaning liquid may be supplied to the central portion of the substrate W. While the substrate W is being cleaned, the second extension 22 may move from the central portion toward the peripheral portion of the substrate W, or conversely, the second extension 22 may move from the peripheral portion toward the central portion of the substrate W, and such movement may be repeatedly performed.

When the cleaning liquid is supplied to the substrate W, the ultrasonic vibration is not necessarily always applied to the cleaning liquid. In the case in which the ultrasonic vibration is not applied to the cleaning liquid as in a process for forming a film of the cleaning liquid on the upper surface of the substrate W or the like, the cleaning liquid may be discharged from the outlet 34 prior to being supplied to the substrate W without performing the ultrasonic vibration.

As shown in FIG. 21, the substrate cleaning apparatus may further include a discharge liquid collector 75 that collects the cleaning liquid discharged from the outlet 34 at a standby position when the feeder 30 is at the standby position. The cleaning liquid discharged downwardly from the outlet 34 of the feeder is supplied to the opening module provided above the discharge liquid collector 75 and collected. The discharge liquid collector 75 is connected to a drainage collector (not shown), and the cleaning liquid collected by the discharge liquid collector 75 is supplied to the drainage collector to be subjected to drainage treatment.

As shown by double-headed arrows in FIG. 21, the feeder 30 may move not only in a plane direction (horizontal direction in FIG. 21) of the substrate W but also in a normal direction (vertical direction in FIG. 21) of the substrate W. In this case, when the cleaning liquid is supplied to the substrate W, the feeder 30 may be positioned at the proximity position, and when the cleaning liquid is not supplied to the substrate W, the feeder 30 may be positioned at the separation position. It is to be noted that the "separation position" means a position far from the substrate W in the normal direction of the substrate W as compared with the "proximity position", and conversely, the "proximity position" means a position near the substrate W in the normal direction of the substrate W as compared with the "separation position". The feeder 30 is connected to the actuator (not shown) and may be positioned at the proximity position and the separation position by the actuator.

It should be noted that the substrate support 70 can move in the vertical direction so that the substrate W may take the "separation position" and the "proximity position" with respect to the feeder 30, and both of the feeder 30 and the substrate support 70 can move in the vertical direction and both of the substrate W and the feeder 30 may be positioned appropriately so that the substrate W may take the "separation position" and the "proximity position".

In particular, in the case in which the first guide module 31 is made of a material such as quartz which is difficult to attenuate the ultrasonic vibration, when the aspect in which the feeder 30 is positioned at the proximity position prior to supplying the cleaning liquid to the substrate W is adopted, the first guide module 31 made of a material which makes attenuation of the ultrasonic vibration difficult guides the cleaning liquid to a position close to the substrate W when the cleaning liquid is supplied to the substrate W, thereby supplying the cleaning liquid to the substrate W.

In addition, when the process of supplying the cleaning liquid to the substrate W ends, the feeder 30 may be positioned at the separation position. By positioning the feeder 30 at the separation position as described above, it is possible to prevent the cleaning liquid and other liquids from adhering to the feeder 30 or the supply pipe 15 in an unexpected form.

In addition, when the process of supplying the cleaning liquid to the substrate W ends, the feeder 30 may be positioned at the standby position. The feeder 30 may be positioned at the separation position in the standby position. The standby position means, for example, a position at which the feeder 30 is not positioned in the normal direction of the substrate W, and in this aspect in which the substrate W is disposed so as to extend along the horizontal direction, means that the feeder 30 is not positioned in the vertical direction of the substrate W. Examples of the standby position may include a position at which the cleaning liquid can be discharged to the discharge liquid collector 75 described above.

Prior to supplying the cleaning liquid to the substrate W, in the case of supplying the cleaning liquid from the supplier 10 and discharging the cleaning liquid from the outlet 34 at the standby position toward, for example, the discharge liquid collector 75, the cleaning liquid is positioned at the proximity position. By positioning in the proximity position, it is possible to prevent the discharged cleaning liquid from being scattered inadvertently.

The feeder 30 may be positioned at the separation position (upper position) in the standby position, positioned in the proximity position (lower position) in the standby position, and then may move above the substrate W. By positioning the feeder 30 at the separation position in the standby position, it is possible to more reliably prevent the cleaning liquid and other liquids from adhering to the feeder 30 in an unexpected form. In addition, by moving the feeder 30 above the substrate W after being positioned at the proximity position (lower position) in the standby position, when the feeder 30 moves above the substrate W, the cleaning liquid can be supplied at the position adjacent to the substrate W and the substrate W can be efficiently cleaned.

In addition, the feeder 30 is positioned at the separation position (upper position) in the standby position, and in that state, moves above the substrate W, and after the outlet 34 is positioned at the center of the substrate W, the feeder 30 may be positioned at the proximity position (lower position). According to this aspect, it can be expected that the cleaning liquid, other liquids and the like in the previous process can be prevented from adhering to the feeder 30 when the feeder 30 moves above the substrate W.

<<Action and Effect>>

Next, actions and effects according to the present embodiment having the above-described configuration will be described based on those not yet explained.

As shown in FIGS. 22 to 28, in the present embodiment, the seal module 45 is provided at the outside of the periphery of at least a part of the first guide path 31a via the first guide module 31, and the closing module 40 covers the opening module 35 and comes into contact with the seal module 45. When the ultrasonic vibration is applied to the cleaning liquid, there is a possibility that fine dust or the like is scattered from the seal module 45 by the ultrasonic vibration (a part of the seal module 45 is peeled off due to the ultrasonic vibration to be dust), but by adopting this aspect, even if fine dust or the like temporarily occurs from the seal module 45, since the dust or the like is hardly mixed with the cleaning liquid in the first guide path 31a, it is possible to prevent the dust or the like from being supplied to the substrate W. Since the closing module 40 is made of a material having high strength as compared with the seal module 45, it is difficult to generate dust due to the peeling off of a part of the closing module 40 by the ultrasonic vibration.

As shown in FIG. 22, in the case of adopting the aspect in which the closing module 40 has the first protrusion 41 that protrudes from the peripheral edge toward the substrate W, the end portion of the first protrusion 41 is positioned at the outside of the periphery of the first guide module 31, and the seal module 45 is sandwiched between the end portion of the first protrusion 41 and the clamping member 49 of the main body module 48, even if the cleaning liquid reaches the seal module 45 along the closing module 40, since the seal module 45 is positioned at the outside of the periphery of the first guide module 31, the dust generated from the seal module 45 is unlikely to leak into the cleaning liquid in the first guide module 31. As a result, it is possible to more reliably prevent dust from being mixed with the cleaning liquid.

In particular, as shown in FIG. 22, when the vibrator 20 is disposed adjacent to the closing module 40 and the closing module 40 vibrates, since the cleaning liquid may reach the outside of the periphery of the first guide module 31 from the gap formed between the closing module 40 and the first guide module 31, as described above, it is in particular advantageous to adopt the aspect in which the end portion of the first protrusion 41 is positioned at the outside of the periphery of the first guide module 31 and the seal module 45 is sandwiched between the end portion of the first protrusion 41 and the main body module 48.

As shown in FIGS. 23 and 24, even in the case of adopting the aspect in which the first guide module 31 has the cutout 36 at the end portion of the opposite side to the substrate W, the seal module 45 is positioned in the cutout 36, and the seal module 45 is provided at the outside of the periphery of at least a part of the first guide path 31a via the first guide module 31, even if the cleaning liquid reaches the seal module 45 through the closing module 40, since the seal module 45 is positioned at the outside of the periphery of the first guide module 31, the dust generated from the seal module 45 is unlikely to leak into the cleaning liquid in the first guide module 31. However, in this aspect, since the distance between the cleaning liquid guided through the first guide path 31a and the seal module 45 is short and the seal module 45 is provided at the upper end of the first guide module 31, as shown in FIG. 22, it is advantageous in that dust is hardly mixed with the cleaning liquid.

As shown in FIGS. 25 and 26, even in the case of adopting the aspect in which the first guide module 31 has the recess 37 at the end portion of the opposite side to the substrate W, the seal module 45 is positioned in the recess 37, and the seal module 45 is provided at the outside of the periphery of at least a part of the first guide path 31a via the first guide module 31, even if the cleaning liquid reaches the seal module 45 along the closing module 40, since the seal module 45 is positioned at the outside of the periphery of the first guide module 31, the dust generated from the seal module 45 is unlikely to leak into the cleaning liquid in the first guide module 31. However, even in this aspect, since the distance between the cleaning liquid guided through the first guide path 31a and the seal module 45 is short and the seal module 45 is provided at the upper end of the first guide module 31, as shown in FIG. 22, it is advantageous in that dust is hardly mixed with the cleaning liquid.

As shown in FIG. 27, even in the case of adopting the aspect in which the first guide module 31 has the recess 37 on the side surface of the opposite side to the substrate W, the seal module 45 is positioned in the recess 37, and the seal module 45 is provided at the outside of the periphery of at least a part of the first guide path 31a via the first guide module 31, even if the cleaning liquid reaches the seal module 45 along the closing module 40, since the seal module 45 is positioned at the outside of the periphery of the first guide module 31, the dust generated from the seal module 45 is unlikely to leak into the cleaning liquid in the first guide module 31. According to this aspect, similar to the aspect shown in FIG. 22, it is possible to obtain the effect that dust is hardly mixed with the cleaning liquid.

Prior to supplying the cleaning liquid to the substrate W, in the case of adopting the aspect in which the cleaning liquid is supplied from the supplier 10 and the cleaning liquid is discharged from, for example, the outlet 34 at the standby position, a cleaning liquid having a low cleaning effect due to the introduction of oxygen or the like is discharged, and a cleaning liquid having a strong cleaning effect due to the introduction of nitrogen or the like is applied with the ultrasonic vibration to be able to be used to clean the substrate W. In addition, it is possible to clean the substrate W with a cleaning liquid having a strong cleaning effect by being sufficiently applied with ultrasonic waves, instead of a cleaning liquid which is not sufficiently applied with ultrasonic waves and is not high in a cleaning effect. In addition, in the case of cleaning the substrate W with the cleaning liquid which is not sufficiently applied with ultrasonic waves due to the introduction of oxygen or the like, there is a possibility that defects may occur. However, by adopting this aspect, the occurrence of defects can be prevented in advance. In addition, the substrate W can be cleaned with the cleaning liquid having uniform detergency from the cleaning start time of the substrate W, and the substrate can be stably cleaned.

In the case of adopting the aspect in which the moving speed of the feeder 30 is slower when the outlet 34 cleans the peripheral side region of the substrate W as compared with when the outlet 34 cleans the central side region of the substrate W, it is possible to supply more cleaning liquid to the outer peripheral side of the substrate W than the inner peripheral side. Since an area to be cleaned with the cleaning liquid on the outer peripheral side of the substrate W is larger than an area to be cleaned with the cleaning liquid on the inner peripheral side of the substrate W, by adopting such an aspect, it is possible to make the amount of cleaning liquid supplied per unit area of the substrate W substantially uniform.

When a distance from the center of the substrate W to be rotated is set to be r, a length of an arc at the distance r is set to be $2\pi r$. Therefore, the moving speed of the feeder 30 may be calculated based on this $2\pi r$, and the feeder 30 may move based on the moving speed. Unlike such an aspect, simply, the moving speed of the feeder 30 may be slow continuously or intermittently while the feeder 30 moves from the central portion toward the peripheral portion of the substrate W, whereas the moving speed of the feeder 30 may be fast continuously or intermittently while the feeder 30 moves from the peripheral portion toward the central portion of the substrate W. According to such an aspect, it is advantageous in that the control is not complicated.

In the case of adopting in which the vibrator 20 starts to vibrate after the lapse of the first period of time since the supply of the cleaning liquid from the supplier 10, the vibrator 20 vibrates in the state (a so-called no-water burning state) in which no cleaning liquid is present, thereby preventing the vibrator 20 from being damaged. That is, air or the like in the first guide module 31 infiltrates into the cleaning liquid, and thus the state in which the cleaning liquid does not exist in a portion (upper end of the first guide module 31 in FIGS. 22 to 27) facing the vibrator 20 may occur. In this regard, in the case of adopting the above-described aspect, since the cleaning liquid is supplied before vibrating the vibrator 20, the vibrator 20 vibrates in the state (a so-called no-water burning state) in which no cleaning liquid is present, thereby preventing the vibrator 20 from being damaged.

As an example, the first period of time is, for example, about 0.1 seconds to 1 second. In the first period of time, it may be enough to prevent the state in which the cleaning liquid does not exist in the portion facing the vibrator 20, so it is not necessary to take a long time to do so.

When the cleaning liquid in the first guide module 31 is discharged to the discharge liquid collector 75 or the like, it may not necessary to vibrate the vibrator 20. However, it is advantageous in that the inside of the first guide module 31 is cleaned with the cleaning liquid applied with the ultrasonic vibration in advance by vibrating the vibrator 20 in advance when discharging the cleaning liquid in the first guide module 31 to the discharge liquid collector 75 or the like. In addition, by applying the ultrasonic vibration in advance, it is possible to sufficiently apply the ultrasonic vibration to the cleaning liquid in the first guide module 31 (sufficient energy can be stored) in advance, and when the substrate W is cleaned, it is possible to supply a cleaning liquid having sufficiently high detergency from the beginning.

In addition, in the case of adopting the aspect in which the cleaning liquid starts to supply from the outlet 34 to the substrate W after the cleaning liquid is supplied from the supplier 10 and then the second period of time longer than the first period of time elapses, it is possible to more reliably clean the substrate W with the cleaning liquid having the strong cleaning effect. It should be noted that the second period of time is, for example, time taken to discharge almost all of the cleaning liquid in the first guide module 31. The second period of time may be calculated from a volume in the first guide module 31 and the supply speed at which the cleaning liquid is supplied or may be experimentally derived. The second period of time is, for example, about several seconds to 5 seconds.

In the case of adopting the aspect in which the discharge liquid collector 75 that collects the cleaning liquid discharged from the outlet 34 at the standby position is provided, it is possible to reliably collect the discharged cleaning liquid not used for cleaning. As a result, the possibility that the cleaning liquid discharged from the outlet 34 splatters to become a mist and thus adversely affects the substrate W can be reduced in advance.

In addition, in the aspect in which the substrate cleaning apparatus of the present embodiment is built in a two-fluid jet cleaning apparatus that cleans the surface of the substrate W by a two-fluid mixture of liquid and gas (see FIG. 33), for example, prior to performing the two-fluid jet cleaning process, the substrate W may be cleaned by the feeder 30 of the present embodiment. According to the aspect, it is advantageous in that the two-fluid jet cleaning can be performed by floating particles adhering to the substrate W due to the cavitation effect of the cleaning liquid supplied with the ultrasonic waves. The cavitation effect is the cleaning effect using impact waves generated by bursting of air bubbles generated in the cleaning liquid by ultrasonic waves.

Modification

The vibrator 20 may be configured to apply the ultrasonic vibration to the cleaning liquid by vibrating at a first frequency and a second frequency lower than the first frequency. In addition, the vibrator 20 may be configured to apply the ultrasonic vibration to the cleaning liquid at more than three frequencies.

According to the present modification, it is possible to apply the ultrasonic vibration to the cleaning liquid at different frequencies. As a result, the detergency of the cleaning liquid can be changed depending on the applications.

One vibrator 20 may vibrate at different frequencies, but as shown in FIG. 31, the vibrator 20 may include a first vibrator 20a vibrating at the first frequency and a second vibrator 20b vibrating at the second frequency lower than the first frequency. According to the aspect, it is advantageous in that it can provide the ultrasonic vibration at different frequencies with a simple configuration.

As shown in FIG. 31, the first vibrator 20a may be electrically connected to a first transmitter 21a that transmits a signal to the first vibrator 20a. Similarly, the second vibrator 20b may be electrically connected to a second transmitter 21b that transmits a signal to the second vibrator 20b.

In an aspect shown in FIG. 31, the feeder 30 has a first feeder 30a and a second feeder 30b that are held by a casing 30'. The first feeder 30a has the first vibrator 20a that is connected to the first transmitter 21a and the second feeder 30b has the second vibrator 20b that is connected to the second transmitter 21b. In this aspect shown in FIG. 31, the casing 30' moves and thus the first feeder 30a and the second feeder 30b move, but the first feeder 30a and the second feeder 30b may move separately. Since the ultrasonic vibration is attenuated when the cleaning liquid collides with the substrate W, even if the cleaning liquid is simultaneously used at different frequencies, the effect obtained by providing different frequencies is not much changed. As a result, the cleaning liquid can be simultaneously used at different frequencies.

In this embodiment, the first frequency may be 900 kHz or more and 5 MHz or less, and the second frequency may be less than 900 kHz. When the vibrator vibrates at a frequency of 900 kHz or more, a vibration width is small, so a relatively small amount of impurities can be removed, and the effect of the cavitation can be reduced, so a load applied to the substrate W can be reduced. On the other hand, when the vibrator vibrates at a frequency of less than 900 kHz, the vibration width is large, so a relatively large amount of impurities can be removed. As the difference between the first frequency and the second frequency is small, the difference in effects is also reduced. For this reason, as an example, the difference between the first frequency and the second frequency may be about 500 kHz, for example, 950 kHz may be used as the first frequency and 430 kHz may be used as the second frequency. In addition, the present embodiment is not limited thereto, and for example, 950 kHz may be used as the first frequency and 750 kHz as the second frequency.

In the case of adopting such an aspect, when the substrate cleaning apparatus of this embodiment is used together with the pencil cleaning apparatus (see FIG. 33), (1) the ultrasonic vibration is applied to the cleaning liquid at the second frequency to clean the substrate W, (2) then, the substrate W is cleaned using the pencil cleaning member 118a, (3) and then, the ultrasonic vibration is applied to the cleaning liquid at the first frequency to clean the substrate W. According to the aspect, first of all, a large amount of impurities are removed with the cleaning liquid applied with the ultrasonic vibration at the second frequency, and then the cleaning is performed with the pencil cleaning member 118a, and finally, a small amount of impurities can be removed with the cleaning liquid applied with the ultrasonic vibration at the first frequency. For this reason, the load applied to the pencil cleaning member 118a can be reduced as compared with the prior art, and the lifespan of the pencil cleaning member 118a can be extended.

In addition, as another aspect, (1) the substrate W may be cleaned using the pencil cleaning member 118a, (1) then, the substrate W may be cleaned by applying the ultrasonic vibration to the cleaning liquid at the second frequency, (3) and then, the substrate W may be cleaned by applying the ultrasonic vibration to the cleaning liquid at the first frequency. Even in such an aspect, for the same reason as described above, the load applied to the pencil cleaning member 118a can be reduced as compared with the prior art, and the lifespan of the pencil cleaning member 118a can be extended.

Fourth Embodiment

Next, a fourth embodiment will be described.

Figure 34:
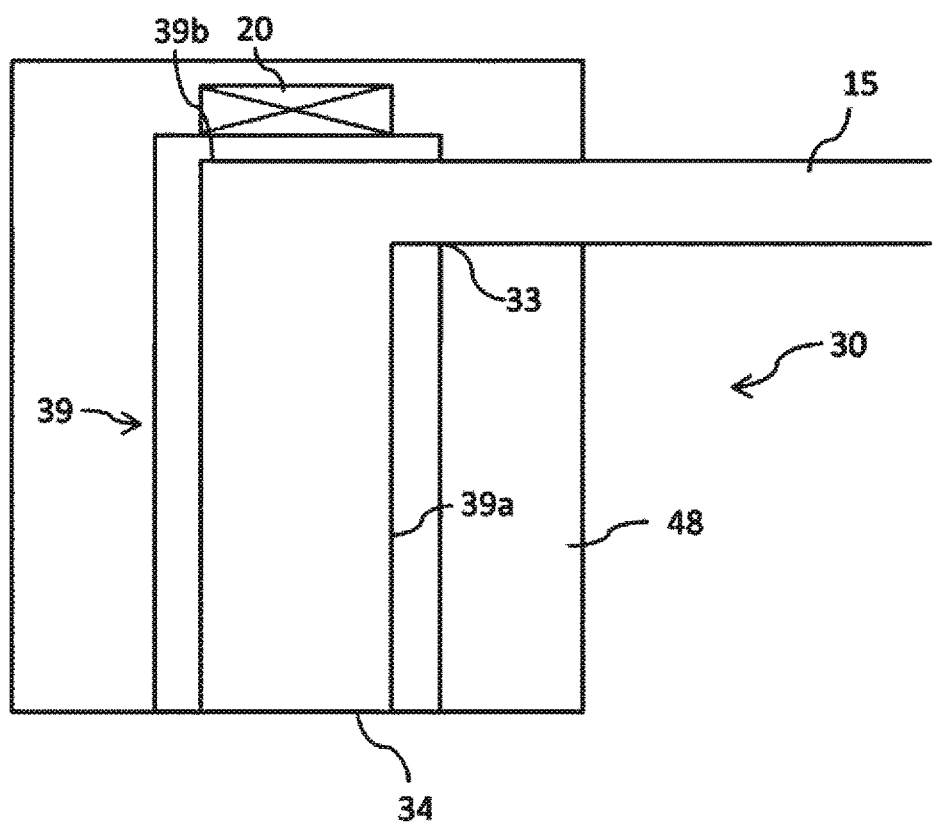
FIG. 34 is a side cross-sectional view showing a feeder used in a fourth embodiment.
Figure 35:
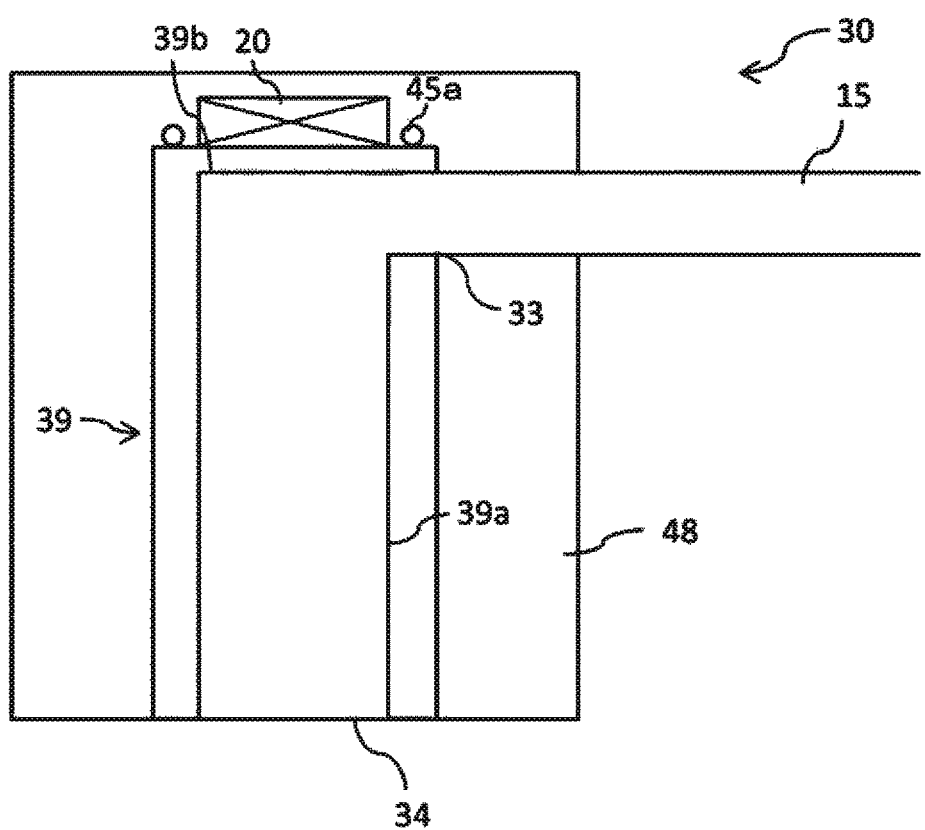
FIG. 35 is a side cross-sectional view showing a feeder used in modification 1 of the fourth embodiment.

In the fourth embodiment, as shown in FIG. 34, a feeder 30 includes a second guide module 39 including an inlet 33 into which a cleaning liquid supplied from a supplier 10 is introduced and an outlet 34 that supplies the cleaning liquid introduced from the inlet 33 to a substrate W. The second guide module 39 is not provided with the opening, except for the inlet 33 and the outlet 34. In the fourth embodiment, as in the third embodiment, a closing module 40 as a separate member which is configured to come into contact with an opening module 35 and a seal module 45 covering the opening module 35 is not provided. Instead, the second guide module 39 has an end portion 39b which closes an opposite side of the outlet 34, and the end portion 39b and a vibrator 20 are in contact with each other. The aspect in which the ultrasonic vibration generated by the vibrator 20 is applied to the cleaning liquid via the end portion 39b of the second guide module 39 is adopted. In the aspect shown in FIG. 34, since an inner surface of an upper side of a supply pipe 15 and an inner surface of the end portion 39b are at the same height, air remains in the vicinity of the end portion 39b, so it is possible to reliably prevent the cleaning liquid from being in a no-water burning state. Further, as shown in FIG. 35, a cushioning member 45a may be provided at an outside of a periphery of the vibrator 20. As the cushioning member 45a, the seal module 45 used in the third embodiment may be used.

Figure 36:
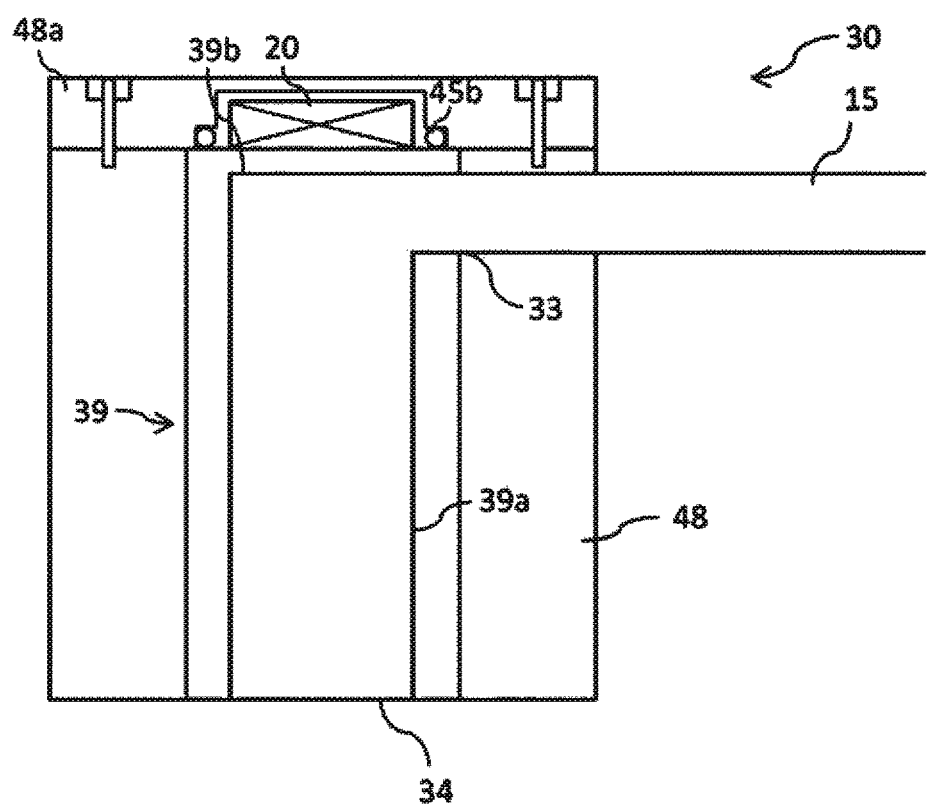
FIG. 36 is a side cross-sectional view showing a feeder used in modification 2 of the fourth embodiment.

In addition, as shown in FIG. 36, a liquid contact module may be formed as an integral structure, and the vibrator 20 may be integrally formed with bonded to a main body module 48. By pressing a lid module 48a provided separately from the main body module 48 against the main body module 48 to which the vibrator 20 is bonded, the seal module 45b such as an O-ring may be sandwiched between the lid module 48a and the main body module 48. In this aspect, the main body module 48 and the seal module 45b such as the O-ring are in contact with the outside of the periphery of the vibrator 20, a space is provided on the outer periphery of the vibrator 20, or silicon, a foaming agent or the like is provided, so it may be configured to follow spatial displacement.

The second guide module 39 of the present embodiment may be integrally molded with a material which makes the attenuation of the ultrasonic vibration difficult.

In the fourth embodiment, other configurations are substantially the same as those of the third embodiment. Therefore, according to the present embodiment, it is possible to obtain the same effect as the third embodiment.

According to the present embodiment, the second guide module 39 is not provided with the opening, except for the inlet 33 and the outlet 34. Therefore, since the seal module 45 which can come in contact with the cleaning liquid does not exist from the beginning, even if the ultrasonic vibration is applied to the cleaning liquid, fine dust derived from the seal module 45 is not supplied to the substrate by being mixed with the cleaning liquid.

In addition, in the case in which the second guide module 39 is integrally molded with a material which makes the attenuation of the ultrasonic vibration difficult, it is possible to prevent the ultrasonic vibration in the cleaning liquid from being attenuated by the second guide module 39 to the utmost and supply the cleaning liquid to the substrate W.

From the viewpoint of efficiently transmitting the ultrasonic vibration generated from the vibrator 20 to the cleaning liquid, as in the third embodiment, it is advantageous in that the closing module 40 is used and the vibrator 20 is provided adjacent to the closing module 40.

The disclosure of each of the above-described embodiments and the disclosure of the modifications and drawings are merely an example for explaining the invention described in the claims, and the inventions described in the claims are not limited by the description of the above-described embodiments or the drawings.

The aspect in which the entire surface of the substrate W of which the surface is polished is cleaned is described above, but the present embodiment is not limited thereto, and may be used for, for example, a cleaning apparatus that is mounted on a bevel polishing apparatus to clean the substrate W of which the bevel portion is polished, a cleaning apparatus that is mounted on a back side polishing apparatus to clean the substrate W of which the back side is polished, a spin drying (SRD) apparatus that is mounted on a polishing apparatus or a plating apparatus, or the like.

REFERENCE SIGNS LIST

10 Supplier
20 Vibrator
20a First vibrator
20b Second vibrator
30 Feeder
31 First guide module
31a First guide path
34 Outlet
35 Opening module
36 Cutout
37 Recess
39 Second guide module
40 Closing module
41 First protrusion
45 Seal module
48 Main body module
50 Controller
75 Discharge liquid collector Means for Solving Problems of Third and Fourth Embodiments A substrate cleaning apparatus according to a third aspect includes
a supplier that supplies a cleaning liquid,
a vibrator that applies an ultrasonic vibration to the cleaning liquid supplied from the supplier, and
a feeder that supplies the cleaning liquid supplied from the supplier from an outlet to a substrate,
wherein the feeder includes an inlet into which the cleaning liquid supplied from the supplier is introduced, a first guide module that guides the cleaning liquid introduced from the inlet to the outlet via a first guide path and has an opening module different from the inlet and the outlet, a seal module that is provided at an outside of a periphery of at least a part of the first guide path via the first guide module, and a closing module that covers the opening module and comes into contact with the seal module, and
the ultrasonic vibration generated by the vibrator is applied to the cleaning liquid via the closing module or the first guide module.

In the substrate cleaning apparatus according to the third aspect,
the feeder has a clamping member,
the closing module may have a first protrusion that protrudes from an outside of a periphery of the first guide module toward the substrate side, and
the seal module may be sandwiched between an end portion of the first protrusion and the clamping member.

In the substrate cleaning apparatus according to the third aspect,
the first guide module may have a recess or a cutout on an opposite side to the substrate,
the seal module may be positioned in the recess or the cutout, and
at least a part of the recess or the cutout may be covered with the closing module.

In the substrate cleaning apparatus according to the third aspect,
the first guide module may have a recess on a side surface on the opposite side to the substrate,
the closing module may have a first protrusion that protrudes from a periphery of an outside of the first guide module toward the substrate side, and
at least a part of the seal module may be positioned in an inside of the periphery of the first protrusion.

In the substrate cleaning apparatus according to the third aspect,
the ultrasonic vibration generated by the vibrator may be applied to the cleaning liquid via the closing module.

In the substrate cleaning apparatus according to the third aspect,
the first guide module may be made of a material which attenuates the ultrasonic vibration.

A substrate cleaning apparatus according to a fourth aspect includes
a supplier that supplies a cleaning liquid,
a vibrator that applies an ultrasonic vibration to the cleaning liquid supplied from the supplier, and
a feeder that supplies the cleaning liquid supplied from the supplier from an outlet to a substrate,
wherein the feeder includes a second guide module including an inlet into which the cleaning liquid supplied from the supplier is introduced and the outlet, and
the second guide module is not provided with an opening, except for the inlet and the outlet, and the ultrasonic vibration generated by the vibrator is applied to the cleaning liquid via the second guide module.

In the substrate cleaning apparatus according to the fourth aspect,
the second guide module may be integrally molded with a material which attenuates the ultrasonic vibration.

Effects of Third and Fourth Embodiments

According to the third aspect, the seal module is provided at the outside of the periphery of at least a part of the first guide path via the first guide module, and the closing module covers the opening module and comes into contact with the seal module. If the ultrasonic vibration is applied to the cleaning liquid, there is a possibility that fine dust or the like may be generated from the seal module by ultrasonic vibration, but by adopting this aspect, even if fine dust or the like is generated from the seal module, the dust or the like can be prevented from being supplied to the substrate by being mixed with the cleaning liquid in the first guide path.

According to the fourth aspect, the second guide module is not provided with the opening, except for the inlet and the outlet. For this reason, there is no seal module which may come into contact with the cleaning liquid from the beginning. Therefore, even if the ultrasonic vibration is applied to the cleaning liquid, the fine dust derived from the seal module is not supplied to the substrate by being mixed with the cleaning liquid.

Fifth Embodiment

In a manufacturing process of a substrate such as a semiconductor wafer, a polishing process of polishing a film of a metal or the like formed on the substrate is included, and after the polishing process, cleaning for removing fine particles as polishing wastes is performed. For example, in a damascene wiring forming process of forming a wiring by filling a wiring trench formed in an insulating film on the surface of the substrate with metal, excess metal on the surface of the substrate is polished and removed by chemical mechanical polishing (CMP) after the formation of the damascene wiring. Since residues of slurry (slurry residues) used for the CMP and particles (defects) such as metal polishing waste are present on the surface of the substrate after the CMP, they need to be removed by cleaning.

If the surface of the substrate is insufficiently cleaned and thus the residues remain on the surface of the substrate, leakage may occur from a portion where the residues on the surface of the substrate remain or adhesion failure may occur, thereby causing problems in terms of reliability. Therefore, it is necessary to clean the surface of the substrate on which a metal film, a barrier film, an insulating film, and the like are exposed with a high degree of cleaning. In recent years, with the miniaturization of semiconductor devices, a diameter of particles to be removed has become smaller, and the demand for cleaning is getting severe.

As the cleaning method after the polishing in the CMP apparatus, cleaning using a roll cleaning member, cleaning using a pencil cleaning member, cleaning using a two-fluid nozzle, and the like are known. In these cleaning processes, the substrate rotates around its central axis, and a chemical liquid and a rinse liquid (hereinafter, the chemical liquid and the rinse liquid are collectively referred to as "cleaning liquid") are supplied to the surface of the substrate. In addition, in these cleaning, after the cleaning (chemical liquid cleaning) performed by operating the roll cleaning member, the pencil cleaning member, and the two-fluid nozzle is performed, at least rinse liquid is supplied as the cleaning liquid, and the cleaning (rinse cleaning) performed by operating the roll cleaning member, the pencil cleaning member, and the two-fluid nozzle is also performed.

As the method for supplying a cleaning liquid to a surface of a substrate, there are a method for discharging a cleaning liquid from a single tube nozzle and landing it onto a surface of a substrate, a method for spraying a misty cleaning liquid from a spray nozzle and landing it onto a surface of a substrate, a method for discharging a cleaning liquid from a porous tube nozzle (bar nozzle) and landing it onto a surface of a substrate and the like are known. The cleaning liquid supplied to the surface of the substrate flows toward the outer periphery of the substrate under the centrifugal force generated by the rotation of the substrate. It is to be noted that when the cleaning liquid landed onto the substrate flows not only by a centrifugal force but also the cleaning liquid not landed onto the surface of the substrate flows in the direction parallel to the surface of the substrate, when the flow is affected by inertia, and when the surface of the substrate is inclined, the flow is affected by gravity, and in addition, a contact angle between the cleaning liquid and the surface of the substrate is also a factor of determining the flow of the cleaning liquid.

There may be a location at which the flow of the cleaning liquid is small or a location at which the cleaning liquid stagnates on a part of the substrate or particles such as slurry residues or metal polishing waste remain at that location, such that the cleaning may be insufficient.

On the other hand, as one of the cleaning methods for cleaning the surface of a substrate such as a semiconductor wafer in a non-contact manner, ultrasonic cleaning using cavitation for spraying ultrasonically treated pure water onto a surface of a substrate to clean the surface is known.

With the miniaturization of semiconductor devices in recent years, the demand for cleaning degree of a substrate processing apparatus such as a cleaning apparatus is increasing. However, in the conventional cleaning apparatus, it is extremely difficult to remove fine particles (for example, particles of 65 nm or less). In particular, when the diameter of the substrate reaches 450 mm in the future from the 300 mm which is currently in use, such insufficient cleaning becomes conspicuous in a part of the substrate.

The fifth to ninth embodiments have been made in view of these points, and it is an object of the fifth to ninth embodiments to provide a substrate processing apparatus for cleaning a substrate by supplying a cleaning liquid to a substrate such as a semiconductor wafer.

In the fifth to ninth embodiments, new reference numerals are given to drawings, apart from the reference numerals of the preceding drawings.

<<Configuration>>

Hereinafter, the embodiment of the substrate processing apparatus according to the present invention will be described with reference to the drawings. Here, FIGS. 37 to 41 are views for explaining the embodiment of the present invention.

Figure 37:
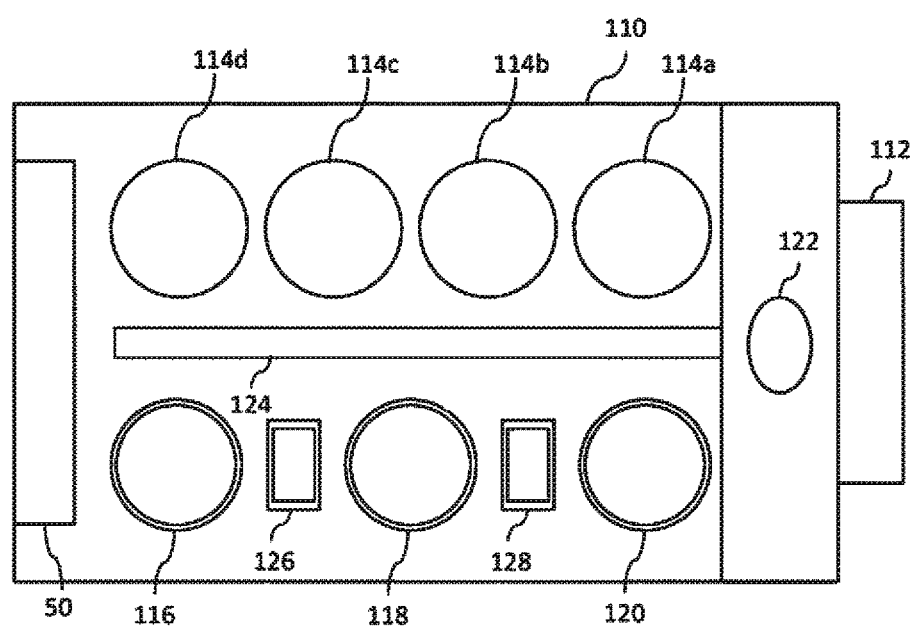
FIG. 37 is an upper plan view showing the overall configuration of a processing apparatus including a substrate processing apparatus according to a fifth embodiment.

As shown in FIG. 37, the substrate processing apparatus has a substantially rectangular housing 110 and a load port 112 on which a substrate cassette for stocking a plurality of substrates W (see FIG. 38 or the like) is mounted. The load port 112 is disposed adjacent to the housing 110. The load port 112 may be mounted with an open cassette, a standard mechanical interface (SMIF) pod, or a front opening unified pod (FOUP). The SMIF pod and the FOUP are airtight containers that can have a substrate cassette received therein, and be covered with partition walls to maintain an environment independent of an external space. Examples of a substrate W may include a semiconductor wafer or the like.

A plurality (four in the aspect shown in FIG. 37) of polishing units 114*a* to 114*d*, a first cleaning unit 116 and a second cleaning unit 118 that clean the polished substrate W, and a drying unit 120 that dries the cleaned substrate W are housed in the housing 110. The polishing units 114*a* to 114*d* are arranged along a longitudinal direction of the substrate processing apparatus, and the cleaning units 116 and 118 and the drying unit 120 are also arranged along the longitudinal direction of the substrate processing apparatus.

A first conveyance robot 122 is disposed in a region surrounded by the load port 112, the polishing unit 114*a* located on a side of the load port 112, and the drying unit 120. In addition, the conveying unit 124 is arranged in parallel with the polishing units 114*a* to 114*d*, the cleaning units 116 and 118, and the drying unit 120. The first conveyance robot 122 receives the substrate W before polishing from the load port 112 and conveys the substrate W to the conveying unit 124, or receives the dried substrate W, which is taken out from the drying unit 120, from the conveying unit 124.

A second conveyance robot 126 that conveys the substrate W between the first cleaning unit 116 and the second cleaning unit 118 is disposed between the first cleaning unit 116 and the second cleaning unit 118, and a third conveyance robot 128 that conveys the substrate W between the second cleaning unit 118 and the drying unit 120 is disposed between the second cleaning unit 118 and the drying unit 120.

In addition, a controller 50 that controls a movement of each device of the substrate processing apparatus is disposed inside the housing 110. The present embodiment is described based on an aspect in which the controller 50 is disposed in the housing 110, but is not limited thereto, and the controller 50 may be disposed outside the housing 110.

In the aspect shown in FIG. 37, as the first cleaning unit 116, a roll cleaning apparatus which brings roll cleaning members linearly extending substantially over the whole length of a diameter of the substrate W into contact with the substrate W under the presence of the cleaning liquid to perform scrubbing cleaning on a surface of the substrate W while the roll cleaning members rotating on a central axis parallel to the substrate W may be used. In addition, as the second cleaning unit 118, a pencil cleaning apparatus that brings a lower end contact surface of a columnar pencil cleaning member extending in a vertical direction into contact with the substrate W under the presence of the cleaning liquid and moves the pencil cleaning member in one direction while rotating the pencil cleaning member to perform the scrubbing cleaning on the surface of the substrate W may be used. In addition, as the drying unit 120, a spin drying unit that dries the substrate W by jetting IPA vapor from a spray nozzle moving toward a horizontally rotating substrate W, and dries the substrate W by a centrifugal force generated by rotating the substrate W at a high speed is used.

In the aspect shown in FIG. 37, the roll cleaning apparatus is used as the first cleaning unit 116, but as the first cleaning unit 116, the pencil cleaning apparatus similar to the second cleaning unit 118 may be used, or a two-fluid jet cleaning apparatus that cleans the surface of the substrate W by two-fluid jet may be used. In the aspect shown in FIG. 37, the pencil cleaning apparatus is used as the second cleaning unit 118, but as the second cleaning unit 118, the roll cleaning apparatus similar to the first cleaning unit 116 may be used, or the two-fluid jet cleaning apparatus that cleans the surface of the substrate W by two-fluid jet may be used. The substrate processing apparatus according to the embodiment of the present invention can be applied to both the first cleaning unit 116 and the second cleaning unit 118, and can be used together with the roll cleaning apparatus, the pencil cleaning apparatus, and/or a fluid jet cleaning apparatus.

The cleaning liquid of the present embodiment contains rinse liquids such as pure water (DIW) and chemical liquids such as ammonia hydrogen peroxide (SC1), hydrochloric acid hydrogen peroxide (SC2), sulfuric acid hydrogen peroxide (SPM), sulfuric acid water, and hydrofluoric acid. Unless otherwise specified in the present embodiment, the cleaning liquid means either the rinse liquid or the chemical liquid.

Figure 38:
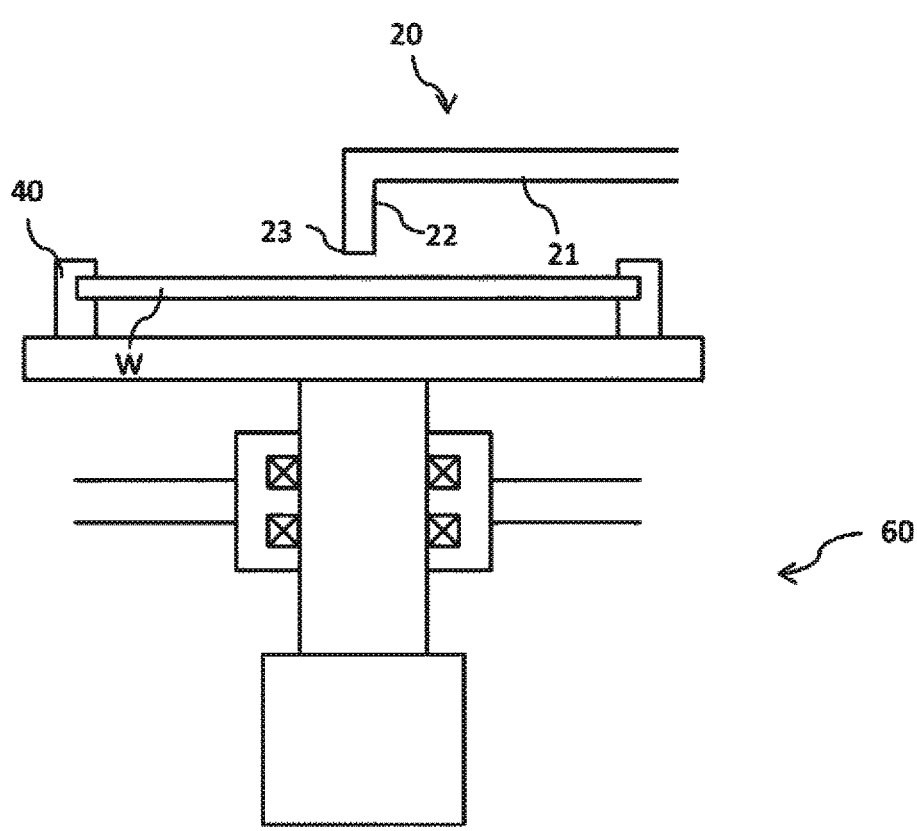
FIG. 38 is a side cross-sectional view of the substrate processing apparatus according to the fifth embodiment.

As shown in FIG. 38, the substrate processing apparatus according to the embodiment of the present invention includes a substrate support 40 such as a chuck that supports (holds) the substrate W and a rotator 60 that rotates the substrate W supported by the substrate support 40. The substrate support 40 and the rotator 60 constitute a substrate rotating mechanism. In this aspect shown in FIG. 38, only two substrate supports 40 are shown, but when viewed from above, in the present embodiment, four substrate supports 40 are disposed equally (at an angle of 90° centered on a rotation center). It should be noted that the number of the substrate supports is enough to be able to stably support the substrate, and may be three, for example. It is to be noted that as the substrate support 40 that supports the substrate W, a spindle or the like can also be used. In the case of using such a spindle, the substrate W is supported while being rotated, and the spindle also serves as the rotator. FIG. 38 shows an example, in which the substrate W is supported in a horizontal direction, but the present invention is not limited to this example, and for example, the substrate support 40 may be configured to support the substrate W in a longitudinal direction (vertical direction).

Figure 39:
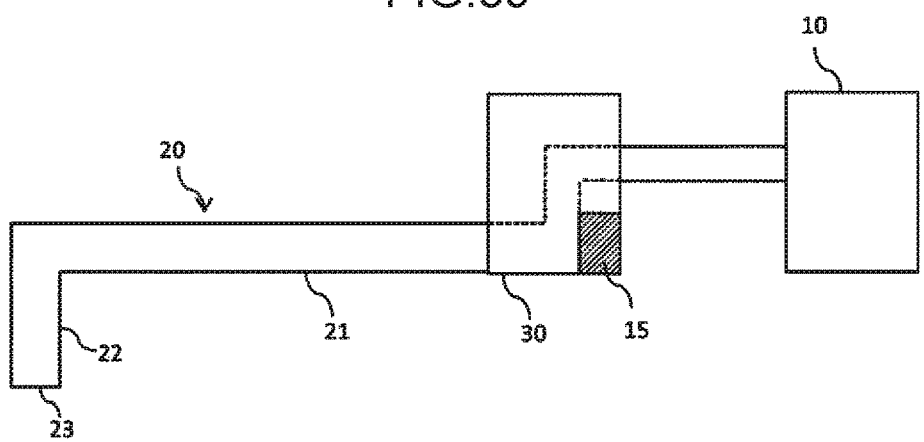
FIG. 39 is a side view showing a supply pipe, a supplier, a supply pipe holder and the like used in the fifth embodiment.

As shown in FIG. 39, the substrate processing apparatus includes a supplier 10 that supplies a cleaning liquid, a vibrator 15 that applies an ultrasonic vibration to the cleaning liquid supplied from the supplier 10, and a supply pipe 20 that has a supply port 23 and guides the cleaning liquid ultrasonically vibrated by the vibrator 15 and supplies the cleaning liquid from the supply port 23 to the substrate W.

The substrate processing apparatus has the above-described controller 50 (see FIG. 37), and the substrate processing operation is controlled by the controller 50. Prior to supplying the cleaning liquid to the substrate W, the controller 50 supplies the cleaning liquid from the supplier 10 and discharges the cleaning liquid from the supply port 23 at a standby position (see FIG. 40).

The supply pipe 20 may include a first extension 21 that extends in a direction orthogonal to a normal line of the substrate W and a second extension 22 that extends from the first extension 21 toward the substrate W in a normal direction of the substrate W. As an example, as shown in FIG. 39, the first extension 21 extending in a horizontal direction and the second extension 22 extending in a vertical direction (down direction in the aspect shown in FIG. 39) from the first extension 21. The supply port 23 may be provided at an end portion (lower end portion in the aspect shown in FIG. 39) of the second extension 22. In the present embodiment, the "extending in the normal direction of the substrate W" may be enough to extend including the "component in the normal direction of the substrate W", and may be inclined from the "normal direction of the substrate W". Similarly, the "extending in the direction orthogonal to the normal line to the substrate W" is enough to extend including the "direction orthogonal to the normal line of the substrate W", and may be inclined from the "the direction orthogonal to the normal line of the substrate W". In addition, the "horizontal direction" in the present embodiment is a direction including a component in the horizontal direction and may be inclined from the horizontal direction. In addition, the "vertical direction" in the present embodiment is a direction including a component in the vertical direction and may be inclined from the vertical direction. In addition, as shown in FIG. 39, a length of the first extension 21 may be longer than that of the second extension 22.

Hereinafter, in the present embodiment, the aspect in which the first extension 21 extends in the horizontal direction and the second extension 22 extends in the vertical direction will be described below, but the present embodiment is not limited thereto, and as described above, may be configured to support the substrate W in the longitudinal direction (vertical direction). In this case, the first extension 21 extends in the vertical direction, and the second extension 22 extends in the horizontal direction.

As the material of the supply pipe 20, for example, quartz, stainless steel or the like can be used. In particular, quartz is a material that makes the attenuation of the ultrasonic vibration difficult. Therefore, it is possible to prevent the ultrasonic vibration applied to the cleaning liquid from being attenuated by using such quartz. In the case in which quartz is used as the material of the supply pipe 20, it may be considered that hydrofluoric acid is not be used as a chemical liquid after the quartz is melted. However, even when quartz is used as the material of the supply pipe 20, dilute hydrofluoric acid (DHF) can be used.

Figure 40:
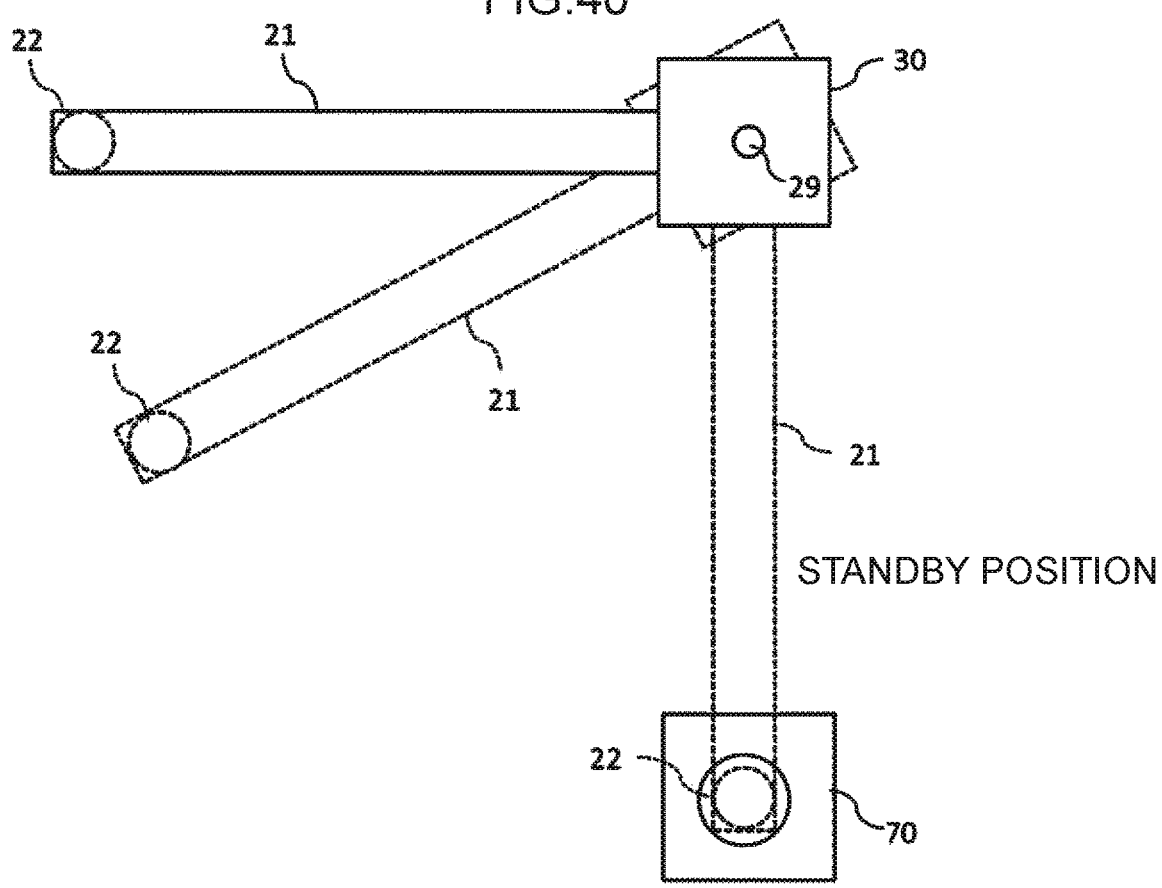
FIG. 40 is an upper plan view showing the supply pipe, the supply pipe holder and the like used in the fifth embodiment.

As shown in FIG. 40, the first extension 21 may be capable of swinging on an upper side (on the front surface side) of the substrate W about a swinging shaft 29, and in this case, the swinging shaft 29 may be provided on a base end portion side of the first extension 21. The "base end portion side of the first extension 21" in the present embodiment means, for example, a region closest positioned on the base end portion side when the entire length of the first extension 21 is equally divided into three. The first extension 21 may be swingable on a lower side (back side) of the substrate W about the swinging shaft 29, and the first extension 21 may be swingable on the upper side and the lower side of the substrate W about the swinging shaft 29. In the aspect shown in FIG. 41, the upper first extension 21a to be described later can swing on the upper side of the substrate W about the swinging shaft 29, and the lower first extension 21b to be described later can swing on the lower side of the substrate W about the swinging shaft 29.

As shown in FIG. 39, a supply pipe holder 30 that rotatably holds the first extension 21 about a longitudinal axis (axis extending in the horizontal direction in FIG. 39) of the first extension 21 is provided. In the case of adopting such an aspect, it is advantageous in that an angle of the supply port 23 with respect to the substrate W can be freely changed.

For example, when it is desired to store the cleaning liquid on the substrate W, the supply pipe holder 30 may hold the supply pipe 20 at an angle at which the cleaning liquid is supplied toward the opposite side to the rotation direction of the substrate W. On the other hand, for example, when it is desired to supply the cleaning liquid to the substrate W without adding a resistance, the supply pipe holder 30 may be enough to hold the supply pipe 20 at an angle at which the cleaning liquid is supplied along the rotation direction of the substrate W. It is to be noted that an angle at which the supply pipe 20 is held by the supply pipe holder 30 may be changed manually or may be changed automatically in response to receiving a signal from the controller 50. In the case in which the angle is automatically changed in response to receiving the signal from the controller 50, the angle held by the supply pipe 20 may be sequentially changed according to a recipe.

Figure 41:
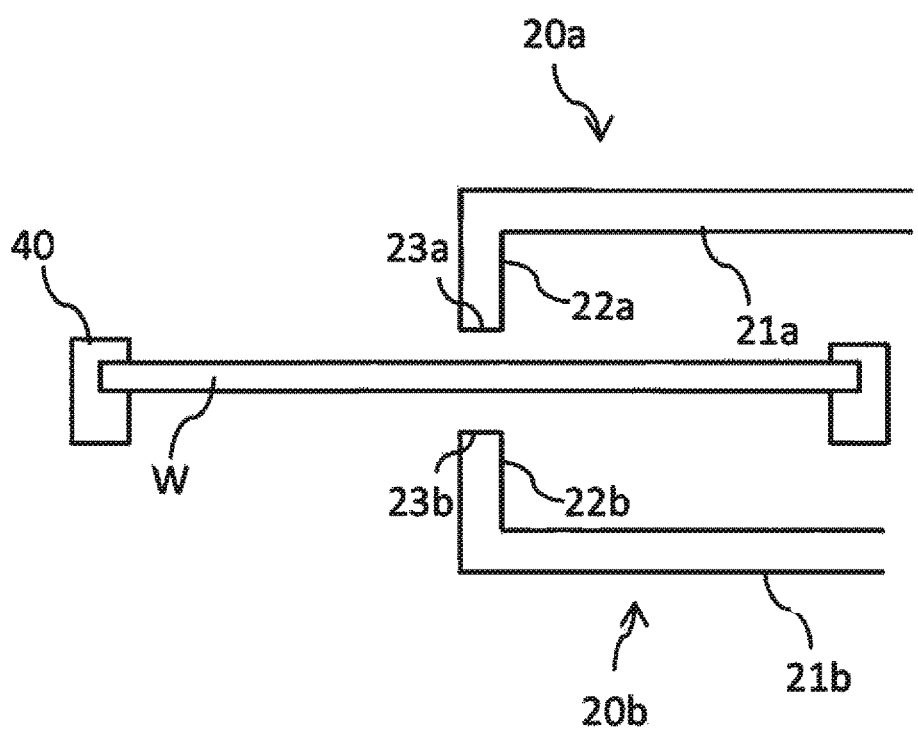
FIG. 41 is a side cross-sectional view of a substrate processing apparatus according to a modification of the fifth embodiment.

As shown in FIG. 41, the supply pipe 20 may have an upper supply pipe 20a that cleans an upper surface of the substrate W and a lower supply pipe 20b that cleans a lower surface of the substrate W. In this aspect, the upper supply pipe 20a has the same configuration as the supply pipe 20 shown in FIG. 39. That is, the upper supply pipe 20a includes the upper first extension 21a that extends in the horizontal direction and the upper second extension 22a that extends in the vertical direction (down direction in the aspect shown in FIG. 41) from the upper first extension 21a, and an end portion (lower end portion in the aspect shown in FIG. 41) of the upper second extension 22a is provided with a supply port 23a. On the other hand, the lower supply pipe 20b includes the lower first extension 21b that extends in the horizontal direction and the lower second extension 22b that extends in the vertical direction (upper direction in the aspect shown in FIG. 41) from the lower first extension 21b, and an end portion (upper end portion in the aspect shown in FIG. 41) of the lower second extension 22b is provided with a supply port 23b.

The controller 50 shown in FIG. 37 controls a swinging speed of the supply pipe 20 to be slower when the supply port 23 cleans a peripheral side region of the substrate W than when the supply port 23 cleans a central side region of the substrate W. The "central side region" in the present embodiment is used in comparison with the "peripheral side region" and means a region located on the center side of the substrate W as compared with the "peripheral side region".

Further, the controller 50 may start to vibrate the vibrator 15 after the lapse of the first period of time since the supply of the cleaning liquid from the supplier 10 shown in FIG. 39. In addition, the controller 50 may start to supply the cleaning liquid from the supply port 23 to the substrate W after a lapse of a second period of time longer than the first period of time after the cleaning liquid is supplied from the supplier 10.

At this time, the cleaning liquid may be continuously supplied after the lapse of the first period of time since the supply of the cleaning liquid from the supplier 10, the second extension 22 may start to swing about the swinging shaft 29 after a lapse of a third period of time longer than the first period of time and shorter than the second period of time, and the cleaning liquid may be supplied to the peripheral portion of the substrate W after the lapse of the second period of time since the supply of the cleaning liquid from the supplier 10. Thereafter, in this aspect, the cleaning liquid continues to be supplied from the peripheral portion toward the central portion of the substrate W. Unlike this aspect, the supply of the cleaning liquid from the supplier 10 stops while the supply port 23 moves from the peripheral portion to the upper side of the central portion of the substrate W, and the cleaning liquid is discharged again from the supply port 23 after the supply port 23 is positioned above the central portion of the substrate W (after the lapse of the second period of time), and the cleaning liquid may be supplied to the central portion of the substrate W. While the substrate W is being cleaned, the second extension 22 may swing from the central portion toward the peripheral portion of the substrate W, or conversely, the second extension 22 may swing from the peripheral portion toward the central portion of the substrate W, and such swinging may be repeatedly performed.

When the cleaning liquid is supplied to the substrate W, the ultrasonic vibration is not necessarily always applied to the cleaning liquid. In the case in which the ultrasonic vibration is not applied to the cleaning liquid as in a process for forming a film of the cleaning liquid on the upper surface of the substrate W or the like, the cleaning liquid may be discharged from the supply port 23 prior to being supplied to the substrate W without performing the ultrasonic vibration.

As shown in FIG. 40, the substrate processing apparatus may further include a discharge liquid collector 70 that collects the cleaning liquid discharged from the supply port 23 at the standby position.

The discharge liquid collector 70 is connected to a drainage collector (not shown), and the collected cleaning liquid is drained.

<<Method>>

An example of a method (substrate processing method) for processing a substrate W using the substrate processing apparatus of the present embodiment is as follows. It is to be noted that the overlapping portions with the above description are briefly described, but all aspects described in the above "configuration" can be applied in the "method". Conversely, all aspects described in the "method" can be applied in "configuration". In addition, a program for executing the method of the present embodiment may be recorded on a recording medium, and by reading the recording medium by a computer (not shown), the method of the present embodiment may be performed by the substrate processing apparatus.

First, the substrate W is supported (held) by a substrate support 40 such as a chuck (see FIG. 38). At this time, the supply pipe 20 is at the standby position (see FIG. 40), the supply port 23 is positioned above the discharge liquid collector 70, and the supply port 23 is not positioned above the substrate W.

Next, the cleaning liquid is supplied from the supplier 10. The cleaning liquid supplied from the supplier 10 is received by the discharge liquid collector 70 and is collected by the drainage collector (not shown) as it is.

The vibrator 15 (see FIG. 39) starts to vibrate after the lapse of the first period of time since the supply of the cleaning liquid from the supplier 10.

After the lapse of the second period of time since the supply of the cleaning liquid from the supplier 10, the supply of the cleaning liquid to the substrate W from the supply port 23 starts. At this time, the second extension 22 starts to swing about the swinging shaft 29 after the third period of time longer than the first period of time and shorter than the second period of time elapses, and the cleaning liquid starts to be supplied to the peripheral portion of the substrate W after the lapse of the second period of time since the supply of the cleaning liquid from the supplier 10. Unlike this aspect, the supply of the cleaning liquid from the supplier 10 stops while the supply port 23 moves from the peripheral portion of the substrate W to above the central portion, and after the supply port 23 is positioned above the central portion of the substrate W (after the lapse of the second period of time), the cleaning liquid may be supplied to the central portion of the substrate W.

As described above, while the substrate W is being cleaned, the second extension 22 may swing from the central portion toward the peripheral portion of the substrate W, or conversely, the second extension 22 may swing from the peripheral portion toward the central portion of the substrate W, and such swinging may be repeatedly performed. The swinging speed at this time may be delayed when the supply port 23 cleans the peripheral side region of the substrate W as compared with when the supply port 23 cleans the central side region of the substrate W. The swinging speed may be changed continuously or intermittently. In addition, during the swinging from the central portion toward the peripheral portion of the substrate Wand the swinging from the peripheral portion toward the central portion of the substrate W, the swinging speed may be delayed when the supply port 23 cleans the peripheral side region of the substrate W as compared with when the supply port 23 cleans the central side region of the substrate W.

In the case in which the cleaning liquid is the chemical liquid, the rinse liquid may be supplied after the chemical liquid treatment is finished. The rinse liquid may also be supplied to the substrate W in the same manner as the chemical liquid. It is to be noted that the supply pipe for supplying the chemical liquid and the supply pipe for supplying the rinse liquid may be the same or different.

<<Action and Effect>>

Next, actions and effects according to the present embodiment having the above-described configuration will be described based on those not yet explained.

According to the present embodiment, prior to supplying the cleaning liquid to the substrate W, the cleaning liquid is supplied from the supplier 10 and the cleaning liquid is discharged from the supply port 23 at a standby position. Therefore, a cleaning liquid having a low cleaning effect due to the introduction of oxygen or the like is discharged, and a cleaning liquid having a strong cleaning effect due to the introduction of nitrogen or the like is applied with the ultrasonic vibration to be able to be used to clean the substrate W. In addition, it is possible to clean the substrate W with a cleaning liquid having a strong cleaning effect by being sufficiently applied with ultrasonic waves, instead of a cleaning liquid which is not sufficiently applied with ultrasonic waves and is not high in a cleaning effect.

In addition, in the case of cleaning the substrate W with the cleaning liquid which is not sufficiently applied with ultrasonic waves due to the introduction of oxygen or the like, there is a possibility that defects may occur. However, by adopting this aspect of the present embodiment, the occurrence of defects can be prevented in advance. In addition, by adopting the aspect of the present embodiment, the substrate W can be cleaned with the cleaning liquid having uniform detergency from the cleaning start time of the substrate W, and the substrate W can be stably cleaned.

The present embodiment as described above may adopt an aspect in which as shown in FIGS. 39 to 41, the supply pipe 20 includes the first extension 21 that extends in the horizontal direction and the second extension 22 that extends in the vertical direction from the first extension 21, the end portion of the second extension 22 is provided with the supply port 23, and the first extension 21 can swing about the swinging shaft 29 provided at the base end portion side. In the case of adopting such an aspect, it is possible to freely position the supply port 23 from the central position of the substrate W to the peripheral position only by swinging the first extension 21. In addition, in the case in which the material of the supply pipe 20 is a material which makes the attenuation of the ultrasonic vibration difficult, the cleaning liquid can be supplied to the substrate W while the attenuation of the ultrasonic vibration is suppressed and the cleaning liquid can be supplied to the vicinity of the substrate W, such that the strong cleaning effect on the substrate W can be obtained.

On the other hand, in the case of adopting such an aspect, the length of the supply pipe 20 becomes long and the amount of the cleaning liquid accumulated in the supply pipe 20 is increased. When the amount of cleaning liquid is increased as above, oxygen is dissolved or ultrasonic waves are not sufficiently applied, such that the amount of cleaning liquid not having a strong cleaning effect is also increased. In this regard, in the present embodiment, since the cleaning liquid is supplied from the supplier 10 prior to supplying the cleaning liquid to the substrate Wand the cleaning liquid is discharged from the supply port 23 at the standby position, it is possible to prevent an adverse effect which is likely to occur due to the cleaning liquid not having the strong cleaning effect.

In the case of adopting the aspect in which the moving speed of the supply pipe 20 is slower when the supply port 23 cleans the peripheral side region of the substrate Was compared with when the supply port 23 cleans the central side region of the substrate W, it is possible to supply more cleaning liquid to the outer peripheral side of the substrate W than the inner peripheral side. Since an area to be cleaned with the cleaning liquid on the outer peripheral side of the substrate W is larger than an area to be cleaned with the cleaning liquid on the inner peripheral side of the substrate W, by adopting such an aspect, it is possible to make the amount of cleaning liquid supplied per unit area of the substrate W substantially uniform.

When a distance from the center of the substrate W to be rotated is set to be r, a length of an arc at the distance r is set to be $2\pi r$. Therefore, the swinging speed of the supply pipe 20 may be calculated based on this $2\pi r$, and the first extension 21 may swing based on the swinging speed. Unlike such an aspect, simply, the swinging speed may be slow continuously or intermittently while the swinging occurs from the central portion toward the peripheral portion of the substrate W, whereas the swinging speed may be fast continuously or intermittently while the swinging occurs from the peripheral portion toward the central portion of the substrate W. According to such an aspect, it is advantageous in that the control is not complicated.

In the case of adopting the aspect in which the vibration of the vibrator 15 starts after the lapse of the first period of time since the supply of the cleaning liquid from the supplier 10, the vibration of the vibrator 15 can start in the state in which the vibrator 15 is immersed in the cleaning liquid. In other words, air or the like in the supply pipe 20 infiltrates into the cleaning liquid, and thus, for example, the state in which the cleaning liquid does not exist in the vibrator 15 shown in FIG. 39 may occur. In this regard, in the case of adopting this aspect, since the cleaning liquid is supplied before vibrating the vibrator 15, the vibrator 15 vibrates in the state (a so-called no-water burning state) in which no cleaning liquid is present, thereby preventing the vibrator 15 from being damaged.

As an example, the first period of time is, for example, about 0.1 seconds to 1 second. In the first period of time, it may be enough to prevent the state in which the vibrator 15 is immersed in the cleaning liquid, so it is not necessary to take a long time to do so.

When the cleaning liquid in the supply pipe 20 is discharged to the discharge liquid collector 70 or the like, it may not necessary to vibrate the vibrator 15. However, it is advantageous in that the inside of the supply pipe 20 is cleaned with the cleaning liquid applied with the ultrasonic vibration in advance by vibrating the vibrator 15 in advance when discharging the cleaning liquid in the supply pipe 20 to the discharge liquid collector 70 or the like. In addition, by applying the ultrasonic vibration in advance, it is possible to apply the sufficient ultrasonic vibration to the cleaning liquid in the supply pipe 20 (sufficient energy can be stored) in advance, and when the substrate W is cleaned, it is possible to supply a cleaning liquid having sufficiently high detergency from the beginning. The second period of time is, for example, about several seconds to 10 seconds.

In addition, in the case of adopting the aspect in which the cleaning liquid starts to supply from the supply port 23 to the substrate W after the cleaning liquid is supplied from the supplier 10 and then the second period of time longer than the first period of time elapses, it is possible to more reliably clean the substrate W with the cleaning liquid having the strong cleaning effect. It should be noted that the second period of time is, for example, time taken to discharge almost all of the cleaning liquid in the supply pipe 20. The second period of time may be calculated from a volume in the supply pipe 20 and the supply speed at which the cleaning liquid is supplied or may be experimentally derived.

In the case of adopting the aspect in which the discharge liquid collector 70 that collects the cleaning liquid discharged from the supply port 23 at the standby position is provided, it is possible to reliably collect the discharged cleaning liquid not used for cleaning. As a result, the possibility that the cleaning liquid discharged from the supply port 23 splatters to become a mist and thus adversely affects the substrate W can be reduced in advance.

In addition, in the aspect in which the substrate processing apparatus of the present embodiment is built in a two-fluid jet cleaning apparatus that cleans the surface of the substrate W by a two-fluid mixture of liquid and gas, for example, prior to performing the two-fluid jet cleaning process, the substrate W may be cleaned by the substrate processing apparatus of the present embodiment. According to the aspect, it is advantageous in that the two-fluid jet cleaning can be performed by floating particles adhering to the substrate W due to the cavitation effect of the cleaning liquid supplied with the ultrasonic waves.

The cavitation effect is the cleaning effect using impact waves generated by bursting of air bubbles generated in the cleaning liquid by ultrasonic waves.

Sixth Embodiment

Next, a sixth embodiment will be described.

Figure 42:
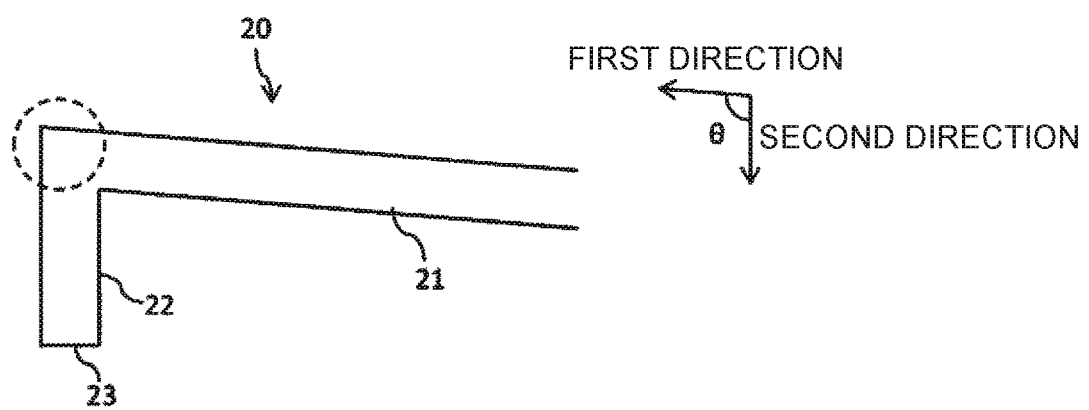
FIG. 42 is a side view showing a supply pipe used in a sixth embodiment.

In the sixth embodiment, the tip side of the first extension 21 is positioned higher than the base end portion side. As an example, as shown in FIG. 42, the first direction is inclined with respect to the horizontal direction, and the distance along the normal direction (vertical direction in FIG. 42) of the substrate W may be longer as going from the peripheral portion toward the central portion of the substrate W.

Any angle in the range in which the first direction in which the first extension 21 extends from the base end portion (right end portion in FIG. 42) of the first extension 21 is preferably larger than 0° and smaller than 30° with respect to the horizontal direction may be used. The reason is that there is a possibility that the cleaning effect can not be sufficiently ensured if the angle is out of this range.

In the sixth embodiment, other configurations are substantially the same as those of the fifth embodiment.

In the case of adopting the aspect in which the tip side of the first extension 21 is positioned higher than the base end portion side as in this embodiment, the droplets adhering to the first extension 21 flows in the base end portion side, such that it is possible to prevent droplets from dripping on the substrate W or other members. In the aspect of applying the ultrasonic vibration to the cleaning liquid as in this embodiment, since the supply pipe 20 vibrates, the cleaning liquid adhering to the supply pipe 20 may drop. Therefore, it is advantageous to adopt such an aspect.

In addition, in the case of adopting such an aspect, it can be expected that oxygen or the like infiltrates into the cleaning liquid from the supply port 23 is accumulated at a position above the boundary between the first extension 21 and the second extension 22 (dotted line circle mark "O" in FIG. 42). As a result, the occurrence of the state in which the vibrator 15 is not immersed in the cleaning liquid can be further prevented.

Also, as shown in FIG. 42, an angle θ formed by the first direction and the second direction in which the second extension 22 extends from the base end portion (upper end portion in FIG. 42) of the second extension 22 may be an obtuse angle (an acute angle between a direction opposite to the first direction and the second direction). In the case of adopting such an aspect, oxygen or the like infiltrating into from the supply port 23 into the cleaning liquid can hardly to infiltrate into the first extension 21. As a result, it is possible to prevent oxygen or the like from infiltrating into the cleaning liquid accumulated in the supply pipe 20 to the utmost. Therefore, the ultrasonic vibration can be applied to the cleaning liquid having a strong cleaning effect to be used for cleaning the substrate W.

In addition, oxygen or the like infiltrating into the cleaning liquid from the supply port 23 is hardly to infiltrate into the first extension 21, so the occurrence of the state in which the vibrator 15 is not immersed in the cleaning liquid can be prevented to the utmost. In particular, as shown in FIG. 39, when the vibrator 15 is positioned on the base end portion side of the second extension 22, the effect of the present embodiment is enhanced.

It is described above that the sixth embodiment is substantially the same as the fifth embodiment, but the sixth embodiment does not necessarily adopt the aspect described in the fifth embodiment. For example, the sixth embodiment may adopt an aspect in which prior to supplying the cleaning liquid to the substrate W, the controller 50 supplies the cleaning liquid from the supplier 10 and discharges the cleaning liquid from the supply port 23 at a standby position.

Seventh Embodiment

Next, a seventh embodiment will be described.

Figure 43A:
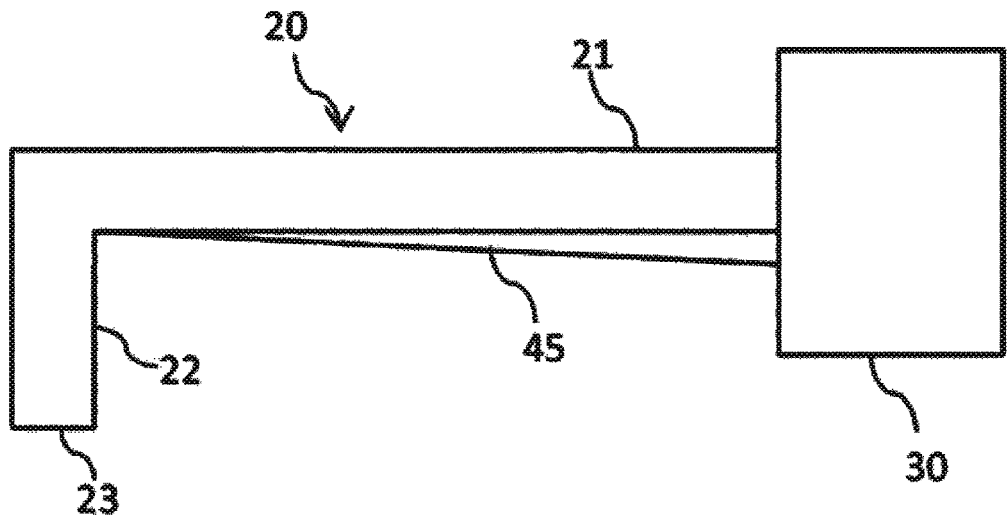
FIG. 43(a) is a side view showing an example of a supply pipe, a droplet guide module, and a supply pipe holder used in a seventh embodiment.
Figure 43B:
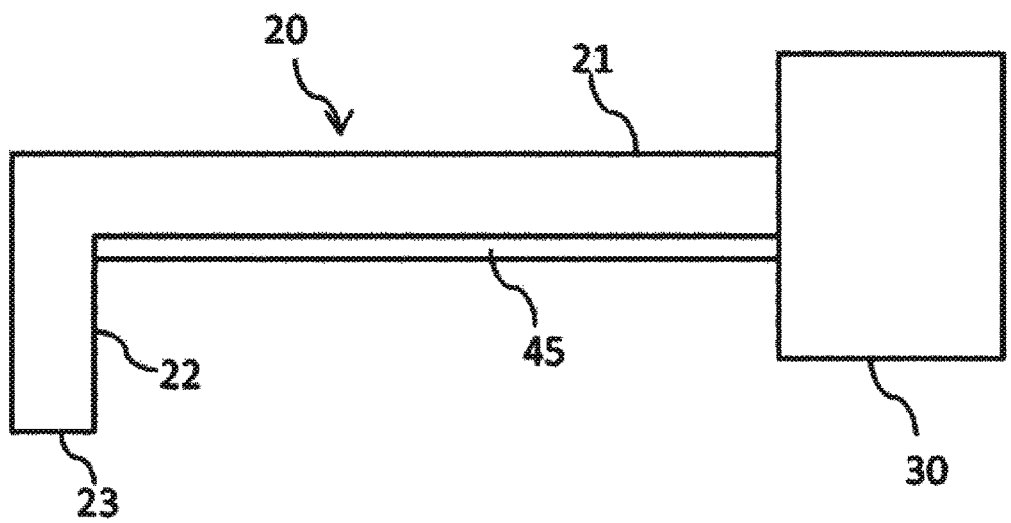
FIG. 43(b) is a side view showing another example of the supply pipe, the droplet guide module, and the supply pipe holder used in the seventh embodiment.

In the seventh embodiment, as shown in FIGS. 43(a) and 43(b), a droplet guide module 45 extending along the first extension 21 is provided under a first extension 21. In the present embodiment, as shown in FIG. 38, it is assumed that a supply pipe 20 is positioned above the substrate W.

In the seventh embodiment, other configurations are substantially the same as those of the fifth embodiment.

In the present embodiment, since the droplet guide module 45 extending along the first extension 21 is provided under the first extension 21, the droplets adhering to the supply pipe 20 are guided to a base end portion side along the droplet guide module 45. For this reason, it is possible to prevent droplets from dropping onto the substrate W or other members in advance.

The droplet guide module 45 of the present embodiment may also be made of a hydrophilic material. When such a hydrophilic material is adopted, the droplets are more reliably guided along the droplet guide module 45. Therefore, it is possible to more reliably prevent droplets from dropping onto the substrate W and other members. In addition, the present embodiment is not limited thereto, and the droplet guide module 45 may be made of a hydrophobic material.

As a material of the droplet guide module 45, for example, it is possible to use a tetrafluoroethylene·perfluoroalkyl vinyl ether copolymer (PFA) having chemical resistance, polyether ether ketone (PEEK), metal SUS (in particular, SUS 316) or the like.

In addition, the droplet guide module 45 may support the first extension 21 from below and swing together with the first extension 21. In the case of adopting such an aspect, it is also possible to perform the function of supporting the first extension 21 by the droplet guide module 45.

In addition, as shown in FIG. 43 (a), a thickness of the droplet guide module 45 may be increased toward the base end portion side (it may have a tapered shape). In the case of adopting such an aspect, since the inclination is made by the droplet guide module 45, it is possible to more reliably guide droplets adhering to the supply pipe 20 to the base end portion side.

It is described above that the seventh embodiment is substantially the same as the fifth embodiment, but the seventh embodiment does not necessarily adopt the same aspect as the sixth embodiment and the aspect described in the fifth embodiment.

In addition, the seventh embodiment may be combined with the sixth embodiment. For example, even in the seventh embodiment, an angle θ formed by the first direction in which the first extension 21 extends from the base end portion of the first extension 21 and the second direction in which the second extension 22 extends from the base end portion of the second extension 22 may be an obtuse angle.

Eighth Embodiment

Next, an eighth embodiment will be described.

In the eighth embodiment, an aspect in which an ultrasonic vibration is applied to the cleaning liquid by vibrating at a first frequency and a second frequency lower than the first frequency is adopted. In addition, in the present embodiment, an aspect in which the ultrasonic vibration is applied to the cleaning liquid at more than three frequencies may be adopted.

In the eighth embodiment, other configurations are substantially the same as those of the fifth embodiment.

According to the present embodiment, it is possible to apply the ultrasonic vibration to the cleaning liquid at different frequencies. As a result, the detergency of the cleaning liquid can be changed depending on the applications.

Figure 44:
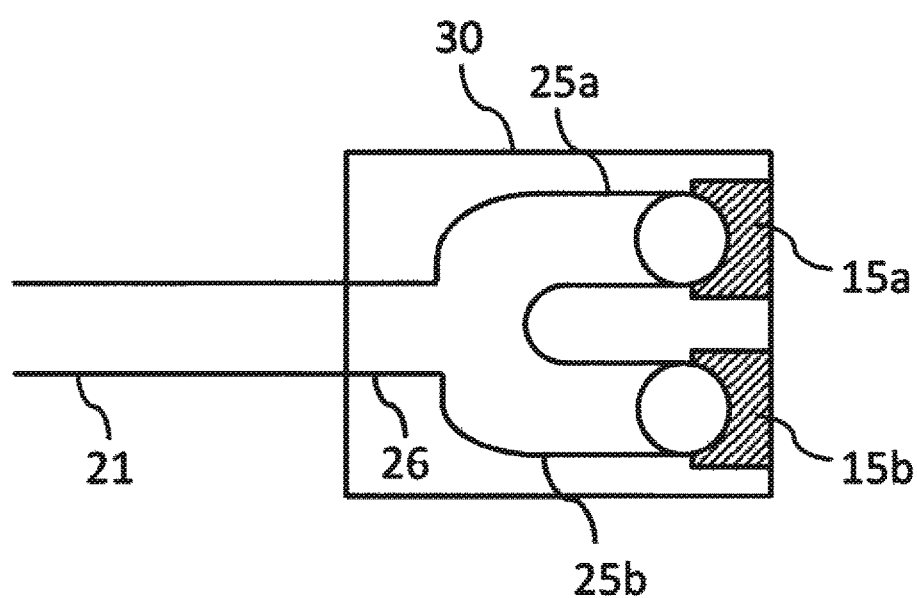
FIG. 44 is a cross-sectional view of a vibrator, a guide pipe, and the like used in an eighth embodiment viewed from above.

One vibrator may vibrate at different frequencies, but as shown in FIG. 44, the vibrator 15 may include a first vibrator 15a vibrating at the first frequency and a second vibrator 15b vibrating at the second frequency lower than the first frequency. According to the aspect, it is advantageous in that it can provide the ultrasonic vibration at different frequencies with a simple configuration. FIG. 44 is a cross-sectional view of the vibrators 15a and 15b and guide pipes 25a, 25b, and 26 and the like used in the present embodiment when viewed from above.

Figure 45:
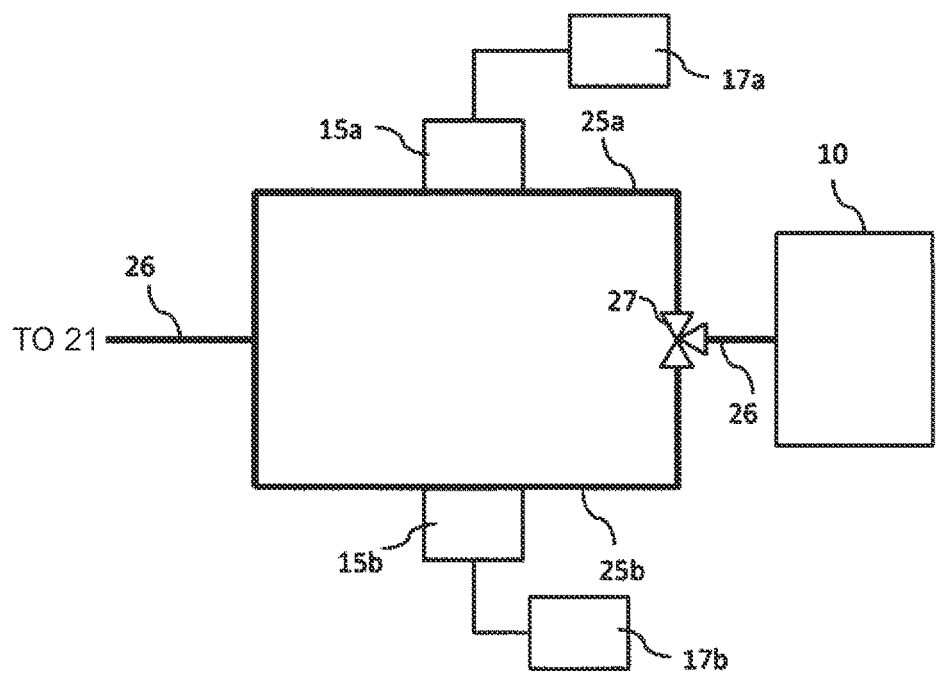
FIG. 45 is a view schematically showing a vibrator, an oscillator, a guide pipe and the like used in the eighth embodiment.

As shown in FIG. 45, the first vibrator 15a may be electrically connected to a first transmitter 17a that transmits a signal to the first vibrator 15a. Similarly, the second vibrator 15b may be electrically connected to a second transmitter 17b that transmits a signal to the second vibrator 15b. FIG. 45 is a cross-sectional view schematically showing the vibrators 15a and 15b, oscillators 17a and 17b, and the guide pipes 25a, 25b, and 26 and the like used in the present embodiment.

In this embodiment, the first frequency may be 900 kHz or more and 5 MHz or less, and the second frequency may be less than 900 kHz. When the vibrator vibrates at a frequency of 900 kHz or more, a vibration width is small, so a relatively small amount of impurities can be removed, and the effect of the cavitation can be reduced, so a load applied to the substrate W can be reduced. On the other hand, when the vibrator vibrates at a frequency of less than 900 kHz, the vibration width is large, so a relatively large amount of impurities can be removed. As the difference between the first frequency and the second frequency is small, the difference in effects is also reduced. For this reason, as an example, the difference between the first frequency and the second frequency may be about 500 kHz, for example, 950 kHz may be used as the first frequency and 430 kHz may be used as the second frequency. In addition, the present embodiment is not limited thereto, and for example, 950 kHz may be used as the first frequency and 750 kHz as the second frequency.

In the case of adopting such an aspect, when the substrate processing apparatus of this embodiment is used together with the pencil cleaning apparatus, (1) the ultrasonic vibration is applied to the cleaning liquid at the second frequency to clean the substrate W, (2) then, the substrate W is cleaned using the pen cleaning member, (3) and then, the ultrasonic vibration is applied to the cleaning liquid at the first frequency to clean the substrate W. According to the aspect, first of all, a large amount of impurities are removed with the cleaning liquid applied with the ultrasonic vibration at the second frequency, and then the cleaning is performed with the pen cleaning member, and finally, a small amount of impurities can be removed with the cleaning liquid applied with the ultrasonic vibration at the first frequency. For this reason, the load applied to the pencil cleaning member can be reduced as compared with the prior art, and the lifespan of the pencil cleaning member can be extended.

In addition, as another aspect, (1) the substrate W may be cleaned using the pencil cleaning member, (1) then, the substrate W may be cleaned by applying the ultrasonic vibration to the cleaning liquid at the second frequency, (3) and then, the substrate W may be cleaned by applying the ultrasonic vibration to the cleaning liquid at the first frequency. Even in such an aspect, for the same reason as described above, the load applied to the pencil cleaning member can be reduced as compared with the prior art, and the lifespan of the pencil cleaning member can be extended.

In addition, as shown in FIGS. 44 and 45, when the vibrator 15 has the first vibrator 15a and the second vibrator 15b, the supply pipe 20 includes a first guide pipe 25a that guides the cleaning liquid vibrated by the first vibrator 15a, a second guide pipe 25b that guides the cleaning liquid vibrated by the second vibrator 15b, and a common guide pipe 26 that is connected to the first guide pipe 25a and the second guide pipe 25b and guides any of the cleaning liquids guided by the first guide pipe 25a and the second guide pipe 25b to a supply port 23. In the case of adopting such an aspect, it is possible to provide a plurality of guide pipes (the first guide pipe 25a and the second guide pipe 25b) only at a location at which vibrations of different frequencies are applied, and even in the case of adopting the plurality of vibrators such as the first vibrator 15a and the second vibrator 15b, it is possible to prevent the apparatus from becoming large to the utmost.

In this case, as shown in FIG. 44, an aspect in which the common guide pipe 26 is provided in the supply pipe holder 30 and the common guide pipe 26 communicates with the first extension 21 can be adopted.

In addition, as shown in FIG. 45, the common guide pipe 26 may also be provided between the supplier 10 and the first guide pipe 25a and the second guide pipe 25b. In this case, a switching module 27 such as a three-way valve may be provided between the supplier 10 and the first guide pipe 25a and the second guide pipe 25b. In such an aspect, the switching module 27 is appropriately switched by receiving a signal from the controller 50, and the cleaning liquid supplied from the supplier 10 is guided to either of the first guide pipe 25a or the second guide pipe 25b. It is to be noted that the cleaning liquid supplied from the supplier 10 may flow in both the first guide pipe 25a and the second guide pipe 25b and the cleaning liquid mixed with different frequencies may be supplied from the supply port 23.

Figure 46:
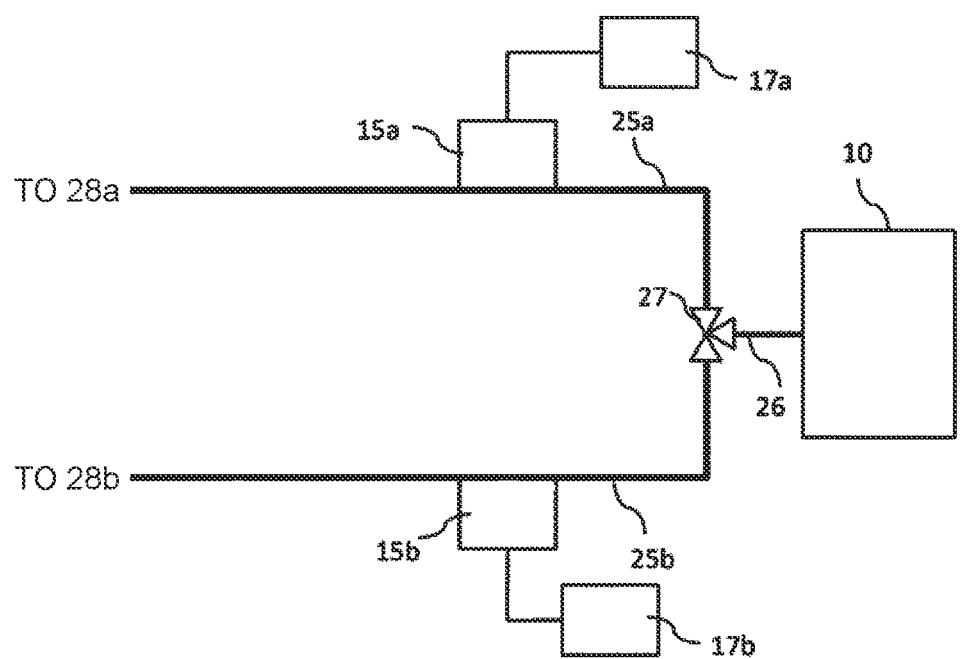
FIG. 46 is a view schematically showing a vibrator, a guide pipe and the like used in a modification of the eighth embodiment.

Unlike the aspect as described above, as shown in FIG. 46, two supply pipes may be provided (each of the first guide pipe 25a and the second guide pipe 25b serves as the supply pipe 20), the cleaning liquid to which the first vibrator 15a applies the ultrasonic vibration may be supplied from the supply port 28a of the first guide pipe 25a to the substrate W, and the cleaning liquid to which the second vibrator 15b applies the ultrasonic vibration may be supplied from the supply port 28b of the second guide pipe 25b to the substrate W. By adopting such an aspect, the cleaning liquid can be guided by the guide pipe having a "diameter" suitable for each frequency and supplied to the substrate W, such that the effect matching each frequency can be more reliably ensured.

It is described above that the eighth embodiment is substantially the same as the fifth embodiment, but even the eighth embodiment does not necessarily adopt the same aspect as the sixth embodiment and the seventh embodiment and the aspect described in the fifth embodiment.

In addition, the eighth embodiment may be combined with the sixth embodiment. For example, even in the eighth embodiment, an angle θ formed by the first direction in which the first extension 21 extends from the base end portion of the first extension 21 and the second direction in which the second extension 22 extends from the base end portion of the second extension 22 may be an obtuse angle.

In addition, the eighth embodiment may be combined with the seventh embodiment. For example, even in the eighth embodiment, the droplet guide module 45 extending along the first extension 21 may be provided under the first extension 21.

In addition, the eighth embodiment may be combined with the sixth embodiment and the seventh embodiment. For example, even in the eighth embodiment, an angle θ formed by the first direction in which the first extension 21 extends from the base end portion and the second direction in which the second extension 22 extends from the first extension 21 is an obtuse angle, and the droplet guide module 45 extending along the first extension 21 may be provided under the first extension 21.

Ninth Embodiment

Next, a ninth embodiment will be described.

In the ninth embodiment, a material of the supply pipe 20 is a material which makes the attenuation of the ultrasonic vibration difficult, and the controller 50 positions the supply pipe 20, which is positioned at a separation position, at a proximity position, prior to supplying a cleaning liquid to a substrate W. As the material which makes the attenuation of the ultrasonic vibration difficult, a material having a larger acoustic impedance than ultrapure water and excellent durability, for example, quartz may be used.

Figure 47:
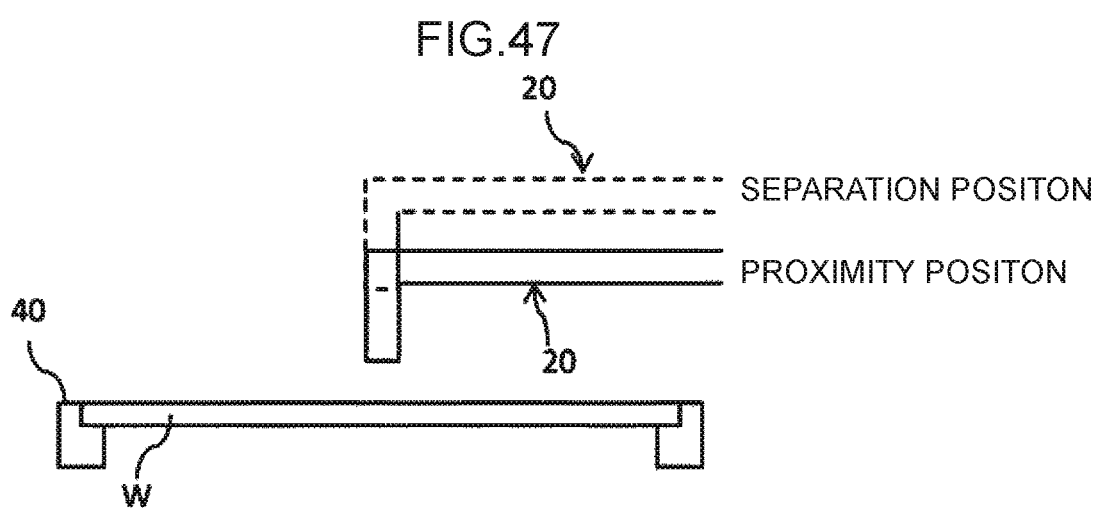
FIG. 47 is a side cross-sectional view for explaining a positional relationship between a supply pipe and a substrate in a ninth embodiment.
Figure 48:
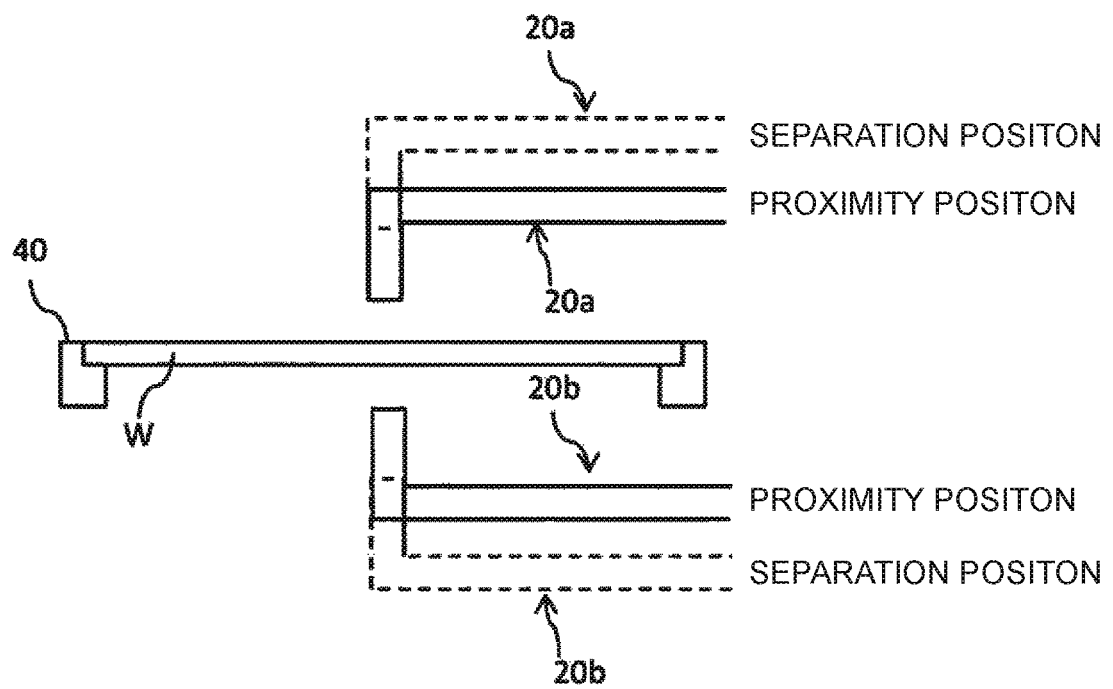
FIG. 48 is a side cross-sectional view for explaining a positional relationship between a supply pipe and a substrate in a modification of the ninth embodiment.

The "separation position" in the present embodiment means a position far from the substrate W in a normal direction of the surface of the substrate as compared with the "proximity position", and conversely the "proximity position" means a position close to the substrate W in the normal direction of the surface of the substrate as compared with the "separation position". As shown in FIG. 47, in an aspect in which one supply pipe 20 is provided above the substrate W, the supply pipe 20 can move in a vertical direction, and the case in which the supply pipe 20 is positioned above the substrate W is said to be at the "separation position", and the case in which the supply pipe 20 is positioned under the substrate W is said to be at the "proximity position". In addition, as shown in FIG. 48, in the aspect in which an upper supply pipe 20a is provided above the substrate W and a lower supply pipe 20b is provided under the substrate W, the case in which the upper supply pipe 20a is positioned above the substrate W is said to be at the "separation position" and the case in which the upper supply pipe 20a is positioned under the substrate W is said to be at the "proximity position", and conversely, the case in which the lower supply pipe 20b is positioned under the substrate W is said to be at the "separation position" and the case in which the lower supply pipe 20b is positioned above the substrate W is said to be at the "proximity position". In FIG. 47, the aspect in which the supply pipe 20 moves with respect to the substrate W is described above, but the present embodiment is not limited thereto, and a substrate support 40 can move in a vertical direction, and thus the substrate W may take the "separation position" and the "proximity position" with respect to the supply pipe 20, and both the supply pipe 20 and the substrate support 40 can move in the vertical direction and both the substrate W and the supply pipe 20 are appropriately positioned, and thus the substrate W may take the "separation position" and the "proximity position".

In the present embodiment, as shown in FIG. 47, a driver 90 such as an actuator for moving the supply pipe 20 in the vertical direction may be provided.

In the ninth embodiment, other configurations are substantially the same as those of the fifth embodiment.

As described above, according to the present embodiment, a material of the supply pipe 20 is a material which makes the attenuation of the ultrasonic vibration difficult, and the supply pipe 20, which is positioned at a separation position, is positioned at a proximity position, prior to supplying a cleaning liquid to a substrate W. Therefore, when the cleaning liquid is supplied to the substrate W, the supply pipe 20 made of the material which makes the attenuation of the ultrasonic vibration difficult guides the cleaning liquid to the vicinity of the substrate W to be able to supply the cleaning liquid to the substrate W.

In addition, when the process of supplying the cleaning liquid to the substrate W ends, the supply pipe 20 may be positioned at the separation position. By positioning the supply pipe 20 at the separation position as described above, it is possible to prevent the cleaning liquid and other liquids from adhering to the supply pipe 20 in an unexpected form.

In addition, when the process of supplying the cleaning liquid to the substrate Wends, the first extension 21 may swing about the swinging shaft 29 to be positioned at the standby position (see FIG. 40). The supply pipe 20 may be positioned at the separation position in the standby position.

Prior to supplying the cleaning liquid to the substrate W, in the case of supplying the cleaning liquid from the supplier 10 and discharging the cleaning liquid from the supply port 23 at the standby position toward, for example, the discharge liquid collector 70, the cleaning liquid is positioned at the proximity position. By positioning in the proximity position, it is possible to prevent the discharged cleaning liquid from being scattered inadvertently.

In the aspect shown in FIG. 47, the supply pipe 20 may be positioned at the separation position (upper position) in the standby position (see FIG. 40), positioned in the proximity position (lower position) in the standby position, and then may swing above the substrate W. By positioning the supply pipe 20 at the separation position in the standby position, it is possible to more reliably prevent the cleaning liquid and other liquids from adhering to the supply pipe 20 in an unexpected form. In addition, since the supply pipe 20 is positioned at the proximity position (lower position) in the standby position and then swings above the substrate W, when the supply pipe 20 swings and moves above the substrate W, the cleaning liquid can be supplied to the position close to the substrate W, such that the substrate W can be efficiently cleaned.

In addition, the supply pipe 20 is positioned at the separation position (upper position) in the standby position (see FIG. 40), and in that state, swings above the substrate W, and after the supply port 23 is positioned at the center of the substrate W, the supply pipe 20 may be positioned at the proximity position (lower position). According to this aspect, it can be expected that the cleaning liquid, other liquids and the like in the previous process can be prevented from adhering to the supply pipe 20 when the supply pipe 20 moves above the substrate W.

In addition, the supply pipe 20 is positioned at the proximity position (lower position) in the standby position (see FIG. 40) and positioned at the separation position (upper position) prior to swinging above the substrate W, and in that state, the supply pipe 20 swings above the substrate W, and after the supply port 23 is positioned at the center of the substrate W, the supply pipe 20 may be positioned in the proximity position (lower position). The reason for adopting such an aspect is that when the supply pipe 20 is at the standby position (see FIG. 40), the cleaning liquid and other liquids are less likely to adhere to the supply pipe 20 in an unexpected form.

Although the present embodiment is described with reference to FIG. 47, the controller 50 can perform the same control even in the aspect shown in FIG. 48. However, with respect to the lower supply pipe 20b positioned under the substrate W, the proximity position is the upper position and the separation position is the lower position. As in FIG. 47, the driver 90 such as the actuator for vertically moving each of the upper supply pipe 20a and the lower supply pipe 20b may be provided.

It is described above that the ninth embodiment is substantially the same as the fifth embodiment, but even the ninth embodiment does not necessarily adopt the same aspect as the sixth embodiment, the seventh embodiment, and the eighth embodiment and the aspect described in the fifth embodiment.

In addition, the ninth embodiment may be combined with the sixth embodiment. For example, even in the ninth embodiment, an angle θ formed by the first direction in which the first extension 21 extends from the base end portion of the first extension 21 and the second direction in which the second extension 22 extends from the base end portion of the second extension 22 may be an obtuse angle.

In addition, the ninth embodiment may be combined with the seventh embodiment. For example, even in the ninth embodiment, the droplet guide module 45 extending along the first extension 21 may be provided under the first extension 21.

In addition, the ninth embodiment may be combined with the eighth embodiment. For example, even in the ninth embodiment, the aspect in which the ultrasonic vibration is applied to the cleaning liquid by vibrating at a first frequency and a second frequency lower than the first frequency is adopted.

In addition, the ninth embodiment may be combined with the sixth embodiment and the seventh embodiment, may be combined with the sixth embodiment and the eighth embodiment, or may be combined with the seventh embodiment and the eighth embodiment. In addition, the ninth embodiment may be combined with the sixth embodiment, the seventh embodiment, and the eighth embodiment.

In addition, in each of the eighth embodiment and the ninth embodiment, the "method" is not specifically described, but as in the fifth embodiment, it is possible to provide the substrate processing method using all the aspects described in each of the eighth embodiment and the ninth embodiment. In addition, a program for executing the methods provided in each of the eighth embodiment and the ninth embodiment may be recorded on a recording medium. By reading this recording medium with a computer (not shown), the methods provided in each of the eighth embodiment and the ninth embodiment may be performed by the substrate processing apparatus.

The disclosure of each of the above-described embodiments and the disclosure of the modifications and drawings are merely an example for explaining the invention described in the claims, and the inventions described in the claims are not limited by the description of the above-described embodiments or the drawings.

The aspect of cleaning the entire surface of the substrate W is described above, but the present embodiment is not limited thereto, and can be used for the aspect of cleaning the bevel portion of the substrate W.

REFERENCE SIGNS LIST

10 Supplier
15 Vibrator
15a First vibrator
15b Second vibrator
20 Supply pipe
21 First extension
22 Second extension
23 Supply port
25a First guide pipe
25b Second guide pipe
26 Common guide pipe
29 Swinging shaft
45 Droplet guide module
50 Controller
70 Discharge liquid collector Means for Solving Problems of Fifth and Ninth Embodiments A substrate processing apparatus according to a fifth aspect includes
a supplier that supplies a cleaning liquid,
a vibrator that applies an ultrasonic vibration to the cleaning liquid supplied from the supplier,
a supply pipe that has a supply port and guides the cleaning liquid ultrasonically vibrated by the vibrator to supply the cleaning liquid from the supply port to a substrate, and a controller that supplies the cleaning liquid from the supplier prior to supplying the cleaning liquid to the substrate and discharges the cleaning liquid from the supply port at a standby position.

In the substrate processing apparatus according to the fifth aspect,
the supply pipe may include a first extension that extends in a direction orthogonal to a normal line to the substrate and a second extension that extends from the first extension toward the substrate in a normal direction of the substrate,
an end portion of the second extension may be provided with the supply port, and
the substrate processing apparatus may further include a swinging shaft for swingably supporting a base end portion of the first extension on a front side or a back side of the substrate.

In the substrate processing apparatus according to the fifth aspect,
a swinging speed of the supply pipe may be delayed when the supply port cleans a peripheral side region of the substrate as compared with when the supply port cleans a central side region of the substrate.

The substrate processing apparatus according to the fifth aspect may further include
a discharge liquid collector that collects the cleaning liquid discharged from the supply port at the standby position.

In the substrate processing apparatus according to the fifth aspect,
the supply pipe may be made of a material which makes the attenuation of the ultrasonic vibration difficult.

In the substrate processing apparatus according to the fifth aspect,
the controller may start to vibrate the vibrator after a lapse of a first period of time since the supply of the cleaning liquid from the supplier.

In the substrate processing apparatus according to the fifth aspect,
the controller may start to supply cleaning liquid from the supply port to the substrate, after a lapse of a second period of time longer than the first period of time since the supply of the cleaning liquid from the supplier.

A substrate processing apparatus according to a sixth aspect includes
a supplier that supplies a cleaning liquid,
a vibrator that applies an ultrasonic vibration to the cleaning liquid supplied from the supplier, and
a supply pipe that has a supply port and guides the cleaning liquid ultrasonically vibrated by the vibrator to supply the cleaning liquid from the supply port to a substrate,
wherein the supply pipe includes a first extension that extends in a horizontal direction and a second extension that extends in a vertical direction from the first extension, and
a tip side of the first extension is positioned higher than a base end portion side thereof.

In the substrate processing apparatus according to the sixth aspect,
a first direction in which the first extension extends from the base end portion of the first extension may be inclined with respect to the horizontal direction, and a distance along a normal direction of the substrate from a peripheral portion toward a central portion of the substrate may be long.

A substrate processing apparatus according to a seventh aspect includes
a supplier that supplies a cleaning liquid,
a vibrator that applies an ultrasonic vibration to the cleaning liquid supplied from the supplier, and
a supply pipe that has a supply port and guides the cleaning liquid ultrasonically vibrated by the vibrator to supply the cleaning liquid from the supply port to a substrate,
wherein the supply pipe includes a first extension that extends in a horizontal direction and a second extension that extends downwardly from the first extension, and
a droplet guide module that extends along the first extension is provided under the first extension.

In the substrate processing apparatus according to the seventh aspect,
the first extension may swing above the substrate about a swinging shaft, and the droplet guide module may support the first extension from below and swing together with the first extension.

A substrate processing apparatus according to an eighth aspect includes a supplier that supplies a cleaning liquid, a vibrator that applies an ultrasonic vibration to the cleaning liquid supplied from the supplier, and a supply pipe that has a supply port and guides the cleaning liquid ultrasonically vibrated by the vibrator to supply the cleaning liquid from the supply port to a substrate, wherein the vibrator may apply the ultrasonic vibration to the cleaning liquid by vibrating at a first frequency and a second frequency lower than the first frequency.

In the substrate processing apparatus according to the eighth aspect,

The vibrator may include a first vibrator that vibrates at the first frequency and a second vibrator that vibrates at the second frequency.

In the substrate processing apparatus according to the eighth aspect, the first frequency may be 900 kHz or more, and the second frequency may be less than 900 kHz.

In the substrate processing apparatus according to the eighth aspect, the supply pipe may include a first guide pipe that guides the cleaning liquid vibrated by the first vibrator, a second guide pipe that guides the cleaning liquid vibrated by the second vibrator, and a common guide pipe that is connected to the first guide pipe and the second guide pipe and guides any of the cleaning liquids guided by the first guide pipe and the second guide pipe to the supply port.

A substrate processing apparatus according to a ninth aspect includes a supplier that supplies a cleaning liquid, a vibrator that applies an ultrasonic vibration to the cleaning liquid supplied from the supplier, a supply pipe that has a supply port and guides the cleaning liquid ultrasonically vibrated by the vibrator to supply the cleaning liquid from the supply port to the substrate, and a controller that positions the supply pipe, which is positioned at a separation position, at a position close to the substrate or positions the substrate, which is positioned at the separation position, at a position close to the supply pipe, prior to supplying the cleaning liquid to a substrate, wherein a material of the supply pipe is a material which makes the attenuation of the ultrasonic vibration difficult.

Effects of Fifth to Ninth Embodiments

According to the fifth aspect, prior to supplying the cleaning liquid to the substrate, the cleaning liquid is supplied from the supplier and discharged from the supply port at the standby position. Therefore, the cleaning liquid having the low cleaning effect due to the introduction of oxygen or the like is discharged, and the cleaning liquid having the strong cleaning effect is applied with the ultrasonic vibration to be able to be used to clean the substrate. In addition, it is possible to clean the substrate with the cleaning liquid having the strong cleaning effect by being sufficiently applied with ultrasonic waves, instead of the cleaning liquid which is not sufficiently applied with the ultrasonic waves and is not high in the cleaning effect.

According to the sixth aspect, the tip side of the first extension is positioned higher than the base end portion side. Therefore, the droplets adhering to the supply pipe are guided to the base end portion side along the first extension. Therefore, it is possible to prevent droplets from dropping onto the substrate or other members in advance.

According to the seventh aspect, the droplet guide module that extends along the first extension is provided under the first extension. Therefore, the droplets adhering to the supply pipe are guided to the base end portion side along the droplet guide module. Therefore, it is possible to prevent droplets from dropping onto the substrate or other members in advance.

According to the eighth aspect, the vibrator includes the first vibrator that vibrates at the first frequency and the second vibrator that vibrates at the second frequency lower than the first frequency, such that it is possible to apply the ultrasonic vibration to the cleaning liquid at different frequencies. As a result, the detergency of the cleaning liquid can be changed depending on the applications.

According to the ninth aspect, the material of the supply pipe is a material which makes the attenuation of the ultrasonic vibration difficult, and prior to supplying the cleaning liquid to the substrate, the supply pipe positioned at the separation position is positioned the position close to the substrate or the substrate positioned at the proximity position is positioned at the position close to the supply pipe. Therefore, when the cleaning liquid is supplied to the substrate, the supply pipe made of the material which makes the attenuation of the ultrasonic vibration difficult guides the cleaning liquid to the position close to the substrate to be able to supply the cleaning liquid to the substrate.

Tenth Embodiment

The substrate cleaning apparatus often may not remove fine particles. In addition, if the substrate cleaning apparatus performs cleaning with contaminated, the substrate may be contaminated rather. Therefore, it cannot be said that such a substrate cleaning apparatus necessarily has sufficient performance. Also, the substrate drying apparatus described above may also be contaminated, and therefore it cannot be said that the substrate drying apparatus necessarily has sufficient performance.

The tenth to fourteenth embodiments have been made in view of such problems, and the objects of the tenth to fourteenth embodiments are to provide a high-performance substrate cleaning apparatus, substrate drying apparatus, and substrate processing apparatus and to provide a substrate cleaning method using the substrate cleaning apparatus.

In the tenth and fourteenth embodiments, new reference numerals are given to drawings, apart from the reference numerals of the preceding drawings.

Figure 49:
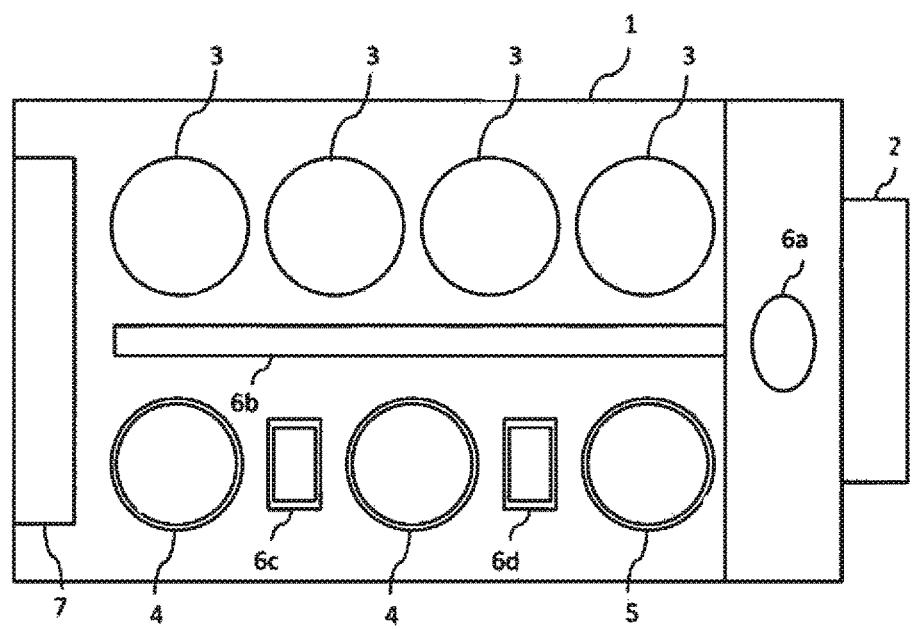
FIG. 49 is a schematic top view of a substrate processing apparatus according to one embodiment.

FIG. 49 is a schematic top view of a substrate processing apparatus according to one embodiment. According to the substrate processing apparatus of the present embodiment, in a manufacturing process of a magnetic film in a semiconductor wafer having a diameter of 300 mm or 450 mm, a flat panel, image sensors such as a complementary metal oxide semiconductor (CMOS) or a charge coupled device (CCD), and a magneto resistive random access memory (MRAM), various substrates can be processed.

The substrate processing apparatus includes a substantially rectangular housing 1, a load port 2 on which a substrate cassette for stocking a plurality of substrates is mounted, one or a plurality of (four in the aspect shown in FIG. 49) substrate polishing apparatuses 3, one or a plurality of (two in the aspect shown in FIG. 49) substrate cleaning apparatuses 4, a substrate drying apparatus 5, a conveyance mechanisms 6*a* to 6*d*, and a controller 7.

The load port 2 is disposed adjacent to the housing 1. The load port 2 may be mounted with an open cassette, a standard mechanical interface (SMIF) pod, or a front opening unified pod (FOUP). The SMIF pod and the FOUP are airtight containers that can have a substrate cassette received therein, and be covered with partition walls to maintain an environment independent of an external space. Examples of a substrate may include a semiconductor wafer or the like.

The substrate polishing apparatus 3 that polishes a substrate, the substrate cleaning apparatus 4 that cleans the polished substrate and the substrate drying apparatus 5 that dries the cleaned substrate are accommodated in the housing 1. The substrate polishing apparatus 3 is arranged along a longitudinal direction of the substrate processing apparatus, and the substrate cleaning apparatus 4 and the substrate drying apparatus 5 are also arranged along the longitudinal direction of the substrate processing apparatus.

In the present embodiment, the substrate cleaning apparatus 4 performs contact cleaning using a pen type cleaning tool and non-contact cleaning using ultrasonic cleaning water. As will be described in detail later, the contact cleaning using the pen type cleaning tool is to perform scrubbing a surface of a substrate by bringing the lower end contact surface of a columnar pencil type cleaning tool extending in a vertical direction into contact with the substrate under the presence of a cleaning liquid to the substrate and moving a cleaning tool in one direction while the cleaning tool rotates.

The substrate drying apparatus 5 may use a spin drying unit that dries the substrate by spraying IPA vapor from a moving spray nozzle toward the substrate horizontally rotating and dries the substrate by a centrifugal force generated by rotating the substrate a high speed.

The conveyance mechanism 6a is disposed in a region surrounded by the load port 2, the substrate polishing apparatus 3 located on a side of the load port 2, and the substrate drying apparatus 5. In addition, a conveyance mechanism 6b is disposed in parallel with the substrate polishing apparatus 3 and the substrate cleaning apparatus 4 and the substrate drying apparatus 5. The conveyance mechanism 6a receives a substrate before polishing from the load port 2 and conveys the substrate to the conveyance mechanism 6b or receives the dried substrate taken out from the substrate drying apparatus 5 from the conveyance mechanism 6b.

A conveyance mechanism 6c that conveys the substrate between the two substrate cleaning apparatuses 4 is disposed between the two substrate cleaning apparatuses 4, and the conveyance mechanism 6c that conveys the substrate between the substrate cleaning apparatus 4 and the substrate drying apparatus 5 is disposed between the substrate cleaning apparatus 4 and the substrate drying apparatus 5.

In addition, a controller 7 that controls a movement of each device of the substrate processing apparatus is disposed inside the housing 1. The present embodiment is described based on an aspect in which the controller 7 is disposed in the housing 1, but is not limited thereto, and the controller 7 may be disposed outside the housing 1.

Figure 50:
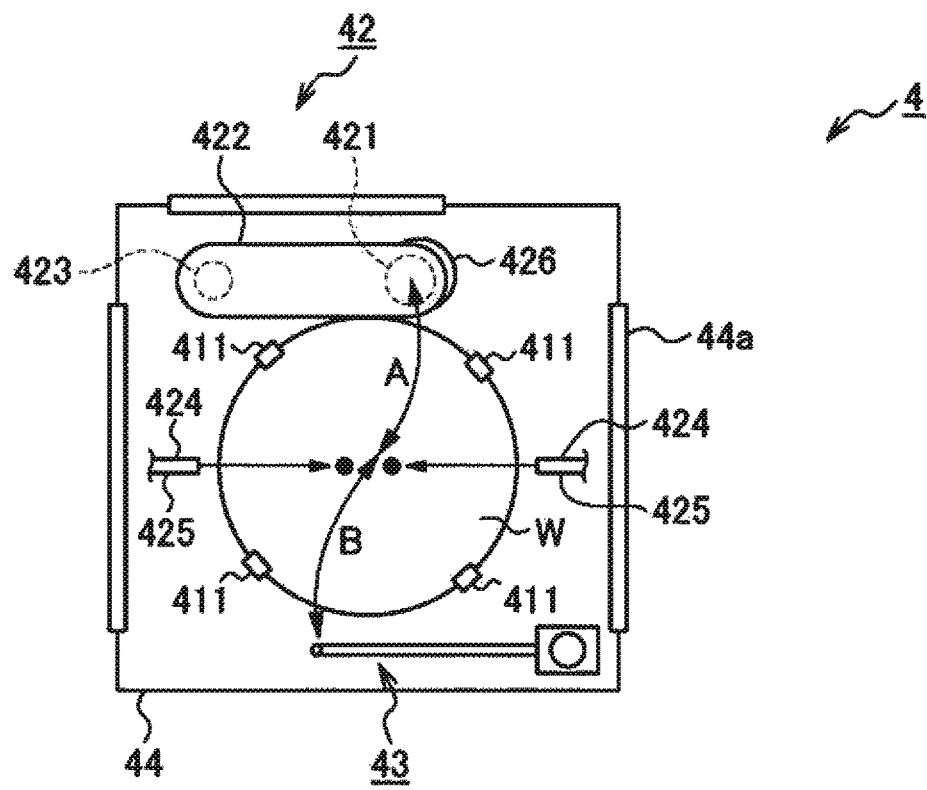
FIG. 50 is a plan view of a substrate cleaning apparatus 4 according to a tenth embodiment.
Figure 51:
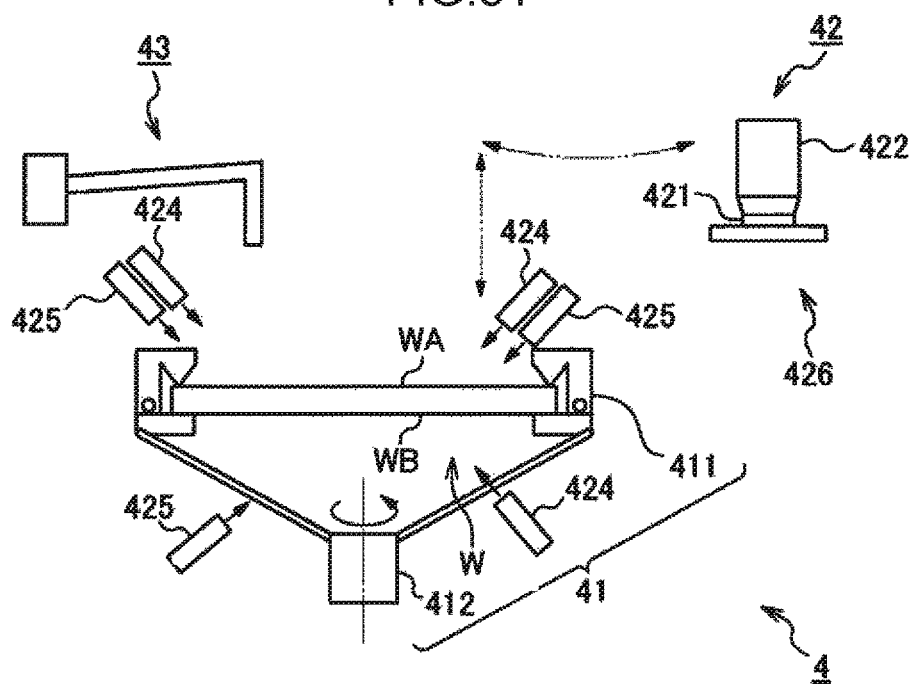
FIG. 51 is a side view of the substrate cleaning apparatus 4 according to the tenth embodiment.

FIGS. 50 and 51 each are a plan view and a side view of the substrate cleaning apparatus 4 according to the tenth embodiment. The substrate cleaning apparatus 4 includes a substrate holding and rotating mechanism 41, a pen cleaning mechanism 42, and an ultrasonic cleaning mechanism 43, which are accommodated in a casing 44 having a shutter 44a. In addition, each module in the substrate cleaning apparatus 4 is controlled by the controller 7 in FIG. 49.

The substrate holding and rotating mechanism 41 includes a chuck claw 411 and a rotary drive shaft 412.

The chuck claw 411 is a holding member that is provided to hold the substrate W by grasping an outer peripheral end portion (edge portion) of the substrate W to be cleaned. In the present embodiment, four chuck claws 411 are provided, and a gap is provided between adjacent chuck claws 411 so as not to hinder the movement of a robot hand (not shown) that conveys the substrate W. Each of the chuck claws 411 is connected to the rotary drive shaft 412 so that the surface of the substrate W can be held horizontally. In the present embodiment, the substrate W is held by the chuck claw 411 so that a front surface WA of the substrate W faces upward.

The rotary drive shaft 412 is configured to rotate about an axial line extending perpendicularly to the surface of the substrate W and rotate the substrate W in a horizontal plane by rotating about the axial line of the rotary drive shaft 412. A rotation direction or the number of revolutions of the rotary drive shaft 412 is controlled by the controller 7. The number of revolutions may be constant or may be variable.

In addition, in order to prevent scattering of the cleaning liquid or the ultrasonic cleaning liquid which will be described later, a rotating cup that covers the periphery of the substrate W and rotates in synchronization with the rotary drive shaft 412 may be provided outside the substrate holding and rotating mechanism 41 (more specifically, the chuck claw 411) (described later).

The pen cleaning mechanism 42 includes a pen type cleaning tool 421, an arm 422 that supports the pen type cleaning tool 421, a moving mechanism 423 that moves the arm 422, a cleaning liquid nozzle 424, a rinse liquid nozzle 425, and a cleaning apparatus 426.

The pen type cleaning tool 421 is, for example, a columnar PVA (for example, sponge) cleaning tool, and disposed above the substrate W held by the chuck claw 411 so that the axial line is perpendicular to the substrate W. The lower surface of the pen type cleaning tool 421 cleans the substrate W, and the upper surface thereof is supported by the arm 422.

The arm 422 is a flat bar-shaped member, and is typically arranged so that its longitudinal direction is parallel to the substrate W. The arm 422 supports the pen type cleaning tool 421 rotatably about its axial line at one end thereof and the moving mechanism 423 is connected to the other end thereof.

The moving mechanism 423 moves the arm 422 vertically, and swings the arm 422 in the horizontal plane. The swinging of the arm 422 in the horizontal direction by the moving mechanism 423 has an aspect in which a trajectory of the pen type cleaning tool 421 draws a circular arc about the other end of the arm 422. The moving mechanism 423 can swing the pen type cleaning tool 421 between a center of the substrate W and a retreated position on the outside of the substrate W as indicated by an arrow A. The moving mechanism 423 is controlled by the controller 7.

The cleaning liquid nozzle 424 supplies a cleaning liquid such as a chemical liquid and pure water when the substrate W is cleaned with the pen type cleaning tool 421. The rinse liquid nozzle 425 supplies the rinse liquid such as the pure water to the substrate W. It is desirable to provide the cleaning liquid nozzle 424 and the rinse liquid nozzle 425 not only for the front surface WA of the substrate W but also for the back surface WB. The supply timing and supply amount of the cleaning liquid and the rinse liquid are controlled by the controller 7.

The cleaning apparatus 426 is disposed outside the arrangement position of the substrate W, and the moving mechanism 423 can move the pen type cleaning tool 421 onto the cleaning apparatus 426. The cleaning apparatus 426 cleans the pen type cleaning tool 421.

In the pen cleaning mechanism 42 described above, a lower surface of the pen type cleaning tool 421 comes into contact with the front surface WA of the substrate W to swing the arm 422 while the cleaning liquid is supplied from the cleaning liquid nozzle 424 onto the substrate W in the state in which the substrate W is rotating, such that the substrate W is physically contacted and cleaned.

The ultrasonic cleaning mechanism 43 is disposed on the opposite side to the pen cleaning mechanism 42, with the substrate W sandwiched therebetween.

Figure 52:
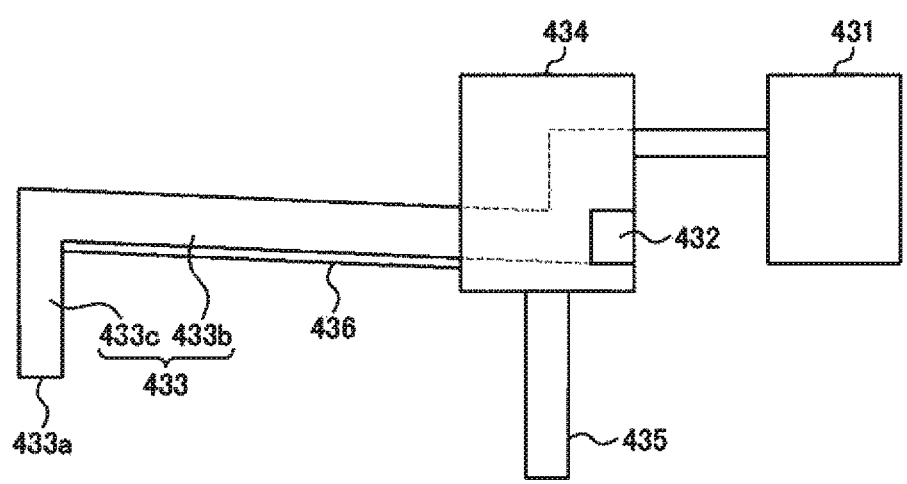
FIG. 52 is a side view of an ultrasonic cleaning mechanism 43.

FIG. 52 is a side view of the ultrasonic cleaning mechanism 43. The ultrasonic cleaning mechanism 43 includes a cleaning liquid supplier 431, a vibrator 432, a supply pipe 433, a holder 434, a swinging shaft 435, and a droplet guide module 436. The ultrasonic cleaning mechanism 43 performs non-contact cleaning on the substrate by using the cleaning liquid (hereinafter, also referred to as an ultrasonic cleaning liquid) to which ultrasonic waves are applied.

The cleaning liquid supplier 431 supplies the cleaning liquid such as the pure water. The vibrator 432 applies the ultrasonic vibration to the cleaning liquid from the cleaning liquid supplier 431. The frequency of the applied ultrasonic vibration may be a constant frequency or may be selected from a plurality of frequencies (for example, a high frequency of about 900 kHz and a low frequency of about 430 kHz). Generally, the higher the frequency of the applied ultrasonic wave, the more suitable for removing fine particles, and conversely, the lower the frequency, the more suitable for removing large particles.

The supply pipe 433 guides the ultrasonic cleaning liquid and supplies the cleaning liquid from a supply port 433a at the tip thereof to the substrate W. The ultrasonic cleaning liquid is supplied onto the substrate W in a spot form, such that the substrate W is cleaned in a non-contact manner. The holder 434 holds the vibrator 432 and the base end portion side of the supply pipe 433. The swinging shaft 435 extends downward from the bottom of the holder 434, and by swinging the holder 434, as shown by the arrow B in FIG. 50, the supply port 433a of the supply pipe 433 swings between the center of the substrate W and the retreated position on the outer side of the substrate W.

The timing at which the cleaning liquid supplier 431 supplies the cleaning liquid or the supply amount of the cleaning liquid, the timing or the frequency of the ultrasonic wave at which the vibrator 432 applies ultrasonic vibration, and the timing or speed at which the swinging shaft 435 swings the supply pipe 433 are driven and controlled by the controller 7.

The supply pipe 433 will be described in detail. As the material of the supply pipe 433, for example, quartz, stainless steel or the like can be used. In particular, quartz is suitable because it is difficult to attenuate the ultrasonic vibration.

The supply pipe 433 is constituted by a first extension 433b that extends from the vibrator 432 side and a second extension 433c that extends downward (for example, vertically downward) from the tip thereof, and the tip of the second extension 433c may be provided with the supply port 433a. Here, although the first extension 433b may extend in the horizontal direction, it is preferable that the first extension 433b is inclined so as to be lower toward the vibrator 432 and higher toward the second extension 433c. In other words, it is preferable that an angle formed by the first extension 433b and the second extension 433c is an acute angle. As a result, it is possible to suppress oxygen or the like from infiltrating from the supply port 433a into the supply pipe 433, and prevent detergency from being lowered due to the dissolved oxygen in the cleaning liquid.

In addition, by inclining the first extension 433b, droplets adhered to the lower portion of the first extension 433b flow toward the vibrator 432, and it is possible to prevent droplets from dropping onto the substrate W or other members. In addition, by providing the droplet guide module 436 extending along the first extension 433b, even if the droplets adhering to the lower portion of the first extension 433b drops, this droplets are guided to the vibrator 432 along the droplet guide module 436 to prevent droplets from dropping onto the substrate W and other members.

In addition, the holder 434 may hold the first extension 433b to be rotatable about the longitudinal axis thereof. As a result, the angle of the supply port 433a with respect to the substrate can be adjusted. For example, when it is desired to store the cleaning liquid on the substrate W, the holder 434 is enough to hold the supply pipe 433 at an angle at which the cleaning liquid is supplied toward the opposite side to the rotation direction of the substrate W. On the other hand, when it is desired to supply the ultrasonic cleaning liquid to the substrate W without a resistance, the holder 434 is enough to hold the supply pipe 433 at an angle at which the ultrasonic cleaning liquid is supplied along the rotation direction of the substrate W.

It is to be noted that the angle at which the supply pipe 433 is held by the holder 434 may be changed manually or may be automatically changed upon receiving the signal from the controller 7. In the case in which the angle is automatically changed in response to receiving the signal from the controller 7, the angle held by the supply pipe 433 may be sequentially changed according to a recipe.

The supply pipe 433 swings above the substrate W at the time of cleaning the substrate, and stands at the outside of the position where the substrate W is held during standby. It is preferable to perform "first-out" at the standby position before the substrate cleaning starts. The "first-out" is to discharge the cleaning liquid from the supply pipe 433 for a predetermined time without operating the vibrator 432. Oxygen may be dissolved in the cleaning liquid during standby, and such a cleaning liquid is inferior in detergency. Therefore, after discharging such a cleaning liquid in advance, the supply pipe 433 moves to the upper side of the substrate W, and the vibrator 432 applies the ultrasonic vibration to the cleaning liquid to supply the ultrasonic cleaning liquid, thereby efficiently performing the cleaning.

In this embodiment, in the substrate processing apparatus shown in FIG. 49, it is mainly assumed that the substrate polishing apparatus 3 polishes the surface of the substrate W before the substrate cleaning apparatus 4 cleans the surface of the substrate W. Therefore, the surface of the substrate W is flattened to some extent at the time of cleaning the substrate, and the aspect ratio (the ratio of the height to the line width of the pattern) of the pattern wiring or the like is not so large. Therefore, a pattern wiring hardly collapses even if the ultrasonic cleaning is performed.

In the present embodiment, the substrate cleaning apparatus 4 includes both the pen cleaning mechanism 42 and the ultrasonic cleaning mechanism 43. Therefore, the following operation is possible.

First, it is possible to use both the contact cleaning and the non-contact cleaning. The contact cleaning by the pen cleaning mechanism 42 and the non-contact cleaning by the ultrasonic cleaning mechanism 43 may be performed simultaneously. The fine particles of the substrate W may not be removed only by the contact cleaning by the pen type cleaning tool 421, but the vibration is transmitted to the particles by supplying the ultrasonic cleaning liquid from the supply port 433a and the removal of the particle by the pen type cleaning tool 421 can be assisted. For example, when the ultrasonic cleaning liquid is supplied to a certain position on the substrate W, particles float up, and the pen type cleaning tool 421 slides at this position to remove the particles.

In addition, the contact cleaning and the non-contact cleaning may be performed in order. As an example, first, the contact cleaning using the cleaning liquid from the cleaning liquid nozzle 424 is performed. As a result, large particles can be removed. Subsequently, the supply of the cleaning liquid from the cleaning liquid nozzle 424 stops, and the non-contact cleaning using the ultrasonic cleaning liquid is performed as the finish cleaning. As a result, fine particles can be removed.

Fine (less than 100 nm) particles derived from the pen type cleaning tool 421 or slurry (nanosilica or the like) may be often generated by the contact cleaning using the pen type cleaning tool 421. Even in such a case, by performing the non-contact cleaning subsequent to the contact cleaning, fine particles can also be reliably removed.

As another example, first, the non-contact cleaning using a low frequency (for example, 430 kHz) ultrasonic cleaning liquid is performed to remove large particles as much as possible. Subsequently, the supply of the ultrasonic cleaning liquid stops, and the contact cleaning is performed using the cleaning liquid from the cleaning liquid nozzle 424. Since the contact cleaning is performed in the state in which large particles are removed, the lifespan of the pen type cleaning tool 421 is extended. Thereafter, the non-contact cleaning is performed using a high-frequency (for example, 900 kHz) ultrasonic cleaning liquid to remove fine particles.

Also, the non-contact cleaning by the ultrasonic cleaning liquid can be applied for rinsing. The pen cleaning mechanism 42 sometimes performs the contact cleaning using the chemical liquid as the cleaning liquid. In this case, rinsing is required before conveying the substrate W to the next process. In the present embodiment, after the contact cleaning is performed using the chemical liquid, by performing the non-contact cleaning using the ultrasonic cleaning liquid in which the ultrasonic waves are applied to pure water, it is possible to perform the rinsing treatment while performing the cleaning.

In addition, the ultrasonic cleaning mechanism 43 uses that the supply pipe 433 can swing (that is, the ultrasonic cleaning liquid can be supplied from the supply pipe 433 to a position different from the cleaning liquid supplied from the cleaning liquid nozzle 424), and it is possible to clean a position at which cleaning is difficult with the pen type cleaning tool 421 when cleaning the substrate.

Figure 53:
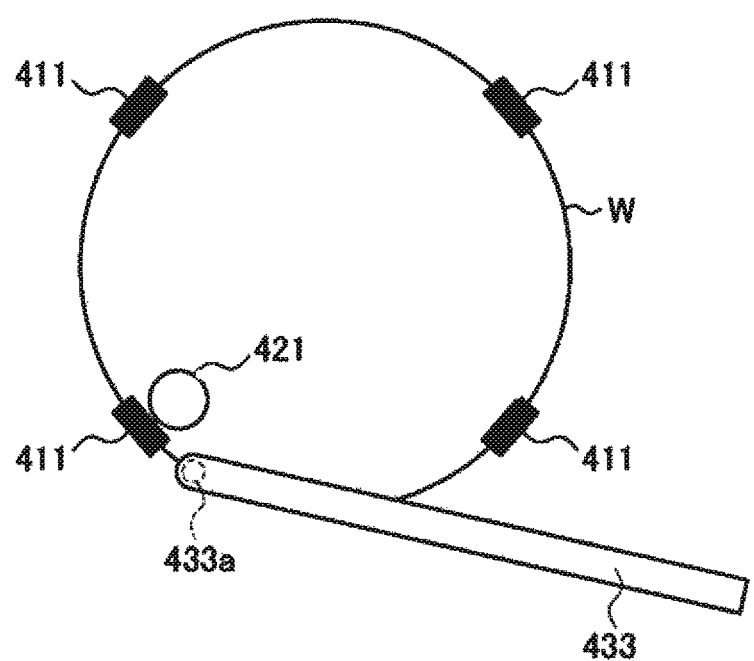
FIG. 53 is a top view showing a state in which a chuck claw 411 holds a substrate W.

For example, as shown in the top view of FIG. 53, since the chuck claw 411 holds the edge portion of the substrate W, the pen type cleaning tool 421 can not clean the edge of the substrate W due to the presence of the chuck claw 411. As shown in the drawing, the supply pipe 433 swings so that the supply port 433a of the supply pipe 433 is positioned on the edge of the substrate W to supply the ultrasonic cleaning liquid to the edge (that is, a region in which the pen type cleaning tool 421 can not be cleaned) of the substrate W. As a result, a portion (a portion where the pen type cleaning tool 421 does not interfere with the chuck claw 411) other than the edge of the substrate W can be subjected to the contact cleaning, and the edge of the substrate W can be subjected to the non-contact cleaning.

Figure 54A:
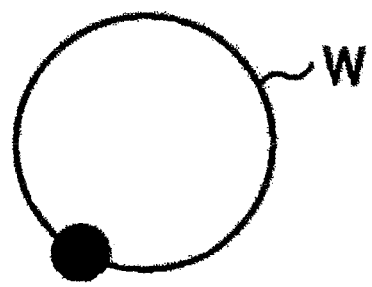
FIG. 54A is a top view showing a state of cleaning a bevel of the substrate W.
Figure 54B:
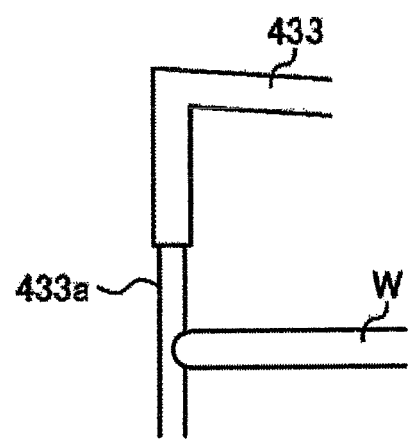
FIG. 54B is a side view showing a state of cleaning the bevel of the substrate W.

In addition, as shown in the top view in FIG. 54A and the side view in FIG. 54B, the supply pipe 433 may drop a part of the ultrasonic cleaning liquid onto the edge of the substrate W and drop another part of the ultrasonic cleaning liquid onto the outside of the substrate W to supply the ultrasonic cleaning liquid. As a result, the bevel of the substrate W can be cleaned.

When the edge or the bevel of the substrate W is cleaned, that is, when the ultrasonic cleaning liquid is supplied to the vicinity of the outer periphery of the substrate W, as compared with the case in which the ultrasonic cleaning liquid is supplied to the inside of the substrate W, it is preferable that the rotary drive shaft 412 rotates the substrate W at a low speed. The edge or the bevel of the substrate W means, for example, a portion about 5 mm wide from the periphery of the substrate W.

Figure 55:
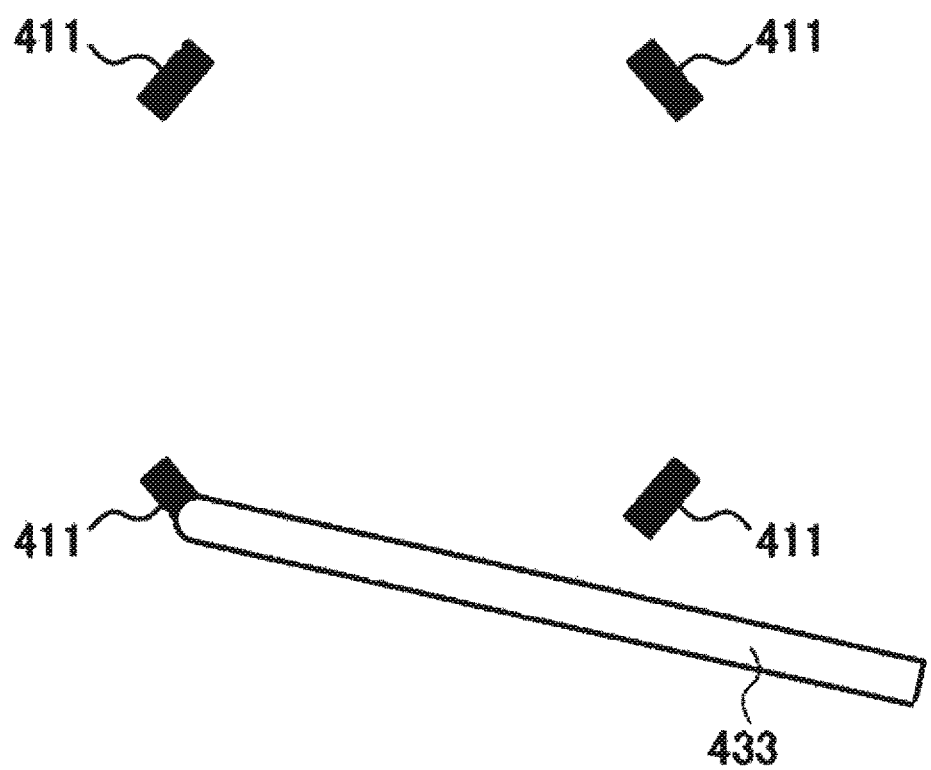
FIG. 55 is a top view showing a state of cleaning the chuck claw 411.

In addition, the ultrasonic cleaning mechanism 43 may clean not only the substrate W but also the substrate cleaning apparatus 4 itself. For example, as shown in a top view in FIG. 55, the ultrasonic cleaning mechanism 43 may supply the ultrasonic cleaning liquid from the supply pipe 433 to the chuck claw 411 to clean the chuck claw 411. In addition, the ultrasonic cleaning mechanism 43 may clean the casing 44 (in particular, a bottom surface of the casing) by supplying the ultrasonic cleaning liquid to the casing 44. In addition, when the substrate holding and rotating mechanism 41 has the rotating cup provided outside the chuck claw 411 (a detailed configuration will be described later), the ultrasonic cleaning mechanism 43 may supply the ultrasonic cleaning liquid to the rotating cup (in particular, the inner surface or the bottom surface of the rotating cup) to clean the rotating cup. In addition, the ultrasonic cleaning mechanism 43 may supply the ultrasonic cleaning liquid to the pen type cleaning tool 421 to clean the pen type cleaning tool 421 as follows.

Figure 56:
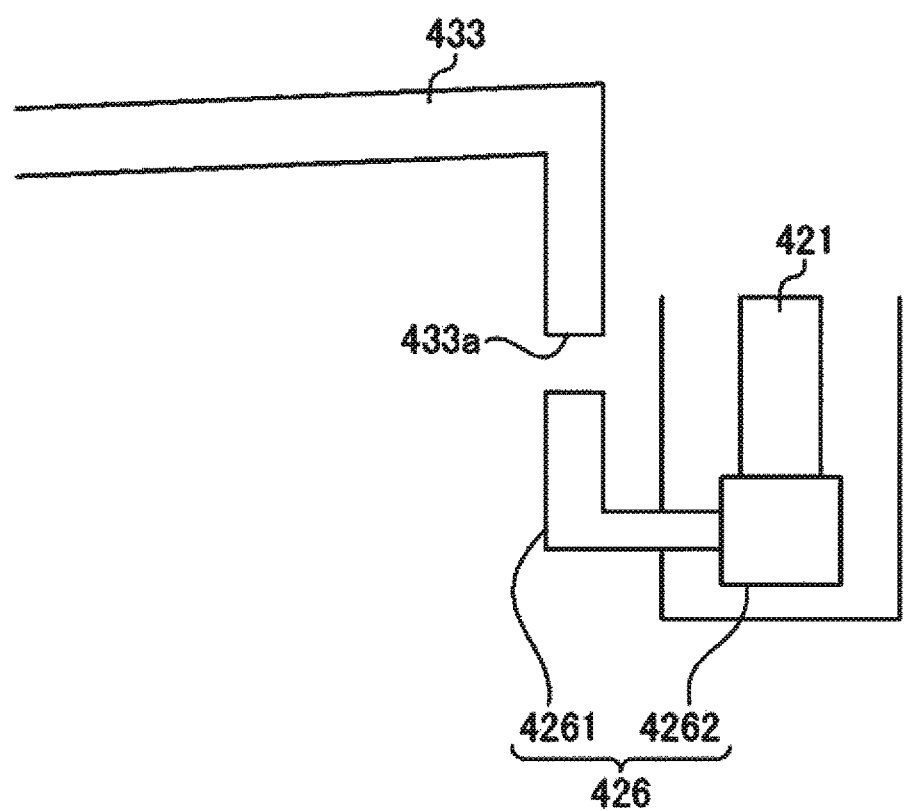
FIG. 56 is a view showing a schematic configuration of a cleaning apparatus 426.

FIG. 56 is a diagram showing a schematic configuration of the cleaning apparatus 426. The cleaning apparatus 426 has an L shape and has a water conduit 4261 made of a material such as quartz that is difficult to attenuate the ultrasonic vibration and a cleaning cup 4262.

When the pen type cleaning tool 421 is cleaned, the supply pipe 433 swings so that the supply port 433a moves above the water conduit 4261. In this case, for example, since a diameter of the water conduit 4261 is slightly larger than the size of the supply port 433a, the supply port 433a and the water conduit 4261 may be connected or engaged with each other. The ultrasonic cleaning liquid is supplied from the supply port 433a to the water conduit 4261, and the water conduit 4261 guides the ultrasonic cleaning liquid to the cleaning cup 4262. In addition, as the arm 422 swings and descends, the lower portion of the pen type cleaning tool 421 enters the cleaning cup 4262. As a result, in the cleaning cup 4262, the pen type cleaning tool 421 is cleaned with the ultrasonic cleaning liquid. In addition, since the position of the supply pipe 433 and the angle at which the cleaning liquid is sprayed can be adjusted and the discharge speed of the ultrasonic cleaning liquid can be changed, it is also possible to clean the members such as the casing 44.

As described above, in the tenth embodiment, the substrate cleaning apparatus 4 includes both the pen cleaning mechanism 42 and the ultrasonic cleaning mechanism 43. Therefore, it is possible to improve detergency by combining both of the pen cleaning mechanism 42 and the ultrasonic cleaning mechanism 43. In addition to the substrate cleaning, it is also possible to clean the substrate cleaning apparatus 4 itself such as the chuck claw 411, the pen type cleaning tool 421, the casing 44, and the like. From the above description, a higher performance substrate cleaning apparatus 4 is realized.

The present embodiment describes the pen cleaning mechanism 42 using the pen type cleaning tool 421, but the roll cleaning mechanism performing the contact cleaning using the roll type cleaning tool may be applied. The roll cleaning apparatus performs brings the roll cleaning member linearly extending substantially over the whole length of the diameter of the substrate W into contact with the substrate W under the presence of the cleaning liquid to perform the scrubbing cleaning on the surface of the substrate while the roll cleaning members rotates on a central axis parallel to the substrate.

Eleventh Embodiment

The first substrate cleaning apparatus described above includes the cleaning mechanism for performing the contact cleaning using the cleaning tool and the ultrasonic cleaning mechanism 43 for performing the ultrasonic cleaning. On the other hand, in the eleventh embodiment described below, the substrate cleaning apparatus includes the cleaning mechanism for performing the two-fluid jet cleaning and the ultrasonic cleaning mechanism. Hereinafter, differences from the tenth embodiment will be mainly described.

Figure 57:
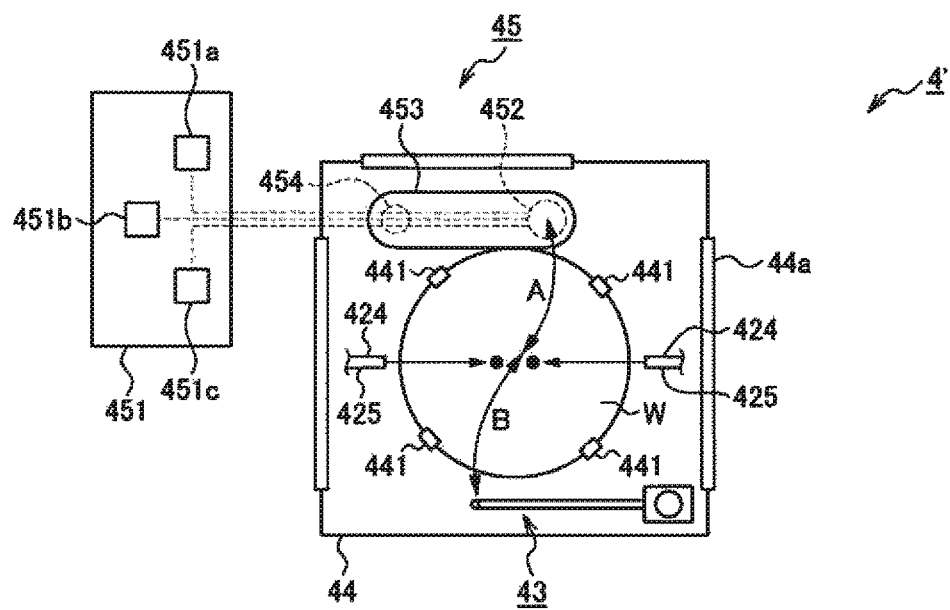
FIG. 57 is a plan view of a substrate cleaning apparatus 4' according to an eleventh embodiment.
Figure 58:
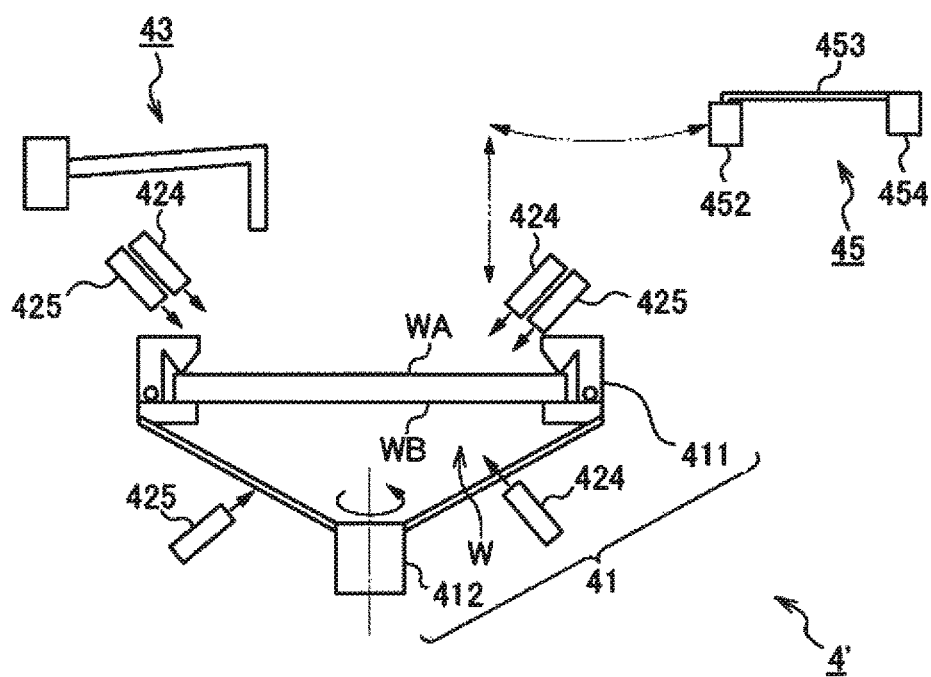
FIG. 58 is a side view of the substrate cleaning apparatus 4' according to the eleventh embodiment.

FIGS. 57 and 58 each are a plan view and a side view of a substrate cleaning apparatus 4' according to the eleventh embodiment. The substrate cleaning apparatus 4' includes a two-fluid jet cleaning mechanism 45 in place of the pen cleaning mechanism 42 in FIGS. 50 and 51. The two-fluid jet cleaning mechanism 45 includes a two-fluid jet supply unit 451, a two-fluid nozzle 452 that supplies a two-fluid jet onto an upper surface of a substrate W, a nozzle arm 453 that holds the two-fluid nozzle 452, and a moving mechanism 454 that swings and lifts the nozzle arm 453.

The two-fluid jet supply unit 451 has a first gas supply source 451a, a second gas supply source 451b, and a liquid supply source 451c. The first gas supply source 451a supplies first gas to the two-fluid nozzle 452. The second gas supply source 451b supplies second gas having a higher pressure than the first gas to the two-fluid nozzle 452.

The first gas and the second gas may be the same or different. The liquid supply source 451c supplies a liquid such as pure water to the two-fluid nozzle 452.

Figure 59:
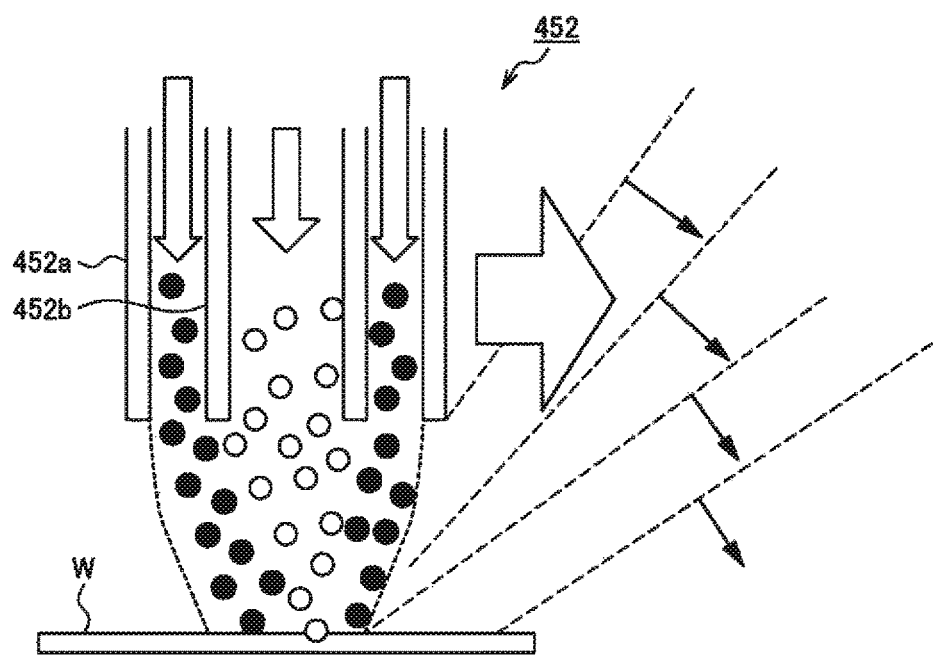
FIG. 59 is a cross-sectional view schematically showing a two-fluid nozzle 452.

FIG. 59 is a cross-sectional view schematically showing the two-fluid nozzle 452. The two-fluid nozzle 452 has a first spray nozzle 452a provided at the center thereof and a second spray nozzle 452b so as to surround the same. The first gas and the liquid from the first gas supply source 451a and the liquid supply source 451c, respectively, are supplied to the first spray nozzle 452a, and are mixed to form a first two-fluid jet. In addition, the high-pressure second gas and the liquid from the second gas supply source 451b and the liquid supply source 451c, respectively, are supplied to the second spray nozzle 452b, and are mixed to form a second two-fluid jet.

As shown in FIG. 59, since the second gas has a higher pressure, there is a speed difference between the first two-fluid jet and the second two-fluid jet. Thus, the second two-fluid jet is focused by coming into contact with the first two-fluid jet. Since the second two-fluid jet is focused in this way, an incident angle of an impact wave on the surface of the substrate W becomes large (approaches 90°), and as a result, the impact wave hit particles present in a minute recess formed on the surface of the substrate W to remove these particles.

Returning to FIGS. 57 and 58, a two-fluid nozzle 452 is attached to one end of the nozzle arm 453, and a moving mechanism 454 is connected to the other end thereof. As indicated by the arrow A, the moving mechanism 454 can swing the two-fluid nozzle 452 between a center of the substrate W and a retreated position outside the substrate W. The moving mechanism 454 is controlled by the controller 7.

The substrate cleaning apparatus 4' described above cleans the substrate W as follows. That is, the two-fluid nozzle 452 supplies the first and second two-fluid jets to the upper surface of the substrate W while swinging above the substrate W in the state in which the substrate holding and rotating mechanism 41 rotates the substrate W. As a result, the upper surface of the substrate W is cleaned by the two-fluid jet. In particular, it is possible to remove fine particles having a size of 100 nm or less present in recesses such as a step difference of a pattern wiring and a surface scratch. Cleaning using the two-fluid jet as described above is called two-fluid jet cleaning or two-fluid cleaning.

The present embodiment includes the two-fluid jet cleaning mechanism 45 instead of the pen cleaning mechanism 42 in the tenth embodiment, but can be operated in the same manner as in the tenth embodiment. That is, it is possible to perform the cleaning by the two-fluid jet cleaning mechanism 45 and the non-contact cleaning by the ultrasonic cleaning mechanism 43 simultaneously or sequentially. In addition, by using the ultrasonic cleaning liquid in which the ultrasonic vibration is applied to pure water, the ultrasonic cleaning mechanism 43 can perform rinsing while cleaning. In addition, the ultrasonic cleaning mechanism 43 may clean the edge or the bevel of the substrate W, or may clean the chuck claw 411, the casing 44, the cup and the like.

As described above, in the eleventh embodiment, the substrate cleaning apparatus 4' includes both of the two-fluid jet cleaning mechanism 45 and the ultrasonic cleaning mechanism 43. Therefore, it is possible to improve detergency by combining both of the two-fluid jet cleaning mechanism 45 and the ultrasonic cleaning mechanism 43. Besides the substrate cleaning, it is also possible to clean the substrate cleaning apparatus 4' itself.

Twelfth Embodiment

In a twelfth embodiment to be described below, a substrate cleaning apparatus includes an ozone water cleaning mechanism that performs ozone water cleaning and an ultrasonic cleaning mechanism 43.

Figure 60:
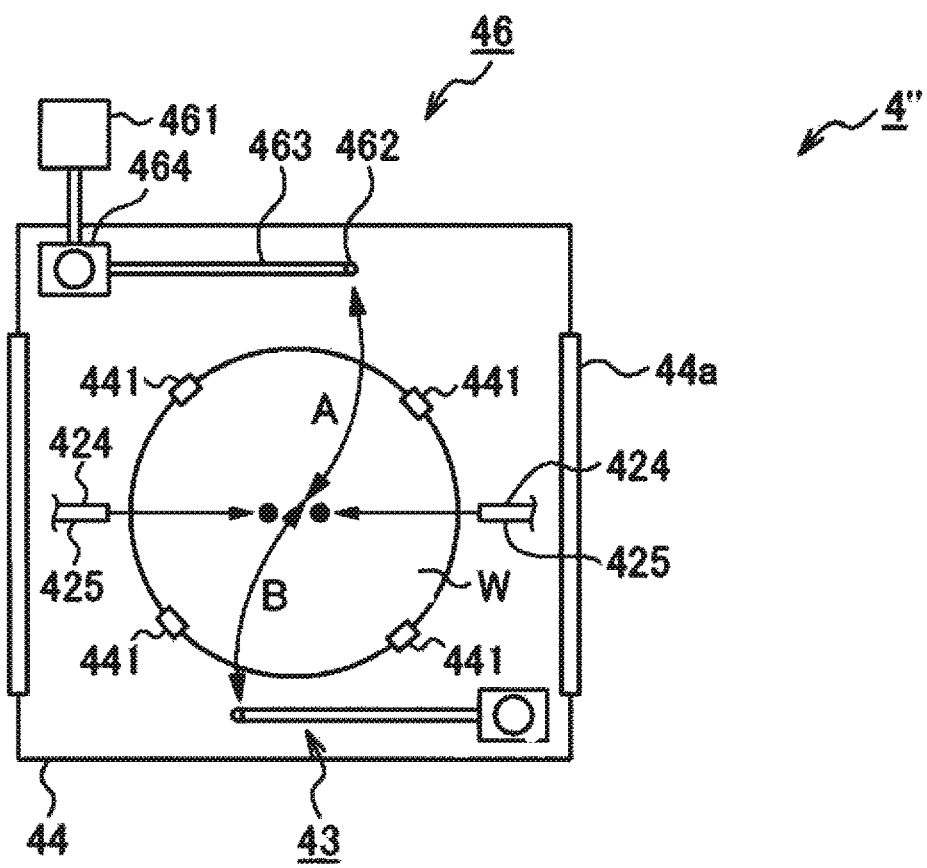
FIG. 60 is a plan view of a substrate cleaning apparatus 4" according to a twelfth embodiment.

FIG. 60 is a plan view of a substrate cleaning apparatus 4" according to a twelfth embodiment. The substrate cleaning apparatus 4" includes an ozone water cleaning mechanism 46 in place of the two-fluid cleaning mechanism 45 in FIGS. 57 and 58. The ozone water cleaning mechanism 46 includes an ozone water supply unit 461, an ozone water nozzle 462 that supplies ozone water to an upper surface of a substrate W, a nozzle arm 463 that holds the ozone water nozzle 462, and a moving mechanism 464 that swings and lifts the nozzle arm 463. In the ozone water cleaning mechanism 46, it can be considered that the two-fluid jet supply unit 451 in the two-fluid jet cleaning mechanism 45 of FIGS. 57 and 58 is replaced by the ozone water supply unit 461.

The ozone water supply unit 461 generates ozone gas by discharge using, for example, oxygen gas as a main material, and supplies ozone water obtained by dissolving the ozone gas in water to the ozone water nozzle 462. As a detailed configuration example of the ozone water supply unit 461, one described in the above-mentioned Patent Literature 4 can be adopted.

The ozone water nozzle 462 is attached to one end of the nozzle arm 463, and the moving mechanism 464 is connected to the other end thereof. As indicated by the arrow A, the moving mechanism 464 can swing the ozone water nozzle 462 between a center of the substrate Wand a retreated position outside the substrate W. The moving mechanism 464 is controlled by the controller 7.

The ozone water is supplied to the upper surface of the substrate W while the ozone water nozzle 462 swings above the substrate W in the state in which the substrate W rotates by the substrate holding and rotating mechanism 41. As a result, the upper surface of the substrate W is cleaned by the ozone water.

The present embodiment includes the ozone water cleaning mechanism 46 in place of the pen cleaning mechanism 42 in the tenth embodiment or the two-fluid jet cleaning mechanism 45 in the eleventh embodiment, but can be operated in the same manner as the first and eleventh embodiments.

That is, it is possible to perform the cleaning by the ozone water cleaning mechanism 46 and the non-contact cleaning by the ultrasonic cleaning mechanism 43 simultaneously or sequentially. In addition, by using the ultrasonic cleaning liquid in which the ultrasonic vibration is applied to pure water, the ultrasonic cleaning mechanism 43 can perform rinsing while cleaning. In addition, the ultrasonic cleaning mechanism 43 may clean the edge or the bevel of the substrate W, or may clean the chuck claw 411, the casing 44, the cup and the like.

As described above, in the twelfth embodiment, the substrate cleaning apparatus 4" includes both of the ozone water cleaning mechanism 46 and the ultrasonic cleaning mechanism 43. Therefore, it is possible to improve detergency by combining both of the water cleaning mechanism 46 and the ultrasonic cleaning mechanism 43. Besides the substrate cleaning, it is also possible to clean the substrate cleaning apparatus 4" itself.

Thirteenth Embodiment

In the above-described first to twelfth embodiments, the substrate cleaning apparatus includes the ultrasonic cleaning mechanism. On the other hand, in the thirteenth embodiment described below, a substrate drying apparatus 5 includes an ultrasonic cleaning mechanism. Hereinafter, differences from the first to third embodiments will be mainly described.

Figure 61:
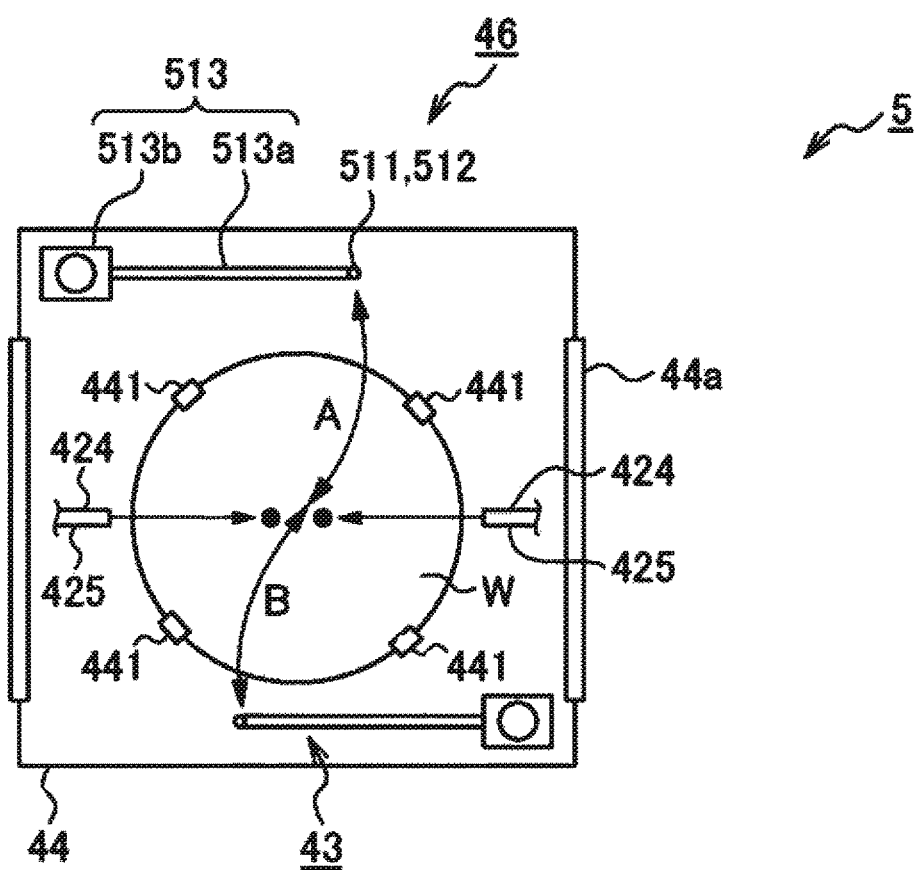
FIG. 61 is a plan view of a substrate drying apparatus 5 according to a thirteenth embodiment.
Figure 62:
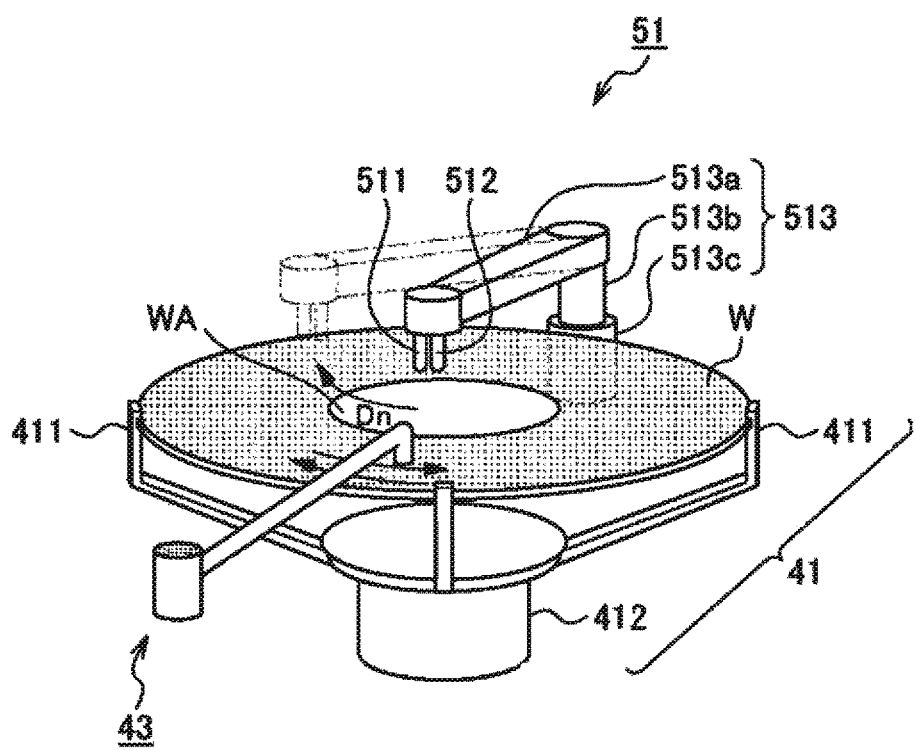
FIG. 62 is a perspective view of the substrate drying apparatus 5 according to the thirteenth embodiment.

FIGS. 61 and 62 each are a plan view and a perspective view of the substrate drying apparatus 5 according to the thirteenth embodiment. The substrate drying apparatus 5 has a substrate holding and rotating mechanism 41, a drying mechanism 51, and an ultrasonic cleaning mechanism 43 similar to those in the substrate cleaning apparatus 4.

The drying mechanism 51 includes a rinse liquid nozzle 511 that supplies a rinse liquid to a substrate W, a dry gas nozzle 512 that supplies dry gas to the substrate W, and a moving mechanism 513 that moves the rinse liquid nozzle 511 and the dry gas nozzle 512 in parallel with the surface of the substrate W.

The moving mechanism 513 is configured to include a movable arm 513a, a movable shaft 513b, and a driving source 513c. The movable arm 513a has a length larger than a radius of the substrate W. A rinse liquid nozzle 511 and a dry gas nozzle 512 are attached to a tip portion of the movable arm 513a. The movable shaft 513b is a rod-like member that transmits power of the driving source 513c to the movable arm 513a, and one end of the movable shaft 513b is connected to an end portion on an opposite side to the tip portion of the movable arm 513a so that a longitudinal direction thereof is orthogonal to a longitudinal direction of the movable arm 513a, and the other end thereof is connected to the driving source 513c. The driving source 513c is a device that rotates the movable shaft 513b about an axial line. The movable shaft 513b is installed so as to extend in a vertical direction on the outside of the substrate W.

The movable arm 513a is configured so that the dry gas flow discharged from the dry gas nozzle 512 attached to an opposite side of a connection end to the movable shaft 513b can collide with a rotational center of the substrate W. The moving mechanism 513 is configured so that when the driving source 513c is operated, the movable arm 513a rotates via the movable shaft 513b, and according to the rotation of the movable arm 513a, the rinse liquid nozzle 511 and the dry gas nozzle 512 provided at the tip portion thereof move away from the center of the substrate W in a direction toward the outer periphery.

In the present embodiment, the moving mechanism 513 serves as a rinse liquid nozzle moving mechanism that moves the rinse liquid nozzle 511 above the substrate W so that it is relatively away from the center of the substrate W relative to the substrate W rotating by the substrate holding and rotating mechanism 41 and a dry gas nozzle moving mechanism that moves the dry gas nozzle 512 above the substrate W so that it relatively moves away from the center of the substrate W relative to the substrate W rotating by the substrate holding and rotating mechanism 41.

The rinse liquid nozzle 511 is a nozzle (an apparatus that is a cylindrical shape and sprays a fluid from a pore of a tip) that supplies the rinse liquid for covering the upper surface of the substrate W with a liquid film to the substrate W in a state of a liquid flow (rinse liquid flow) in order to prevent the occurrence of defects such as watermarks due to drying of the liquid on the surface WA of the substrate W from liquid droplets.

The rinse liquid is typically pure water, but deionized water from which dissolved salts and dissolved organic substances are removed, carbonic acid gas dissolved water, functional water (such as hydrogen water and electrolytic ion water), and the like may be used. From the viewpoint of eliminating the dissolved salts and the dissolved organic substances which is a cause of the occurrence of the watermark, it is preferable to use deionized water. In addition, since the generation of static electricity accompanying the movement of the rinse liquid on the substrate W by the rotation of the substrate W can attract foreign matters, from the viewpoint of suppressing charging by increasing conductivity of the rinse liquid, the carbonic acid gas dissolved water may be used.

The dry gas nozzle 512 supplies isopropyl alcohol (IPA) to a film of the rinse liquid covering the upper surface of the substrate W and supplies a dry gas to the substrate W through the dry gas that pushes the film of the rinse liquid in the state of the gas flow (dry gas flow). The dry gas is a mixture of IPA vapor with an inert gas such as nitrogen and argon, which typically functions as a carrier gas, but the IPA vapor may be used.

The IPA and the dry gas flow are supplied from the dry gas nozzle 512 while the supply of the rinse liquid is continuously supplied from the rinse liquid nozzle 511. As a result, the rinse liquid is removed by the dry gas flow, the IPA is dissolved in the rinse liquid and thus a surface tension of the rinse liquid is lowered, and the rinse liquid is removed by the Marangoni force.

In this way, it is possible to dry the surface of the substrate W while suppressing the occurrence of the watermark. As such, drying the substrate W using IPA is called IPA drying.

When the drying mechanism 51 dries the substrate W, the supply pipe 433 of the ultrasonic cleaning mechanism 43 is retracted to the retreated position, not the upper side of the substrate W.

As described above, in the thirteenth embodiment, the substrate drying apparatus 5 includes both of the drying mechanism 51 and the ultrasonic cleaning mechanism 43. Therefore, in addition to the substrate drying, the substrate drying apparatus 5 itself such as the chuck claw 411 and the casing 44 can be cleaned. In the present embodiment, for example, the position of the supply pipe 433 of the ultrasonic supply apparatus 43 and the angle at which the cleaning liquid is sprayed can be adjusted, and in addition, by the configuration that can change the discharge speed of the ultrasonic cleaning liquid, the substrate drying apparatus 5 itself is easier cleaned.

In addition, in the case in which fine particles adhere to the substrate W when the substrate W is supplied, in a general substrate drying apparatus having no ultrasonic cleaning mechanism 43, such fine particles can not be sufficiently removed. On the contrary, according to the substrate drying apparatus 5 of the present embodiment, the occurrence of the reverse contamination due to the generation of fine particles caused by the physical contact of the cleaning member with the substrate W is prevented, and as a result, it is possible to provide the substrate drying apparatus 5 that performs sufficiently cleaning, rinsing, and drying the surface of the substrate W.

Fourteenth Embodiment

Next, a fourteenth embodiment will be described. In the eleventh embodiment described above, the substrate cleaning apparatus 4' includes the two-fluid jet cleaning mechanism 45 and the ultrasonic cleaning mechanism 43. On the contrary, in the fourteenth embodiment to be described below, a substrate cleaning apparatus further includes a cover disposed around the substrate.

FIG. 63 is a side view of a substrate cleaning apparatus 4''' according to a fourteenth embodiment.

As shown in FIG. 63, the substrate cleaning apparatus 4''' includes a substrate holding and rotating mechanism 41 that holds and rotates a substrate W, a two-fluid nozzle 452 that sprays two-fluid jet toward a surface of the substrate W, a cover 63 that is disposed around the substrate W, and a cover rotating mechanism (not shown) that rotates the rotating cover 63 The cover rotating mechanism rotates the cover in the same rotation direction as the substrate W, for example.

The substrate holding and rotating mechanism. 41 includes a plurality of chucks 441, a circular pedestal 671 to which these chucks are fixed, a stage 672 that supports the pedestal 671, a hollow support shaft 673 that supports the stage 672, and a motor 602 that rotates the support shaft 673. In this case, the pedestal 671, the stage 672, and the support shaft 673 are coaxially disposed. The rotating cover 63 is fixed to an end portion of the stage 672, and the stage 672 and the rotating cover 63 are also disposed coaxially. In addition, the substrate W held by the chuck 441 and the rotating cover 63 are coaxially positioned.

The motor 602 is connected to an outer peripheral surface of the support shaft 673, and a torque of the motor 602 is transmitted to the support shaft 673, such that the substrate W held by the chuck 441 rotates. In this case, the substrate W and the rotating cover 63 rotate integrally, so that a relative speed between the substrate W and the rotating cover 63 may be set to be zero or may set to have a slight speed difference. In addition, the substrate W and the rotating cover 63 may each be rotated by different rotating mechanisms. Rotating the substrate W and the rotating cover 63 at the same speed means rotating the substrate W and the rotating cover 63 in the same direction at the same angular velocity, but does not mean rotating the substrate W and the rotating cover 63 in an opposite direction to each other.

As shown in the drawing, the stage 672 is provided with a plurality of discharge holes 674. The discharge hole 674 is, for example, along hole extending in a circumferential direction of the rotating cover 63, and a cleaning liquid is discharged together with the carrier gas or gas in the surrounding atmosphere through the discharge hole 674. In the present embodiment, the displacement is about 1 to 3 $m^3$/min. In addition, an outer side of the rotating cover 63 is provided with a stationary cover 675 which does not rotate. By such a configuration, it is possible to suppress droplets of the substrate W from bouncing, and droplets from re-adhering to the surface of the substrate.

The two-fluid nozzle 452 of the present embodiment may be disposed at a predetermined angle so as to spray a two-fluid jet toward an upstream side in the rotation direction of the substrate W.

The substrate cleaning apparatus 4''' cleans the substrate W as follows. That is, the two-fluid nozzle 452 supplies the first and second two-fluid jets to the upper surface of the substrate W while swinging above the substrate W in the state in which the substrate holding and rotating mechanism 41 rotates the substrate W. As a result, the upper surface of the substrate W is cleaned by the two-fluid jet. However, the two-fluid cleaning can also be referred to as a cleaning mechanism by liquid movement in a horizontal direction after droplet collision, and in order to remove fine particles having a size of 100 nm or less existing in recesses, such as a step difference of a pattern wiring on the surface of the substrate W and a surface scratch, in the present embodiment, for example, the cleaning is performed by performing non-contact cleaning by the two-fluid cleaning and non-contact cleaning by the ultrasonic cleaning mechanism 43 simultaneously or sequentially. In addition, by using the ultrasonic cleaning liquid in which the ultrasonic vibration is applied to pure water, the ultrasonic cleaning mechanism 43 can perform rinsing while cleaning. In addition, the ultrasonic cleaning mechanism 43 may clean an edge or a bevel of the substrate W, or may clean a chuck claw 411, a casing 44, the rotating cup 63, the stationary cup 675 and the like.

A supply pipe 433 in the ultrasonic cleaning mechanism 43 is configured to swing above the substrate W upon cleaning the substrate Wand stand at an outside of a position where the substrate W is held during standby.

In such a configuration, when the two-fluid cleaning and the non-contact cleaning by the ultrasonic cleaning mechanism 43 are performed, droplets are scattered from the surface of the substrate W due to a centrifugal force generated by the rotation of the substrate W, or droplets on the surface of the substrate W are scattered by a side jet generated by the two-fluid cleaning and even if the droplets collide with the rotating cover 63, since the rotating cover 63 rotates in the same rotation direction as the substrate W, it is possible to reduce the collision speed of droplets as compared with the case in which the rotating cover 63 does not rotate. In this way, it possible to suppress rebounding of droplets from the rotating cover 63 and prevent droplets from re-adhering to the surface of the substrate W.

In addition, in the substrate cleaning apparatus 4''' configured as described above, since the inside of the rotating cover 63 becomes contaminated when the processing is performed continuously, for example, the ultrasonic cleaning mechanism 43 may be configured to clean the inside of the rotating cover 63.

Like the substrate cleaning apparatus 4''' according to the fourteenth embodiment, even in the substrate cleaning apparatuses 4 and 4'' according to the first and third embodiments, the cover (cup) is disposed around the substrate W, so that the ultrasonic cleaning mechanism 43 may supply the ultrasonic cleaning liquid to the cup. Likewise, in the substrate cleaning apparatus configured as described above, since the inside of the rotating cover is contaminated when the processing is continuously performed, the nozzle of the ultrasonic cleaning mechanism 43 swings in the cup while the cup rotates in the state where no substrate is present, thereby cleaning the inside or the bottom of the rotating cover 63.

The above-described embodiments are described for the purpose of enabling those skilled in the art to which the present invention belongs to implement the present invention. Various modifications of the above embodiments are obvious to those skilled in the art, and the technical idea of the present invention can be applied to other embodiments. Accordingly, the present invention is not limited to the embodiments described, but should be the broadest scope in accordance with the technical idea defined by the claims. For example, it is a matter of course that the ultrasonic cleaning mechanism 43 according to the above-described embodiment can be used even in the case of a substrate cleaning apparatus that cleans the substrate W in the state in which the substrate holding mechanism holds the substrate W in a vertical position.

REFERENCE SIGNS LIST

3 Substrate polishing apparatus
4, 4' Substrate cleaning apparatus
41 Substrate holding and rotating mechanism
42 Pen cleaning mechanism
43 Ultrasonic cleaning mechanism
44 Casing
452 Two-fluid jet cleaning mechanism
46 Ozone water cleaning mechanism
5 Substrate drying apparatus
51 Drying mechanism Means for Solving Problems of Tenth and Fourteenth Embodiments According to one aspect, there is provided a substrate cleaning apparatus including: a substrate holding and rotating mechanism that holds and rotates a substrate; a first cleaning mechanism that cleans the substrate by bringing a cleaning tool into contact with the substrate, cleans the substrate by using two-fluid jet, or cleans the substrate by using ozone water; and a second cleaning mechanism that cleans the substrate by using an ultrasonic cleaning liquid.

Since the substrate cleaning apparatus includes the first and second cleaning mechanisms, by combining the first and second cleaning mechanisms, the detergency is improved and the second cleaning mechanism can also clean the substrate cleaning apparatus itself.

While the first cleaning mechanism cleans the substrate, the second cleaning mechanism may clean the substrate.

The first and second cleaning mechanisms perform the cleaning simultaneously to improve the detergency.

The first cleaning mechanism cleans the substrate, and then the second cleaning mechanism may also clean the substrate.

Even when there are particles that the first cleaning mechanism can not remove, the second cleaning mechanism performs the finish cleaning to remove the particles, thereby improving the detergency.

The second cleaning mechanism cleans the substrate using the ultrasonic cleaning liquid of the first frequency, and then the first cleaning mechanism cleans the substrate, and then the second cleaning mechanism may clean the substrate using the ultrasonic cleaning liquid of the second frequency higher than the first frequency.

Removing large particles in advance using the ultrasonic cleaning liquid of the low frequency prolongs the lifespan of the cleaning tool in the second cleaning mechanism. It is possible to remove small particles using high frequency ultrasonic cleaning liquid.

The first cleaning mechanism may perform the contact cleaning on the substrate using the chemical liquid and then the second cleaning mechanism may clean the substrate using the ultrasonic cleaning liquid in which the ultrasonic vibration is applied to pure water.

As a result, the second cleaning mechanism can perform rinsing while performing the cleaning.

The second cleaning mechanism may supply the ultrasonic cleaning liquid to the edge of the substrate.

As a result, even when the first cleaning mechanism can not clean the edge of the substrate, the second cleaning mechanism can clean the edge of the substrate.

The second cleaning mechanism may supply the ultrasonic cleaning liquid so that apart of the ultrasonic cleaning liquid drops and another part thereof drops onto the outside of the substrate.

As a result, the bevel of the substrate can be cleaned.

When the second cleaning mechanism supplies the ultrasonic cleaning liquid to the edge of the substrate, as compared with the case in which the second cleaning mechanism supplies the ultrasonic cleaning liquid to the inside of the substrate, the substrate holding and rotating mechanism may rotate the substrate at a low speed.

The substrate holding and rotating mechanism has the holding member that holds a part of the substrate, and the first cleaning mechanism brings the cleaning tool into contact with the substrate to clean the substrate. The second cleaning mechanism may supply the ultrasonic cleaning liquid to the region where the cleaning tool can not perform cleaning due to the presence of the holding member.

As a result, the second cleaning mechanism can clean the location on the substrate that the first cleaning mechanism can not clean.

The substrate holding and rotating mechanism may include the holding member that holds a part of the substrate and the second cleaning mechanism may supply the ultrasonic cleaning liquid to the holding member.

As a result, the holding member of the substrate cleaning apparatus as well as the substrate can be cleaned.

The substrate holding and rotating mechanism, the first cleaning mechanism, and the second cleaning mechanism may be provided in the casing, and the second cleaning mechanism may supply the ultrasonic cleaning liquid to the casing.

As a result, the casing of the substrate cleaning apparatus as well as the substrate can be cleaned.

The cup is provided outside the substrate holding and rotating mechanism, and the second cleaning mechanism may supply the ultrasonic cleaning liquid to the cup.

As a result, the cup of the substrate cleaning apparatus as well as the substrate can be cleaned.

The first cleaning mechanism may bring the cleaning tool into contact with the substrate to clean the substrate and the second cleaning mechanism may supply the ultrasonic cleaning liquid to the cleaning tool.

As a result, the cleaning tool of the substrate cleaning apparatus as well as the substrate can be cleaned.

According to another aspect, there is provided the substrate processing apparatus including the substrate polishing apparatus that polishes the substrate and the substrate cleaning apparatus.

According to still another aspect, there is provided a method for cleaning a substrate using a substrate cleaning apparatus including a first cleaning mechanism that brings a cleaning tool into contact with a substrate to clean the substrate, cleans the substrate using two-fluid jet, or cleans the substrate using ozone water and a second cleaning mechanism that cleans the substrate using an ultrasonic cleaning liquid, wherein the second cleaning mechanism cleans the substrate while the first cleaning mechanism cleans the substrate.

The first and second cleaning mechanisms perform the cleaning simultaneously to improve the detergency.

According to still another aspect, there is provided a method for cleaning a substrate using a substrate cleaning apparatus including a first cleaning mechanism that brings a cleaning tool into contact with a substrate to clean the substrate, cleans the substrate using two-fluid jet, or cleans the substrate using ozone water and a second cleaning mechanism that cleans the substrate using an ultrasonic cleaning liquid, wherein the first cleaning mechanism cleans the substrate and then the second cleaning mechanism cleans the substrate.

Even when there are particles that the first cleaning mechanism can not remove, the second cleaning mechanism performs the finish cleaning to remove the particles, thereby improving the detergency.

According to still another aspect, there is provided a method for cleaning a substrate using a substrate cleaning apparatus including a first cleaning mechanism that brings a cleaning tool into contact with a substrate to clean the substrate, cleans the substrate using two-fluid jet, or cleans the substrate using ozone water and a second cleaning mechanism that cleans the substrate using an ultrasonic cleaning liquid, wherein the second cleaning mechanism cleans the substrate using the ultrasonic cleaning liquid of a first frequency, and then the first cleaning mechanism cleans the substrate, and then the second cleaning mechanism cleans the substrate using the ultrasonic cleaning liquid of a second frequency higher than the first frequency.

Removing large particles in advance using the ultrasonic cleaning liquid of the low frequency prolongs the lifespan of the cleaning tool in the second cleaning mechanism. It is possible to remove small particles using high frequency ultrasonic cleaning liquid.

According to still another aspect, there is provided a substrate drying apparatus including a substrate holding and rotating mechanism that holds and rotates a substrate, a drying mechanism that dries the substrate, and an ultrasonic cleaning mechanism that cleans the substrate using the ultrasonic cleaning liquid.

Since the substrate drying apparatus includes the ultrasonic cleaning mechanism, the substrate drying apparatus itself can also be cleaned.

Effects of Tenth to Fourteenth Embodiments

By providing the ultrasonic cleaning mechanism, the high-performance substrate cleaning apparatus, substrate drying apparatus and substrate processing apparatus are provided. In addition, the substrate cleaning method using such a substrate cleaning apparatus is provided.

The invention claimed is:

1. An apparatus for cleaning a substrate, comprising:
a holding and rotating mechanism configured to hold the substrate by grasping an outer peripheral end portion of the substrate and rotate the substrate, the holding and rotating mechanism including a drive shaft configured to rotate the substrate;
a first arm;
a first cleaning mechanism configured to,
bring a cleaning tool into contact with a first face of the substrate to clean the substrate, the cleaning tool being supported by the first arm,
supply ozone water to the first face of the substrate from an ozone water nozzle held by the first arm to clean the substrate, the ozone water nozzle facing the first face, or
supply two-fluid jet to the first face of the substrate from a first two-fluid let nozzle held by the first arm to clean the substrate, the first two-fluid let nozzle facing the first face;
a second cleaning mechanism to supply an ultrasonic cleaning liquid to the first face of the substrate from a supply pipe to clean the substrate, wherein the supply pipe includes a first extension extending from a vibrator, wherein the supply pipe includes a second extension extending downward from a tip of the first extension, and wherein the first extension is inclined so as to be lower toward the vibrator and higher toward the second extension;
a second nozzle configured to supply cleaning liquid to a second face of the substrate, the second face being on a side opposite to the first face, the second nozzle facing the second face,
wherein the first cleaning mechanism is arranged on a side opposite to the second cleaning mechanism regarding a center of the substrate, and
a controller configured to control the drive shaft such that while the second cleaning mechanism supplies the ultrasonic cleaning liquid to an edge of the substrate, the drive shaft rotates the substrate at a first speed, and while the second cleaning mechanism supplies the ultrasonic cleaning liquid to an inner portion of the substrate, the drive shaft rotates the substrate at a second speed, wherein the first speed is lower than the second speed,
wherein
the movable area of the cleaning tool supported by the first arm, the moveable area of the ozone water nozzle held by the first arm, or the moveable area of the two-fluid jet nozzle held by the first arm is limited such that the cleaning tool, the ozone water nozzle, or the two-fluid jet nozzle:
is configured to swing between the center of the substrate rotates by the holding and rotating mechanism and a first retreated position which is at an outside of the substrate on a side where the first cleaning mechanism is arranged, but is not allowed to swing between the center of the substrate and an outside of the substrate on a side where the second cleaning mechanism is arranged, the moveable area of the supply pipe in the second cleaning mechanism is limited such that the supply pipe;

is configured to swing between the center of the substrate rotated by the holding and rotating mechanism and a second retreated position which is at an outside of the substrate on a side where the second cleaning mechanism is arranged, but is not allowed to swing between the center of the substrate and an outside of the substrate on a side wherein the first cleaning mechanism is arranged, thereby a first swing range of the cleaning tool, the ozone water nozzle, or the two-fluid nozzle and a second swing range of the supply pipe do not overlap except at the center of the substrate.

2. The apparatus according to claim 1, wherein the supply pipe is configured to guide the ultrasonic cleaning liquid to which ultrasonic vibration is applied by a vibrator to supply the ultrasonic cleaning liquid from a supply port to the first face of the substrate, and the supply pipe is connected to a swinging shaft, the controller is configured to variably control a timing and swing speed at which the swinging shaft swings the supply pipe such that the supply pipe swings above the substrate at a time of cleaning the substrate and the supply pipe stands at an outside of a position where the substrate is held during standby.

3. The apparatus according to claim 2, wherein the controller is configured to control the swing speed at which the swinging shaft swings the supply pipe such that the swing speed near an edge of the substrate is different from the swing speed near a center of the substrate.

4. The apparatus according to claim 1, wherein the controller is capable of controlling the second cleaning mechanism such that the second cleaning mechanism cleans the substrate using the ultrasonic cleaning liquid with a first frequency, and then the second cleaning mechanism cleans the substrate using ultrasonic cleaning liquid with a second frequency higher than the first frequency.

5. The apparatus according to claim 1, wherein the supply pipe of the second cleaning mechanism is configured to be movable between a first position and a second position, the first position being a position where the supply pipe of the second cleaning mechanism cleans the substrate;

the second position being a position where the supply pipe of the second cleaning mechanism cleans the cleaning tool by supplying the ultrasonic cleaning liquid to the cleaning tool.

6. The apparatus according to claim 1, wherein the substrate is circular, and the supply pipe of the second cleaning mechanism moves between the center of the circular substrate and a third position at an outside of the circular substrate.

7. The apparatus according to claim 1, wherein the apparatus is controlled by the controller such that the first cleaning mechanism is configured to contact the substrate using a chemical liquid, and then the second cleaning mechanism is configured to clean the substrate using an ultrasonic cleaning liquid obtained by applying pure water with an ultrasonic vibration.

8. The apparatus according to claim 1, wherein the holding and rotating mechanism has a holding member that is configured to hold at least a part of the substrate, and the second cleaning mechanism is configured to supply the ultrasonic cleaning liquid to the holding member.

9. The apparatus according to claim 1, wherein the holding and rotating mechanism, the first cleaning mechanism, and the second cleaning mechanism are in a casing, and the second cleaning mechanism is configured to supply the ultrasonic cleaning liquid to the casing.

10. The apparatus according to claim 1, further comprising a cup provided on an outside of the holding and rotating mechanism, and the second cleaning mechanism is configured to supply the ultrasonic cleaning liquid to the cup.

11. The apparatus according to claim 1, wherein the second cleaning mechanism comprises the supply pipe that is configured to supply the ultrasonic cleaning liquid, and the supply pipe is configured to be movable at a first position to clean the substrate without use of the cleaning tool and a second position to clean the substrate by supplying the ultrasonic cleaning liquid while using the cleaning tool.

12. A substrate processing apparatus comprising:

a substrate polishing apparatus that polishes a substrate; and the apparatus according to claim 1.

\* \* \* \* \*